(12) United States Patent  (10) Patent No.: US 6,327,022 B1
Nishi  (45) Date of Patent: Dec. 4, 2001

(54) PROJECTION EXPOSURE METHOD AND APPARATUS

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/468,361

(22) Filed: Dec. 21, 1999

Related U.S. Application Data

(63) Continuation of application No. 09/013,473, filed on Jan. 26, 1998, now abandoned.

(30) Foreign Application Priority Data

Jan. 27, 1997 (JP) .................................................. 9-027206

(51) Int. Cl.$^7$ ........................... G03B 27/42; G03B 27/44; G03B 27/62
(52) U.S. Cl. .................................. 355/53; 355/54; 355/75
(58) Field of Search ................................. 355/53, 54, 55, 355/67.75, 77; 356/399–401; 250/548

(56) References Cited

U.S. PATENT DOCUMENTS

| | | | |
|---|---|---|---|
| 4,780,617 | * 10/1988 | Umatate et al. | 250/548 |
| 4,814,830 | * 3/1989 | Isohata et al. | 355/54 |
| 4,878,086 | * 10/1989 | Isohata et al. | 355/77 |
| 4,924,258 | 5/1990 | Tsutsui | 355/53 |
| 5,151,749 | * 9/1992 | Tanimoto et al. | 356/375 |
| 5,442,163 | 8/1995 | Nakahara et al. | 235/381 |
| 5,464,715 | 11/1995 | Nishi et al. | 430/22 |
| 5,502,313 | * 3/1996 | Nakamura et al. | 250/559.26 |
| 5,504,407 | 4/1996 | Wakui et al. | 318/568.17 |
| 5,638,211 | * 6/1997 | Shiraishi | 359/559 |
| 5,646,413 | * 7/1997 | Nishi | 250/548 |
| 5,677,758 | 10/1997 | McEachern et al. | 355/75 |
| 5,699,145 | * 12/1997 | Makinouchi et al. | 355/53 |
| 5,907,392 | * 5/1999 | Makinouchi | 355/53 |

FOREIGN PATENT DOCUMENTS

| | | |
|---|---|---|
| A2-0 486 316 | * 5/1992 | (EP) . |
| A1-0 525 872 | 2/1993 | (EP) . |
| A1-0 687 957 | 12/1995 | (EP) . |
| 2 286 256 | 8/1995 | (GB) . |
| 57-183031 | 11/1982 | (JP) . |
| 60-47418 | 3/1985 | (JP) . |
| 62-198863 | 9/1987 | (JP) . |
| 63-87725 | 4/1988 | (JP) . |
| 63-232318 | * 9/1988 | (JP) . |
| 3-183115 | 8/1991 | (JP) . |
| 4-273245 | * 9/1992 | (JP) . |
| 6-291017 | 10/1994 | (JP) . |
| WO 98/28665 | 7/1998 | (WO) . |

* cited by examiner

Primary Examiner—Russell Adams
Assistant Examiner—Hung Henry Nguyen
(74) Attorney, Agent, or Firm—Oliff & Berridge, PLC

(57) ABSTRACT

A projection exposure apparatus exposes a substrate by projecting images of patterns formed on a plurality of masks onto the substrate through a projection system sequentially. At least one part of a first mask-driving system is disposed on one side of the projection system, and moves a first mask in a predetermined plane. A second mask-driving system moves a second mask independently from the first mask, in a plane which is the same as or parallel to that for the first mask. At least one part of the second mask-driving system is disposed on the one side of the projection system. A control system is associated with the first and second mask-driving systems, and controls the first and second mask-driving systems respectively in order to project an image of a pattern formed on the first mask and an image of a pattern formed on the second mask onto the substrate sequentially.

61 Claims, 21 Drawing Sheets

Fig. 16A  Fig. 16B  Fig. 16C
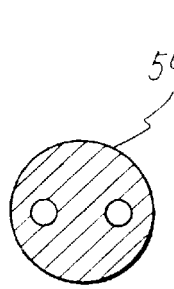 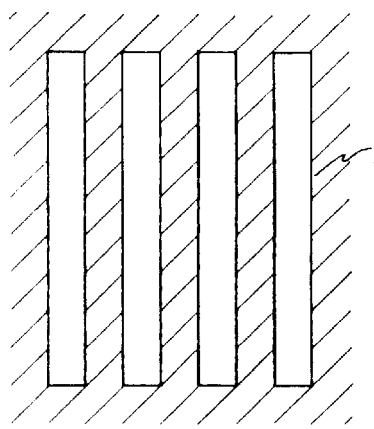 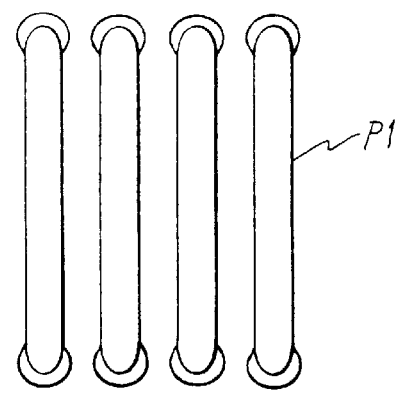
Fig. 17A  Fig. 17B  Fig. 17C
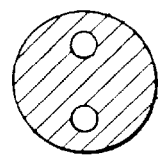 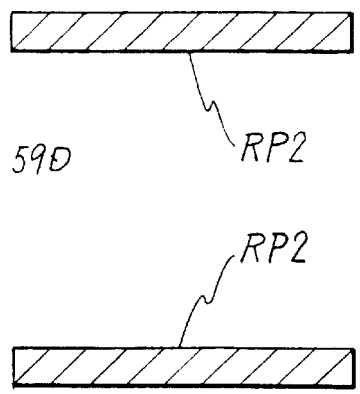 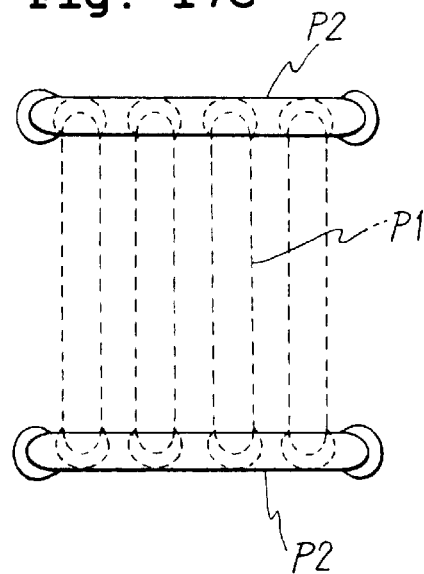
Fig. 18
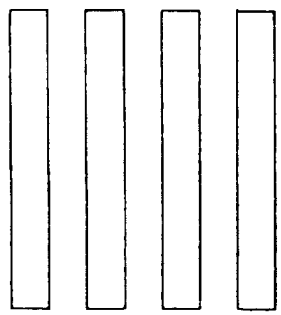

Fig. 26A   Fig. 26B   Fig. 26C
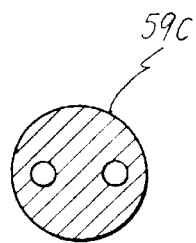 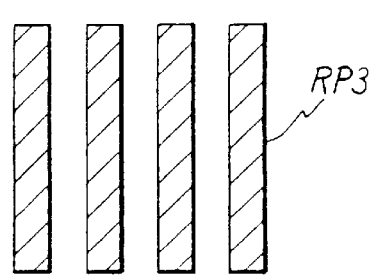 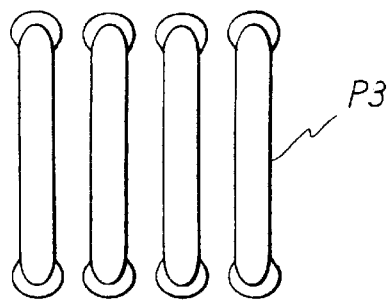
Fig. 27B   Fig. 27C
Fig. 27A
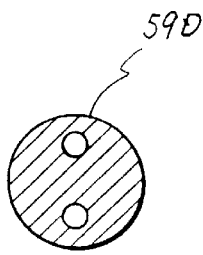 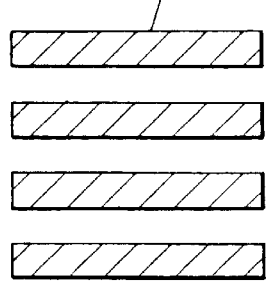 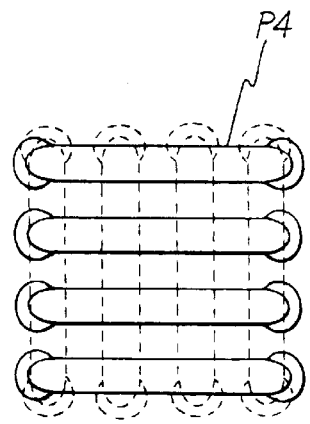

Fig. 28
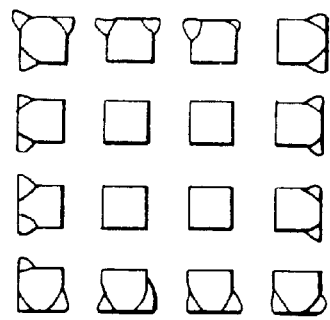
Fig. 29A   Fig. 29B   Fig. 29C
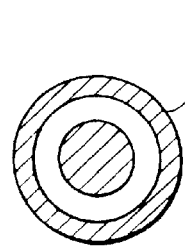  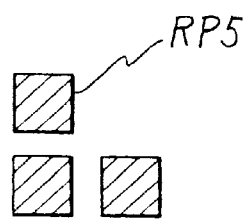  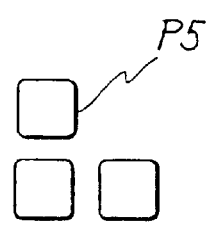
Fig. 30
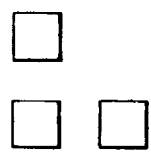

PROJECTION EXPOSURE METHOD AND APPARATUS

This is a Continuation of application Ser. No. 09/013,473 filed Jan. 26, 1998 now abandoned. The entire disclosure of the prior application(s) is hereby incorporated by reference herein in its entirety.

BACKGROUND OF THE INVENTION

1. Field of the Invention

The present invention relates to a projection exposure method and a projection exposure apparatus. In particular, the present invention relates to a projection exposure method and a projection exposure apparatus for exposing a photosensitive substrate by projecting an image of a pattern formed on a mask onto the photosensitive substrate by the aid of a projection optical system. Especially, the present invention relates to a projection exposure method and a projection exposure apparatus for exposing a photosensitive substrate by overlaying and transferring images of patterns formed on a plurality of masks onto a predetermined area on the photosensitive substrate.

2. Description of the Related Art

Various exposure apparatuses have been hitherto used, for example, when semiconductor elements or liquid crystal display elements are produced by means of the photolithography step. At present, a projection exposure apparatus is generally used, in which an image of a pattern formed on a photomask or reticle (hereinafter generally referred to as "reticle") is transferred via a projection optical system onto a substrate (hereinafter referred to as "photosensitive substrate", if necessary) such as a wafer or a glass blade applied with a photosensitive material such as photoresist on its surface. In recent years, a reduction projection exposure apparatus (so-called stepper) based on the so-called step-and-repeat system is predominantly used as the projection exposure apparatus, in which a photosensitive substrate is placed on a substrate stage which is movable two-dimensionally, and the photosensitive substrate is moved in a stepwise manner (subjected to stepping) by using the substrate stage to repeat the operation for successively exposing respective shot areas on the photosensitive substrate with the image of the pattern formed on the reticle.

Recently, a projection exposure apparatus based on the step-and-scan system (scanning type exposure apparatus as described, for example, in Japanese Laid-Open Patent Publication No. 7-176468 corresponding to U.S. Pat. No. 5,646,413), which is obtained by applying modification to the stationary type exposure apparatus such as the stepper, is also used relatively frequently. The projection exposure apparatus based on the step-and-scan system has, for example, the following merits. That is, (1) the projection optical system is easily produced because a large field can be exposed by using a smaller optical system as compared with the stepper, and a high throughput can be expected owing to the decrease in number of shots because a large field is exposed. Further, (2) an averaging effect is obtained owing to relative scanning for the reticle and the wafer with respect to the projection optical system, and it is possible to expect improvement in distortion and depth of focus. Moreover, it is considered that the scanning type projection exposure apparatus will be predominantly used in place of the stepper, because a large field will become essential in accordance with the increase in the degree of integration of the semiconductor element, which is 16 M (mega) at present and will become 64 M for DRAM, 256 M, and 1 G (giga) in future as the progress proceeds along with times.

When the photosensitive substrate is subjected to exposure by using the projection exposure apparatus as described above, it has been contemplated to improve the resolution and the depth of focus for a pattern to be formed, by using the modified illumination method, for example, the SHRINC (Super High Resolution by Illumination Control) method as described in Japanese Laid-Open Patent Publication No. 4-273245.

Such a projection exposure apparatus is principally used as a mass-production machine for semiconductor elements or the like. Therefore, the projection exposure apparatus necessarily required to have a processing ability that how many sheets of wafers can be subjected to the exposure process for a certain period of time. That is, it is necessarily required for the projection exposure apparatus to improve the throughput.

In this context, in the case of the projection exposure apparatus based on the step-and-scan system, when a large filed is exposed, the improvement in throughput is expected because the number of shots to be exposed on the wafer is decreased as described above. However, since the exposure is performed during movement at a constant velocity in accordance with synchronized scanning for the reticle and the wafer, it is necessary to provide acceleration and deceleration areas before and after the constant velocity movement area. If a shot having a size equivalent to a shot size of the stepper is exposed, there is a possibility that the throughput is rather decreased as compared with the stepper.

The outline of the flow of the process in such a projection exposure apparatus is as follows.

(1) At first, a wafer load step is performed, in which a wafer is loaded on a wafer table by using a wafer loader.

(2) Next, a search alignment step is performed, in which the position of the wafer is roughly detected by using a search alignment mechanism. Specifically, the search alignment step is performed, for example, on the basis of the contour of the wafer, or by detecting a search alignment mark on the wafer.

(3) Next, a fine alignment step is performed, in which the position of each of the shot areas on the wafer is accurately determined. In general, the EGA (enhanced global alignment) system is used for the fine alignment step. In this system, a plurality of sample shots included in the wafer are selected beforehand, and positions of alignment marks (wafer marks) affixed to the sample shots are successively measured. Statistical calculation based on, for example, the so-called least square method is performed on the basis of results of the measurement and designed values of the shot array to determine all shot array data on the wafer (see, for example, Japanese Laid-Open Patent Publication No. 61-44429 corresponding to U.S. Pat. No. 4,780,617). In this system, it is possible to relatively accurately determine the coordinate positions of the respective shot areas at a high throughput.

(4) Next, an exposure step is performed, in which the image of the pattern on the reticle is transferred onto the wafer via the projection optical system while successively positioning the respective shot areas on the wafer to be located at exposure positions on the basis of the coordinate positions of the respective shot areas having been determined in accordance with the EGA system or the like described above and the previously measured baseline amount.

(5) Next, a wafer unload step is performed, in which the wafer on the wafer table having been subjected to the exposure process is wafer-unloaded by using a wafer unloader. The wafer unload step is performed simultaneously with the wafer load step (1) described above in which the exposure process is performed. That is, a wafer exchange step is constructed by the steps (1) and (5).

As described above, in the conventional projection exposure apparatus, the roughly classified four operations are repeatedly performed by using one wafer stage, i.e., wafer exchange→search alignment→fine alignment→exposure→wafer exchange.

The throughput THOR [sheets/hour] of such a projection exposure apparatus can be represented by the following expression (1) assuming that the wafer exchange time is T1, the search alignment time is T2, the fine alignment time is T3, and the exposure time is T4.

$$THOR=3600/(T1+T2+T3+T4) \quad (1)$$

The operations of T1 to T4 are executed repeatedly and successively (sequentially) as in T1→T2→T3→T4→T1 .... Accordingly, if the individual elements ranging from T1 to T4 involve high speeds, then the denominator is decreased, and the throughput THOR can be improved. However, as for T1 (wafer exchange time) and T2 (search alignment time), the effect of improvement is relatively small, because only one operation is performed for one sheet of wafer respectively. As for T3 (fine alignment time), the throughput can be improved if the sampling number of shots is decreased in the case of the use of the EGA system, or if the measurement time for a single shot is shortened. However, on the contrary, the alignment accuracy is deteriorated. Therefore, it is impossible to easily shorten T3.

On the other hand, T4 (exposure time) includes the wafer exposure time and the stepping time for movement between the shots. For example, in the case of the scanning type projection exposure apparatus based on, for example, the step-and-scan system, it is necessary to increase the relative scanning velocity between the reticle and the wafer in an amount corresponding to the reduction of the wafer exposure time. However, it is impossible to easily increase the scanning velocity because the synchronization accuracy is deteriorated.

Important conditions for such a projection exposure apparatus other than those concerning the throughput described above include (1) the resolution, (2) the depth of focus (DOF: Depth of Focus), and (3) the line width control accuracy. Assuming that the exposure wavelength is $\lambda$, and the numerical aperture of the projection lens is N.A. (Numerical Aperture), the resolution R is proportional to $\lambda/N.A.$, and the depth of focus (DOF) is proportional to $\lambda/(N.A.)^2$.

Therefore, in order to improve the resolution R (in order to decrease the value of R), it is necessary to decrease the exposure wavelength $\lambda$, or it is necessary to increase the numerical aperture N.A. Especially, in recent years, semiconductor elements or the like have developed to have high densities, and the device rule is not more than 0.2 $\mu$m L/S (line and space). For this reason, a KrF excimer laser is used as an illumination light source in order to perform exposure for the pattern. However, as described above, the degree of integration of the semiconductor element will be necessarily increased in future. Accordingly, it is demanded to develop an apparatus provided with a light source having a wavelength shorter than that of KrF. Representative candidates for the next generation apparatus provided with the light source having the shorter wavelength as described above include, for example, an apparatus having a light source of ArF excimer laser, and an electron beam exposure apparatus.

However, the case of the ArF excimer laser involves numerous technical problems in that the light is scarcely transmitted through a place where oxygen exists, it is difficult to provide a high output, the service life of the laser is short, and the cost of the apparatus is expensive. The electron beam exposure apparatus is inconvenient in that the throughput is extremely lowered as compared with the light beam exposure apparatus. In reality, the development of the next generation machine, which is based on the principal viewpoint of the use of a short wavelength, does not proceed so well.

It is conceived to increase the numerical aperture N.A., as another method to increase the resolution R. However, if N.A. is increased, there is a demerit that DOF of the projection optical system is decreased. DOF can be roughly classified into UDOF (User Depth of Focus: a part to be used by user: for example, difference in level of pattern and resist thickness) and the overall focus difference of the apparatus itself. Up to now, UDOF has contributed to DOF in a greater degree. Therefore, the development of the exposure apparatus has been mainly directed to the policy to design those having a large DOF. Those practically used as the technique for increasing DOF include, for example, modified illumination.

By the way, in order to produce a device, it is necessary to form, on a wafer, a pattern obtained by combining, for example, L/S (line and space), isolated L (line), isolated S (space), and CH (contact hole). However, the exposure parameters for performing optimum exposure differ for every shape of the pattern such as L/S and isolated line described above. For this reason, a technique called ED-TREE (except for CH concerning a different reticle) has been hitherto used to determine, as a specification of the exposure apparatus, common exposure parameters (for example, coherence factor $\sigma$, N.A., exposure control accuracy, and reticle drawing accuracy) so that the resolution line width is within a predetermined allowable error with respect to a target value, and a predetermined DOF is obtained. However, it is considered that the following technical trend will appear in future.

(1) In accordance with the improvement in process technology (improvement in flatness on the wafer), the difference in pattern level will be progressively lowered, and the resist thickness will be progressively decreased. There will be a possibility that the UDOF may change from an order of 1 $\mu$m→0.4 $\mu$m.

(2) The exposure wavelength changes to be short, i.e., g-ray (436 nm)→i-ray (365 nm)→KrF (248 nm). However, investigation will be made for only a light source based on ArF (193 nm) in future. Further technical hurdle is high. Thereafter, the progress will proceed to EB exposure.

(3) It is expected that the scanning exposure such as those based on the step-and-scan system will be predominantly used for the stepper, in place of the stationary exposure such as those based on the step-and-repeat system. The step-and-scan system makes it possible to perform exposure for a large field by using a projection optical system having a small diameter (especially in the scanning direction), in which it is easy to realize high N.A. corresponding thereto.

In the background of the technical trend as described above, the double exposure method is reevaluated as a method for improving the limiting resolution. Trial and investigation are made such that the double exposure method will be used for KrF exposure apparatus and ArF exposure apparatus in future to perform exposure up to those having 0.1 $\mu$m L/S. In general, the double exposure method is roughly classified into the following three methods.

(1) L/S's and isolated lines having different exposure parameters are formed on different reticles, and exposure is performed for each of them on an identical wafer under an optimum exposure condition.

(2) For example, when the phase shift method is introduced, L/S has a higher resolution at an identical DOF as compared with the isolated line. By utilizing this fact, all patterns are formed with L/S's by using the first reticle, and L/S's are curtailed for the second reticle to form the isolated lines.

(3) In general, when the isolated line is used, a high resolution can be obtained with a small N.A. as compared with L/S (however, DOF is decreased). Accordingly, all patterns are formed with isolated lines, and the isolated lines, which are formed by using the first and second reticles respectively, are combined to form L/S's.

The double exposure method described above has two effects of improvement in resolution and improvement in DOF.

However, in the double exposure method, the exposure process must be performed several times by using a plurality of reticles. Therefore, inconveniences arise in that the exposure time (T4) is not less than two-fold as compared with the conventional apparatus, and the throughput is greatly deteriorated. For this reason, actually, the double exposure method has not been investigated so earnestly. The improvement in resolution and depth of focus (DOF) has been hitherto made by means of, for example, the use of an ultraviolet exposure wavelength, modified illumination, and phase shift reticle.

However, even when the contrivance is made, for example, for the exposure wavelength made to be ultraviolet, the modified illumination, and the phase shift reticle as described above, it is difficult to realize a resolution line width of 0.1 $\mu$m which is the target for the next generation machine. Therefore, it is doubtless that the realization of exposure up to 0.1 $\mu$m L/S based on the use of the aforementioned double exposure method for the KrF or ArF exposure apparatus makes a prevailing choice for the development of the next generation machine aimed at mass production of 256 M or 1 G DRAM.

It is conceived, as a means for further improving the resolving power based on the use of the double exposure method, to perform the double exposure by using the modified illumination as described above. In the case of the conventional modified illumination method, it is possible to improve the resolution and the depth of focus (DOF) for L/S and isolated L in a predetermined direction. However, the conventional modified illumination method is inconvenient in that the resolution and the depth of focus are considerably deteriorated for a pattern disposed in a direction perpendicular to the predetermined direction. Almost all such inconveniences can be dissolved by simultaneously performing modified illumination in two orthogonal axial directions. However, when each L pattern is inspected, the image is markedly deteriorated (for example, the edge portions become dull and tapered) at both end portions of the pattern (portions at which the two-dimensional edge exists). Therefore, an inconvenience arises in that the improvement in accuracy cannot be expected all the more as compared with a case in which exposure is performed by using a zonal type illumination method.

The double exposure method involves another inherent problem. That is, this method suffers from an inconvenience that the throughput is necessarily lowered, because it is necessary to perform the exposure process two times or more by using a plurality of reticles as described above. In this case, the inconvenience is not limited only to the increase in actual exposure time. In the conventional technique, since one sheet of reticle is placed on the reticle stage, the following inconveniences also arise when the double exposure method is carried out. That is, the throughput is lowered in an amount corresponding to the necessity to successively repeat a series of sequence in which (1) the reticles stored in a reticle library are taken out one by one by using a reticle loader or the like to perform reticle exchange with respect to the reticle stage, (2) the reticle is subjected to positional adjustment (alignment), (3) the exposure process is thereafter performed by using the reticle, and then the process routine returns to the step (1) again to exchange the reticle. Therefore, it is demanded to improve the throughput even to some extent by shortening the exchange time for the reticle when a plurality of reticles are exchanged and used.

It is conceived, as a method for shortening the reticle exchange time, to place a plurality of reticles on a reticle stage. However, if such a method is adopted, an inconvenience also arises in that the stage becomes to have a large size, and its positional control performance is deteriorated especially in the case of a scanning type exposure apparatus.

Further, it is necessary to make a special design concerning the management of the plurality of reticles, when the plurality of reticles are used as a set as in the double exposure method as described above.

SUMMARY OF THE INVENTION

The present invention has been made taking such circumstances into consideration. An object of the present invention is to provide a projection exposure method which especially makes it possible to expose a photosensitive substrate with a desired image of a pattern at a high resolution and with a large depth of focus.

Another object of the present invention is to provide a scanning type projection exposure apparatus which especially makes it possible to accurately control the position of a mask stage which carries a mask thereon.

Still another object of the present invention is to provide a projection exposure apparatus which especially makes it possible to decrease the foot print of the main apparatus body while improving the throughput in mask exchange and the control performance of a mask stage.

Still another object of the present invention is to provide a projection exposure apparatus which especially makes it possible to easily perform the management for a plurality of masks when the plurality of masks are used as a set.

According to a first aspect of the present invention, there is provided a projection exposure method for exposing a predetermined area on a photosensitive substrate (W1 or W2) by overlaying and transferring a plurality of patterns via a projection optical system (PL) to the predetermined area on the photosensitive substrate, the projection exposure method comprising:

a first exposure step of arranging a mask (R1) formed with a first pattern (RP1) composed of a line pattern disposed along a predetermined direction, at a position conjugate to the photosensitive substrate (W1 or W2) in relation to the projection optical system (PL), and exposing the predetermined area on the photosensitive substrate by illuminating the first pattern with an illumination light beam (L1) which is inclined by a predetermined amount in a direction perpendicular to the line direction of the first pattern (RP1) with respect to an optical axis (AX) of the projection optical system; and a second exposure step of arranging a mask (R2) formed with a second pattern (RP2) composed of a line pattern disposed along a direction perpendicular to the first pattern, at the position conjugate to the photosensitive substrate (W1 or W2) in relation to the projection optical system, and exposing the predetermined area on the photosensitive substrate by illuminating the second pattern (PR2) with an illumination light beam which is inclined by a predetermined amount in a direction perpendicular to the line direction of the second pattern (RP2) with respect to the optical axis (AX).

According to the present invention, the first pattern is illuminated in the first exposure step with the illumination light beam which is inclined in the predetermined amount in the direction perpendicular to the line direction of the first pattern with respect to the optical axis of the projection optical system. The illumination is so-called modified illumination (two-beam illumination or two-beam image formation), in which the 0-order diffracted light beam and, for example, the −1-order diffracted light beam generated from the first pattern on the mask are symmetrical relative to the optical axis, and only the two light beams pass through the projection optical system, wherein the +1-order diffracted light beam does not pass therethrough (See FIG. 15). Accordingly, the two-beam interference does not cause any wave front aberration on the photosensitive substrate. Therefore, it is possible to form an image of the pattern having a high resolution in the line direction and having a large depth of focus. The modified illumination method such as those based on the two-light beam illumination has been already known, for which, for example, reference may be made to U.S. Pat. No. 5,638,211.

Similarly, in the second exposure step, it is possible to form, in the line direction, an image of the pattern having a high resolution and having a large depth of focus, by performing the modified illumination for the mask formed with the second pattern composed of the line pattern disposed in the direction perpendicular to the first pattern. As described above, the first pattern and the second pattern, which are in the orthogonal relationship, are separately subjected to the illumination based on the use of the modified illumination suitable for the respective patterns. Thus, it is possible, for each line direction, to form the image of the pattern having the high resolution and having the large depth of focus.

In order to perform the modified illumination as described above, the first exposure step may be carried out such that the first pattern is illuminated by transmitting the illumination light beam through two eccentric areas each having a center at a position of point symmetry relative to the optical axis in a plane substantially corresponding to one obtained by Fourier transformation for a mask plane in relation to an illumination system for generating the illumination light beam or in a plane in the vicinity thereof. Further, the second exposure step may be carried out such that the second pattern is illuminated by transmitting the illumination light beam through two eccentric areas each having a center at a position of point symmetry in relation to the optical axis in a plane substantially corresponding to one obtained by Fourier transformation for a mask plane in relation to the illumination system or in a plane in the vicinity thereof.

It is desirable that the second pattern has a line pattern which extends in the direction perpendicular to the first pattern so that the second pattern overlaps both line end portions of the first line pattern. That is, when the illumination is performed in accordance with the modified illumination in conformity with the line pattern in the predetermined direction, it is possible to form a pattern image having a high resolution and having a large depth of focus in the line direction, however, conversely, the depth of focus is decreased, and the resolution is deteriorated (the edge portion becomes dull and tapered) at pattern portions (both end edges of the line pattern) perpendicular to the line direction. For this reason, the second pattern is subjected to overlay exposure at least for the both end portions of the pattern formed by using the first pattern. Thus, it is possible to obtain a pattern image after development, in which exposure-defective portions at the both line ends of the first pattern are removed by the second pattern. As a result, it is possible to obtain a pattern image having no exposure-defective portion.

The pattern image having the high resolution can be obtained, for example, for line and space patterns and isolated line patterns, only by performing the overlay exposure (double exposure) comprising the first and second exposure steps described above. However, the projection exposure method may further comprise a third exposure step of illuminating a mask formed with a third pattern to remove a specific portion constituting an exposure pattern which has been obtained on the predetermined area on the photosensitive substrate by means of the first and second exposure steps. In this embodiment, the third pattern may be illuminated after the second exposure step with an illumination light beam obtained by transmitting the illumination light beam from a light source through a zonal area centered about the optical axis in a plane substantially corresponding to one obtained by Fourier transformation for a mask plane on which the third pattern is formed or in a plane in the vicinity thereof. The inclusion of the third exposure step makes it possible, for example, to obtain, after development, a pattern image having a high resolution comprising patterns from which, for example, specified portions for forming the third pattern are removed, by performing the overlay exposure under the condition of zonal illumination based on the use of the mask formed with the third pattern, from the pattern image having the high resolution and having the large depth of focus formed as a result of the overlay exposure carried out in the first and second exposure steps. This process is preferred, for example, when an contact hole image or the like is formed.

In order to execute the first to third exposure steps, it is possible to use a mask stage for carrying the mask formed with the first pattern, the mask formed with the second pattern, and the mask formed with the third pattern, and a substrate stage for carrying the photosensitive substrate. The identical area on the substrate may be subjected to triple exposure by scanning the respective masks across the illumination light beam by synchronously moving the mask stage and the substrate stage with respect to the illumination light beam.

According to a second aspect of the present invention, there is provided a scanning type exposure apparatus for exposing a photosensitive substrate (W1 or W2) with a pattern formed on a mask (R) by scanning the mask across an illumination light beam while synchronously moving the mask (R) and the photosensitive substrate (W1 or W2) with respect to the illumination light beam, the scanning type exposure apparatus comprising a mask stage (RST) which is movable in an in-plane direction of the mask while carrying a plurality of masks (R3, R4, R5) a nd which h as a reflective surface (262) formed on a side of the mask stage extending in a scanning direction; a detecting system (30) which detects a position of the mask stage by irradiating the reflective surface (262) with a light beam; a memory (91) for storing previously measured surface curvature data on the reflective surface (262) in relation to positions of the plurality of masks (R3, R4, R5) to be carried; and a control unit (90) which controls the position of the mask stage (RST) on the basis of the surface curvature data on the reflective surface (262) stored in the memory (91).

According to the scanning type exposure apparatus of the present invention, the control unit controls the position of the mask stage in the in-plane direction of the mask including the scanning direction and the direction perpendicular to the scanning direction on the basis of the surface curvature data on the reflective surface of the mask stage corresponding to the respective masks stored in the memory (corresponding to the position on the mask stage for carrying each of the masks thereon). Therefore, even if any curvature is generated on the reflective surface due to deformation caused, for example, by self-weight of the mask stage, it is possible to highly accurately control the position of the mask stage during scanning without being affected thereby. That is, the scanning exposure can be executed while accurately controlling the position of the mask with respect to the photosensitive substrate. When the plurality of masks are arranged in the scanning direction and carried on the mask stage, the length of the mask stage in the scanning direction is long. For this reason, the reflective surface is further apt to be bent or curved, and thereby the detection error tends to occur for the position of the mask. The scanning type exposure apparatus according to the present invention is effective in such a case. For example, when three sheets of masks are carried on the mask stage, triple exposure can be executed by repeatedly scanning and exposing an identical area on the photosensitive substrate with patterns of the respective masks. Therefore, the scanning type exposure apparatus according to the second aspect of the present invention is extremely useful for the projection exposure method according to the first aspect.

According to a third aspect of the present invention, there is provided a projection exposure apparatus for exposing a photosensitive substrate by projecting images of patterns formed on a plurality of masks (for example, 316, 318), formed by a projection optical system (PL), onto a photosensitive substrate (W1 or W2) respectively, the projection exposure apparatus comprising:

a first mask stage (312) which is movable in a two-dimensional plane while carrying a first mask (316); a second mask stage (314) which is movable independently from the first mask stage (312) on the same plane as that for the first mask stage (312) while carrying a second mask (318); a mark-detecting system (326L1, 326R1, 326L2, 326R2) which is provided separately from the projection optical system (PL), and detects marks formed on the first mask (316) and the second mask (318); a transport system (322, 324) which delivers the mask (for example, 316, 318) with respect to the first mask stage (312) and the second mask stage (314); and a control unit (90) which controls the first mask stage (312), the second mask stage (314), and the transport system (322, 324) respectively so that exposure is performed by using the mask (for example, 318) on any one of the mask stages of the first mask stage (312) and the second mask stage (314), during which at least one of mask exchange effected by the transport system (322) and mark detection effected by the mark-detecting system (326L1, 326R1) is performed on the other mask stage (for example, 312).

In the projection exposure apparatus according to the third aspect of the present invention, the first mask stage for carrying the first mask thereon and the second mask stage for carrying the second mask thereon are movable independently from each other. The operations of the first mask stage, the second mask stage, and the transport system are controlled by the control unit so that the exposure is performed by the aid of the projection optical system by using the mask on any one of the mask stages, during which at least one of the mark detection for the mask effected by the mark-detecting system such as a mask alignment system and the mask exchange effected by the transport system is concurrently processed in parallel to one another on the other mask stage. As a result, it is possible to improve the throughput as compared with a case in which a single mask stage is used to successively and sequentially perform mask exchange, mask mark detection, and exposure on the mask stage after completion of exposure for a mask on the mask stage.

In the projection exposure apparatus according to the third aspect, the mark-detecting system may further comprise, for example, a first mask alignment system (326L1, 326R1) which detects the mark on the first mask (316) placed on the first mask stage (312), and a second mask alignment system (236L2, 326R2) disposed on a side opposite to the first mask alignment system (326L1, 326R1) in relation to the projection optical system (PL) in a direction of a first axis along which the projection optical system (PL) and the first mask alignment system (326L1, 326R1) are arranged, and detects the mark on the second mask (318) placed on the second mask stage (314). In this embodiment, the projection exposure apparatus may further comprise an interferometer system (BI11Y, BI12Y, BI13X, BI14X, BI15X) having a first length-measuring axis (BI11Y) for always measuring a position of the first mask stage (312) in the direction of the first axis from one side in the direction of the first axis, a second length-measuring axis (BI12Y) for always measuring a position of the second mask stage (314) in the direction of the first axis from the other side in the direction of the first axis, a third length-measuring axis (BI13X) which perpendicularly intersects the first axis at an exposure position of the projection optical system (PL), a fourth length-measuring axis (BI14X) which perpendicularly intersects the first axis at a detection position of the first mask alignment system (326L1, 326R1), and a fifth length-measuring axis (BI15X) which perpendicularly intersects the first axis at a detection position of the second mask alignment system (326L2, 326R2). The interferometer system can measure two-dimensional positions of the first mask stage (312) and the second mask stage (314) respectively by using the length-measuring axes.

In this embodiment, the control unit (90) is desirably operated such that an interferometer having the third length-measuring axis (BI13X) is reset in a state in which positional measurement is executable for the first mask stage (312) based on the use of a measured value obtained by using the third length-measuring axis (BI13X) when the first mask stage (312) is moved to the exposure position from a position at which management of the first mask stage is performed based on the use of a measured value obtained by using the fourth length-measuring axis (BI14X) of the interferometer system (BI11Y, BI12Y, BI13X, BI14X, BI15X), and an interferometer having the fourth length-measuring axis (BI14X) is reset in a state in which positional measurement is executable for the first mask stage (312) based on the use of a measured value obtained by using the fourth length-measuring axis (BI14X) when the first mask stage (312) is moved to an alignment position from a position at which management of the first mask stage is performed based on the use of a measured value obtained by using the third length-measuring axis (BI13X); and the interferometer having the third length-measuring axis (BI13X) is reset in a state in which positional measurement is executable for the second mask stage (314) based on the use of a measured value obtained by using the third length-measuring axis (BI13X) when the second mask stage (314) is moved to the exposure position from a position at which management of the second mask stage is performed based on the use of a measured value obtained by using the fifth length-measuring axis (BI15X) of the interferometer system (BI11Y, BI12Y, BI13X, BI14X, BI15X), and an interferometer having the fifth length-measuring axis (BI15X) is reset in a state in which positional measurement is executable for the second mask stage (314) based on the use of a measured value obtained by using the fifth length-measuring axis (BI15X) when the second mask stage (314) is moved to an alignment position from a position at which management of the second mask stage is performed based on the use of a measured value obtained by using the third length-measuring axis (BI13X).

When the control is made as described above, the exposure is performed by using the mask on one of the mask stages by the aid of the projection optical system located at the center (exposure operation), during which the mark detection is performed for the mask on the other mask stage by using one mask alignment system (alignment operation). When the exposure operation and the alignment operation are changed, then the one mask stage having been located under the projection optical system can be easily moved to the position for the other mask alignment system, the other mask stage having been located at the position for the one mask alignment system can be easily moved up to the position under the projection optical system, only by moving the two mask stages along the direction of the first axis toward the other mask alignment system. The positional detection is performed for the positions of the respective mask stages by using the interferometers. In this process, even when the mask stage is moved passing over the length-measuring axes of the interferometers disposed to be directed to the respective positions of the projection optical system and the mask alignment system, the positional measurement is executable at the respective positions for the projection optical system and the mask alignment system by resetting the interferometer. When the plurality of masks are successively used as described above, it is possible to alternately use the two mask alignment systems so that the exposure operation and the alignment operation are concurrently dealt with in parallel to one another. In this embodiment, it is sufficient to independently measure the position of the mask stage by using the third, fourth, and fifth length-measuring axes at their measurement areas owing to the interferometer-resetting function. Accordingly, the mask stage can be miniaturized, and it is allowed to have a light weight. Specifically, it is sufficient for each of the mask stages to have a size of a degree which is somewhat larger than the reticle.

According to a fourth aspect of the present invention, there is provided a projection exposure apparatus for exposing a photosensitive substrate by projecting images of patterns formed on a plurality of masks (for example, R1, R2), formed by a projection optical system (PL), onto a photosensitive substrate (W1 or W2) respectively, the projection exposure apparatus comprising at least one mask-accommodating container formed with a plurality of accommodating areas for accommodating the plurality of masks (R1, R2) respectively; and a mask library (for example, 220) for accommodating the at least one mask-accommodating container.

In the exposure apparatus according to the fourth aspect, for example, when the plurality of masks are used as a set as in the double exposure, the masks of an amount corresponding to a predetermined number of sheets can be independently accommodated in one accommodating container respectively. The operation of taking out and inserting the accommodating container with respect to the mask library can be performed as one operation. Moreover, the combination of the masks is scarcely mistaken when the plurality of masks are stored. Thus, it is possible to easily manage the plurality of masks.

According to a fifth aspect of the present invention, there is provided a projection exposure apparatus for exposing a photosensitive substrate by projecting images of patterns formed on a plurality of masks (for example, R1, R2), formed by a projection optical system (PL), onto a photosensitive substrate (W1 or W2) respectively, the projection exposure apparatus comprising a plurality of individual accommodating containers (212, 214) for individually accommodating the plurality of masks (for example, R1, R2) respectively; a fixing tool (216) for superimposing and integrating the plurality of accommodating containers into one unit; and a mask library (220) for accommodating the plurality of individual accommodating containers integrated into the one unit by the aid of the fixing tool.

In the projection exposure apparatus according to the fifth aspect, for example, when the plurality of masks are used as a set, then the respective masks are accommodated in the individual accommodating containers respectively, and the plurality of individual accommodating containers can be united and fixed by using the fixing tool. Accordingly, for example, the plurality of masks can be conveyed in the fixed state, or they can be accommodated in the mask library as they are. Thus, it is possible to easily manage the plurality of masks as set units. When the plurality of individual accommodating containers are fixed by using the fixing tool, they form a single individual accommodating container unit in which the masks are individually accommodated. Accordingly, this arrangement is advantageous in that the conventional dust-measuring mechanism for measuring dust on the mask can be utilized as it is. Therefore, it is possible to easily manage the masks even when the exposure is performed by using the plurality of masks.

In this aspect, the fixing tool may serve to directly superimpose the plurality of individual accommodating containers. However, the fixing tool may be a coupling tool (238a, 238b) for coupling the individual accommodating containers (for example, 232, 234, 236) in a superimposing direction while being separated by a predetermined spacing distance. The mask library may comprise a plurality of support sections (244a to 244f) for supporting both side ends of the plurality of individual accommodating containers, and the plurality of support sections may be provided at a spacing distance corresponding to a thickness of the individual accommodating container. Further, the coupling tool may be attached to a portion of the individual accommodating container to make no interference with the support section. The structures of the mask library and the coupling tool designed as described above make it possible to use the conventional mask library for the cassette for individually accommodating masks as it is. Thus, the plurality of individual accommodating containers integrated into one unit by the aid of the fixing tool can be supported respectively by using the plurality of support sections provided therein. For example, the coupling tool may be attached to only a central portion of the individual accommodating container.

According to a sixth aspect of the present invention, there is provided a projection exposure apparatus comprising a projection exposure apparatus for exposing a photosensitive substrate by projecting images of patterns formed on a plurality of masks onto the photosensitive substrate respectively, the projection exposure apparatus comprising:

a first mask-driving system which moves a first mask in a predetermined plane;

a second mask-driving system which moves a second mask independently from the first mask, in a plane which is the same as that for the first mask or which is parallel thereto; and a control system which controls the first mask-driving system and the second mask-driving system respectively in order to project an image of a pattern formed on the first mask and an image of a pattern formed on the second mask onto the photosensitive substrate.

BRIEF DESCRIPTION OF THE DRAWINGS

FIG. 16A shows an aperture diaphragm to be used for the first exposure step of the double exposure performed in the first embodiment, FIG. 16B shows a reticle pattern to be used for the first exposure step of the double exposure performed in the first embodiment, and FIG. 16C shows a pattern assumed to be formed on a photosensitive substrate when the exposure is performed by using the reticle pattern shown in FIG. 16B.

FIG. 17A shows an aperture diaphragm to be used for the second exposure step of the double exposure performed in the first embodiment, FIG. 17B shows a reticle pattern to be used for the second exposure step of the double exposure performed in the first embodiment, and FIG. 17C shows a pattern assumed to be formed on the photosensitive substrate when the exposure is performed by using the reticle pattern shown in FIG. 17B.

FIG. 18 shows a completed pattern formed as a result of the double exposure performed in the first embodiment.

FIG. 26A shows an aperture diaphragm to be used for the first exposure step of the double exposure performed in the second embodiment, FIG. 26B shows a reticle pattern to be used for the first exposure step of the double exposure performed in the second embodiment, and FIG. 26C shows a pattern assumed to be formed on a photosensitive substrate when the exposure is performed by using the reticle pattern shown in FIG. 26B.

FIG. 27A shows an aperture diaphragm to be used for the second exposure step of the double exposure performed in the second embodiment, FIG. 27B shows a reticle pattern to be used for the second exposure step of the double exposure performed in the second embodiment, and FIG. 27C shows a pattern assumed to be formed on the photosensitive substrate when the exposure is performed by using the reticle pattern shown in FIG. 27B.

FIG. 28 shows an estimated formation pattern to be formed when the development is performed after the second exposure step.

FIG. 29A shows an aperture diaphragm to be used for the third exposure step of the double exposure performed in the second embodiment, FIG. 29B shows a reticle pattern to be used for the third exposure step of the double exposure performed in the second embodiment, and FIG. 29C shows a pattern assumed to be formed on the photosensitive substrate when the exposure is performed by using the reticle pattern shown in FIG. 29B.

FIG. 30 shows a completed pattern formed by the triple exposure performed in the second embodiment.

DETAILED DESCRIPTION OF THE EMBODIMENT

<First Embodiment>

A first embodiment of the present invention will be explained below with reference to FIGS. 1 to 23.

Figure 1:
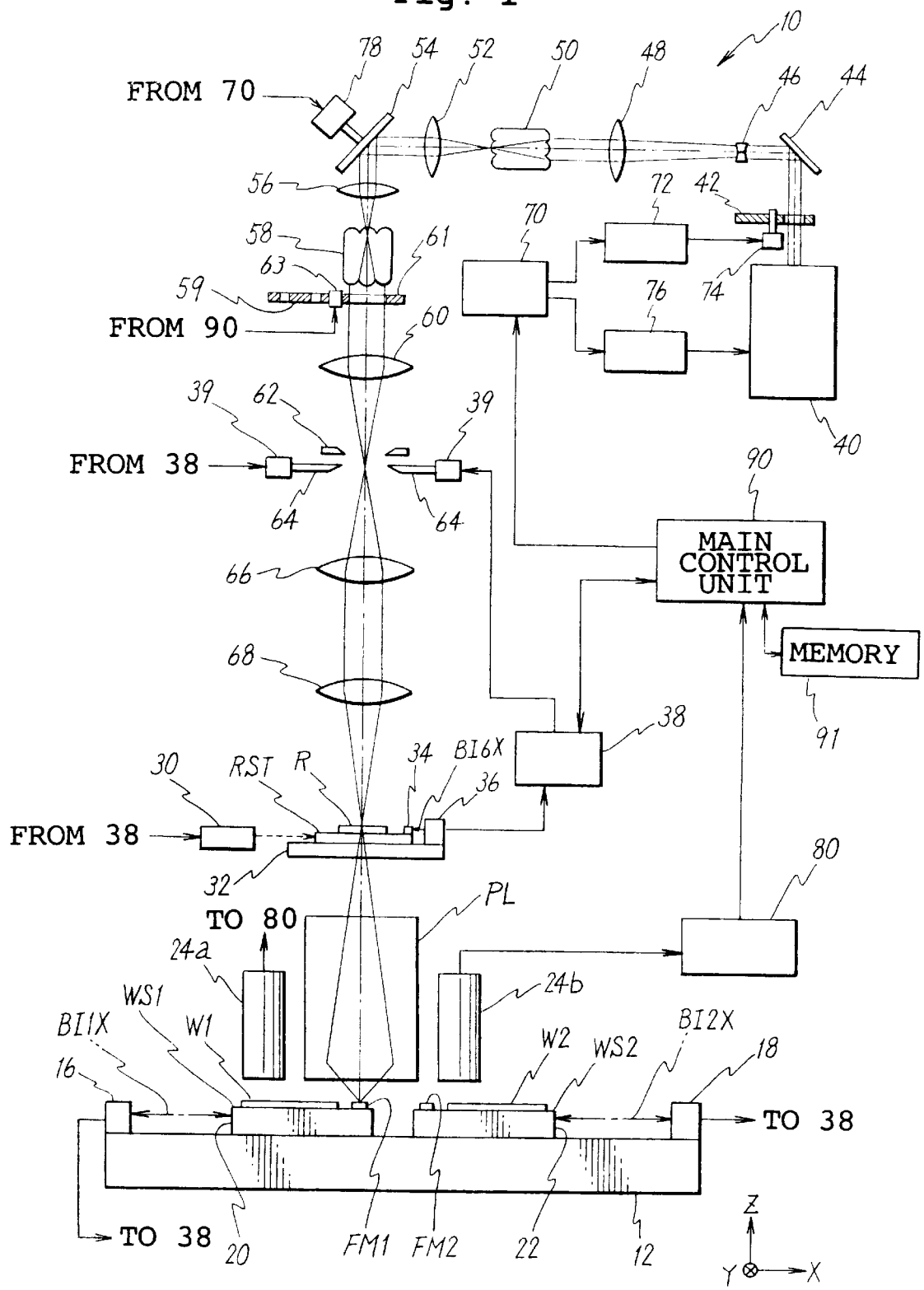
FIG. 1 shows a schematic arrangement of the projection exposure apparatus according to the first embodiment of the present invention.

FIG. 1 shows a schematic arrangement of a projection exposure apparatus 10 according to the first embodiment. The projection exposure apparatus 10 is a projection exposure apparatus of the scanning exposure type based on the so-called step-and-scan system. The structure and the control method concerning the projection exposure apparatus based on the step-and-scan system are disclosed in U.S. Pat. No. 5,646,413, the content of which is incorporated herein by reference.

The projection exposure apparatus 10 comprises, for example, a stage apparatus provided with wafer stages WS1, WS2 which are independently movable in the two-dimensional direction on a base pedestal 12 while holding wafers W1, W2 as photosensitive substrates, a projection optical system PL disposed over the stage apparatus, a reticle-driving mechanism disposed over the projection optical system PL, for driving a reticle R as a mask in a predetermined direction, i.e., in the Y axis direction in this embodiment (direction perpendicular to the plane of the paper in FIG. 1), an illumination system for illuminating the reticle R from a position thereover, and a control system for controlling the respective components.

The stage apparatus is supported over the base pedestal 12 in a floating manner by the aid of an unillustrated air bearing. The stage apparatus comprises the two wafer stages WS1, WS2 which are independently movable two-dimensionally in the X axis direction (lateral direction along the plane of the paper shown in FIG. 1) and in the Y axis direction (direction perpendicular to the plane of the paper shown in FIG. 1), a stage-driving system for driving the wafer stages WS1, WS2, and an interferometer system for measuring the positions of the wafer stages WS1, WS2.

The arrangement will be further described below. Unillustrated air pads (for example, vacuum-pre-loadable air bearings) are provided at a plurality of positions on bottom surfaces of the wafer stages WS1, WS2. The wafer stages WS1, WS2 are supported over the base pedestal 12 in a floating manner in a state in which a spacing distance of, for example, several microns is maintained in accordance with the balance between the vacuum-pre-loaded force and the air-ejecting force effected by the air pads.

Figure 3:
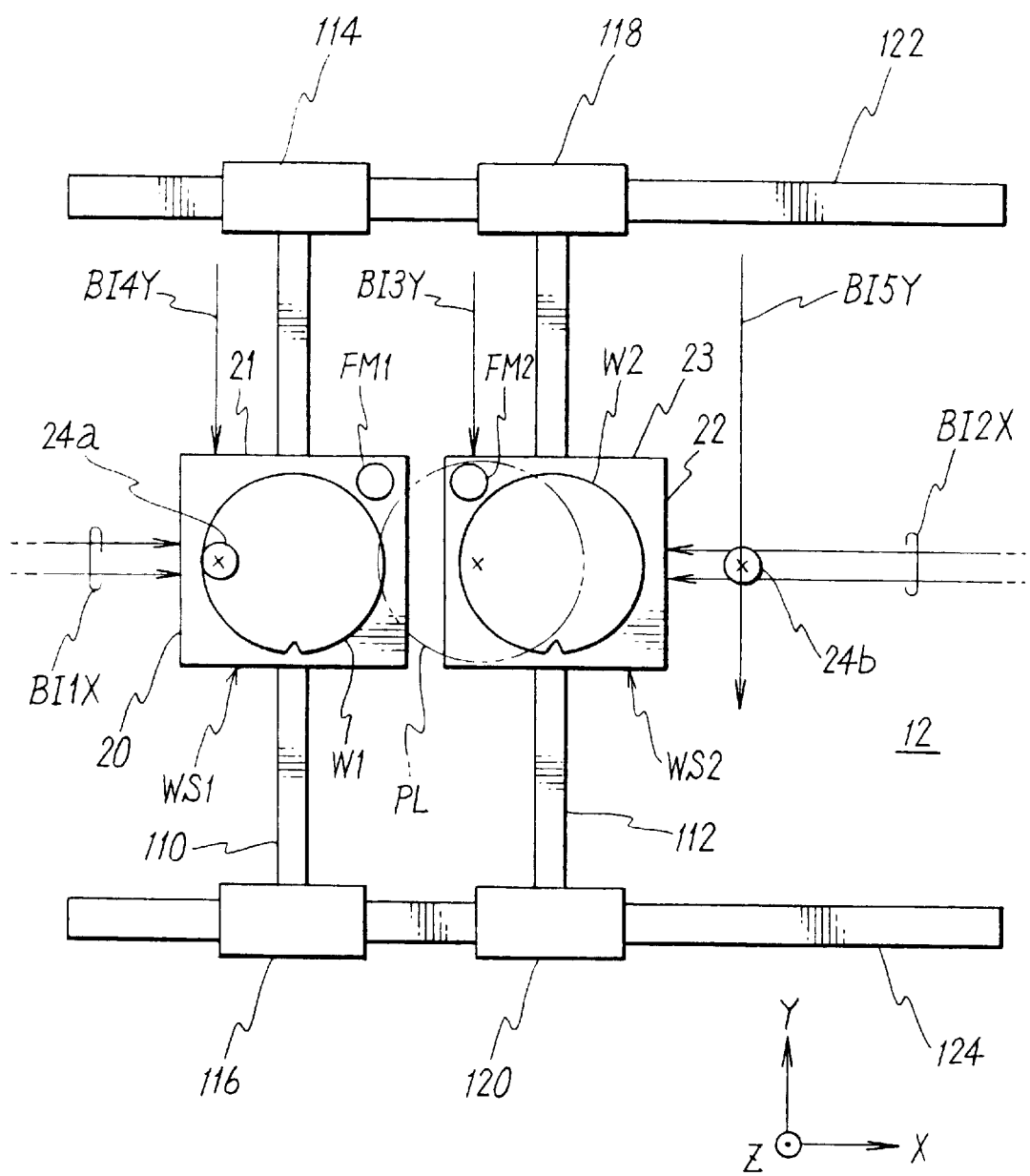
FIG. 3 shows a plan view illustrating the arrangement of the driving mechanism for the wafer stages.

As shown in a plan view in FIG. 3, two X axis linear guides (for example, fixed magnets of a linear motor of the so-called moving coil type) 122, 124, which extend in the X axis direction, are provided in parallel on the base pedestal 12. Two movable members 114, 118, 116, 120, which are movable along the X axis linear guides respectively, are attached to the X axis linear guides 122, 124 respectively. Unillustrated driving coils are attached to bottom portions of the four movable members 114, 118, 116, 120 respectively so that the X axis linear guides 122, 124 are surrounded thereby at upper and lateral sides. The moving coil type linear motors for driving the respective movable members 114, 116, 118, 120 in the X axis direction are constructed by the driving coils and the X axis linear guides 122, 124 respectively. However, in the following description, the movable members 114, 116, 118, 120 are referred to as "X axis linear motor" for convenience.

Among them, the two X axis linear motors 114, 116 are provided at both ends of a Y axis linear guide 110 extending in the Y axis direction (for example, a fixed coil of a linear motor of the moving magnet type) respectively. The other two X axis linear motors 118, 120 are secured to both ends of a similar Y axis linear guide 112 extending in the Y axis direction. Therefore, the Y axis linear guide 110 is driven along the X axis linear guides 122, 124 by means of the X axis linear motors 114, 116, while the Y axis linear guide 112 is driven along the X axis linear guides 122, 124 by means of the X axis linear motors 118, 120.

On the other hand, an unillustrated magnet, which surrounds one of the Y axis linear guides 110 at upper and lateral sides, is provided on the bottom of the wafer stage WS1. A moving magnet type linear motor for driving the wafer stage WS1 in the Y axis direction is constructed by the magnet and the Y axis linear guide 110. Further, an unillustrated magnet, which surrounds the other Y axis linear guide 112 at upper and lateral sides, is provided on the bottom of the wafer stage WS2. A moving magnet type linear motor for driving the wafer stage WS2 in the Y axis direction is constructed by the magnet and the Y axis linear guide 112.

That is, in the first embodiment of the present invention, the stage-driving system for two-dimensionally driving the wafer stages WS1, WS2 independently in the XY direction is constructed, for example, by the X axis linear guides 122, 124, the X axis linear motors 114, 116, 118, 120, the Y axis linear guides 110, 112, and the unillustrated magnets disposed on the bottoms of the wafer stages WS1, WS2. The stage-driving system is controlled by a stage control unit 38 shown in FIG. 1.

Minute yawing can be generated on the wafer stage WS1, or minute yawing can be removed therefrom, by slightly varying the torque of the pair of X axis linear motors 114, 116 provided at the both ends of the Y axis linear guide 110. Similarly, minute yawing can be generated on the wafer stage WS2, or minute yawing can be removed therefrom, by slightly varying the torque of the pair of X axis linear motors 118, 120 provided at the both ends of the Y axis linear guide 112.

Wafers W1, W2 are fixed on the wafer stages WS1, WS2 by means of, for example, vacuum suction by the aid of unillustrated wafer holders. Each of the wafer holders is finely driven in the Z axis direction perpendicular to the XY plane and in the $\theta$ direction (rotational direction about the Z axis) by means of an unillustrated Z·$\theta$ driving mechanism. Fiducial mark plates FM1, FM2, on which various fiducial marks are formed, are placed on upper surfaces of the wafer stages WS1, WS2 to be at the substantially same height as that of the wafers W1, W2 respectively. The fiducial mark plates FM1, FM2 are used, for example, when the reference position of each of the wafer stages is detected.

One side surface (left side surface in FIG. 1) 20 of the wafer stage WS1 in the X axis direction, and one side surface (back side surface as viewed in the plane of the paper in FIG. 1) 21 thereof in the Y axis direction are mirror-finished reflective surfaces. Similarly, the other side surface (right side surface in FIG. 1) 22 of the wafer stage WS22 in the X axis direction, and one side surface 23 thereof in the Y axis direction are mirror-finished reflective surfaces. Interferometer beams for respective length-measuring axes (for example, BI1X, BI2X) for constructing an interferometer system as described later on are projected onto the reflective surfaces. Reflected light beams therefrom are received by respective interferometers so as to measure displacements of the respective reflective surfaces from the reference position (in general, a fixed mirror is disposed on a side surface of the projection optical system or on a side surface of the alignment optical system, and such a position is used as the reference surface). Thus, the two-dimensional positions of the wafer stages WS1, WS2 are measured respectively. The construction of the length-measuring axes of the interferometer system will be described in detail later on.

A refractive optical system, which comprises a plurality of lens elements having a common optical axis in the Z axis direction and which is telecentric on both sides having a predetermined reduction magnification, for example, ¼, ⅕, or ⅙, is used as the projection optical system PL. Therefore, the velocity of movement of the wafer stage in the scanning direction during scanning exposure based on the step-and-scan system is ¼, ⅕, or ⅙ of the velocity of movement of the reticle stage respectively.

As shown in FIG. 1, alignment systems 24a, 24b having the same function based on the off-axis system are installed on both sides in the X axis direction of the projection optical system PL at positions separated from the center of the optical axis of the projection optical system PL (coincident with the projection center of the image of the reticle pattern) by an identical distance respectively. The alignment systems 24a, 24b have three types of alignment sensors based on the LSA (Laser Step Alignment) system, the FIA (Field Image Alignment) system, and LIA (Laser Interferometric Alignment) system. The alignment systems 24a, 24b make it possible to perform measurement of the position in the X, Y two-dimensional direction of the reference mark on the fiducial mark plate and the alignment mark on the wafer. LSA and LIA are disclosed in U.S. Pat. No. 5,151,750, and FIA is disclosed in U.S. Pat. No. 549,340, the contents of which are incorporated herein by reference.

The LSA system resides in a general-purpose sensor most widely used to measure the mark position by irradiating the mark with a laser beam and utilizing a diffracted and scattered light beam. The LSA system has been hitherto widely used for process wafers. The FIA system resides in a sensor to measure the mark position by illuminating the mark with a broad band (wide zone) light beam such as a halogen lamp, and performing image processing for an obtained mark image. The FIA system is effectively used for asymmetric marks on aluminum layers and wafer surfaces. The LIA system resides in a sensor to detect positional information of the mark from a phase measured by irradiating a diffraction grating-shaped mark with laser beams having slightly different frequencies in two directions, and interfering two generated diffracted light beams. The LIA system is effectively used for wafers having small differences in level and wafers having rough surfaces.

In the first embodiment of the present invention, the three types of the alignment sensors are appropriately used depending on the purpose so that, for example, so-called search alignment is performed for measuring the approximate position of the wafer by detecting three points of one-dimensional marks on the wafer, and fine alignment is performed for measuring the accurate position of each of shot areas on the wafer.

In this embodiment, the alignment system 24a is used, for example, to measure positions of the alignment marks on the wafer W1 held on the wafer stage WS1 and the reference marks formed on the fiducial mark plate FM1. The alignment system 24b is used, for example, to measure positions of the alignment marks on the wafer W2 held on the wafer stage WS2 and the reference marks formed on the fiducial mark plate FM2.

The information, which is obtained and supplied from the respective alignment sensors for constructing the alignment systems 24a, 24b, is subjected to A/D conversion by the aid of an alignment control unit 80 to obtain a digital waveform signal which is computed and processed to detect the mark position. An obtained result is supplied to a main control unit 90. The main control unit 90 instructs the stage control unit 38 to perform, for example, correction for the synchronization position during the exposure depending on the obtained result.

Figure 5:
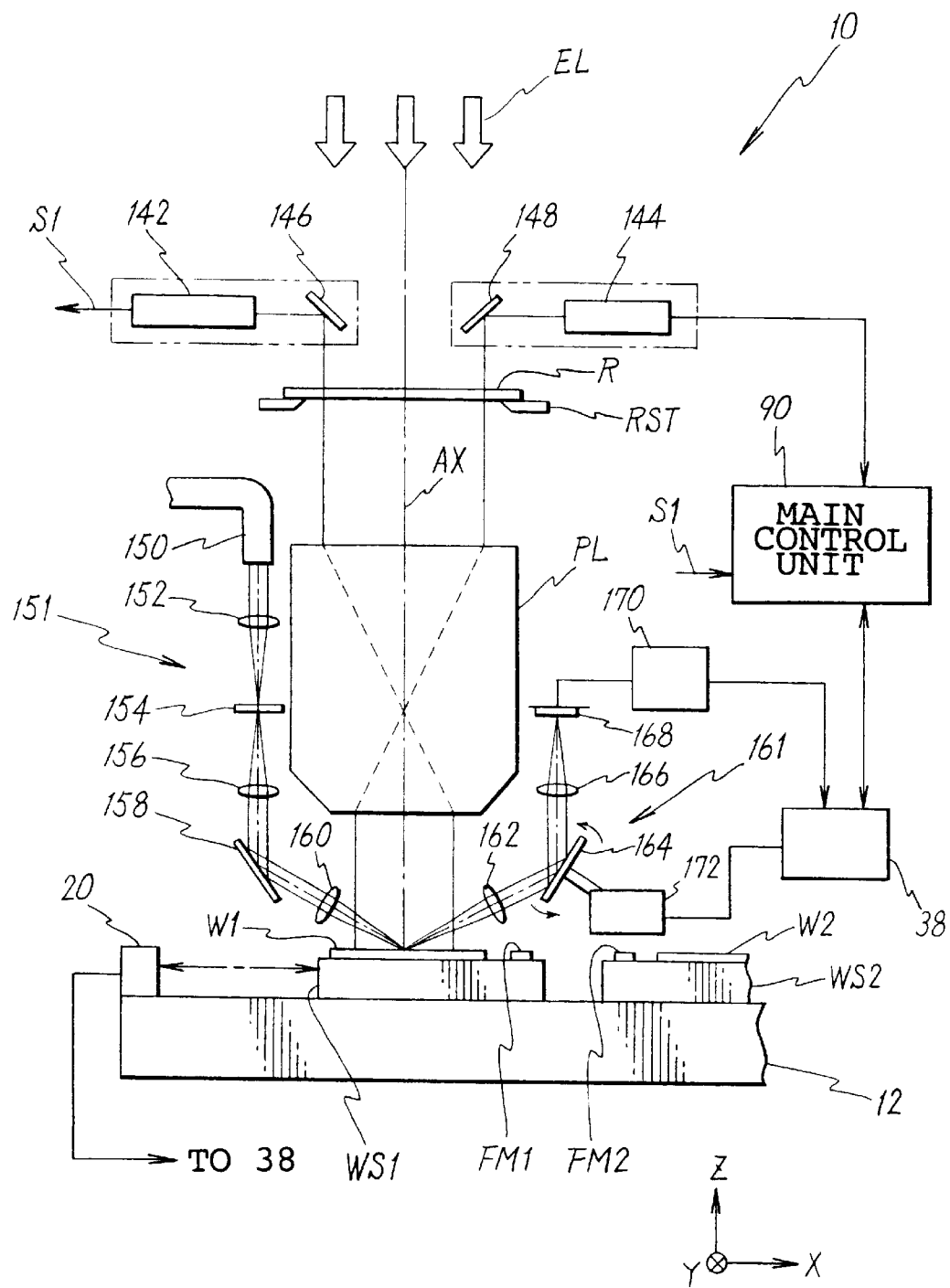
FIG. 5 shows a schematic arrangement of the projection exposure apparatus illustrating the layout of the AF/AL system and the TTR alignment system.

Further, in the exposure apparatus 10 according to the first embodiment of the present invention, although not shown in FIG. 1, a pair of reticle alignment microscopes 142, 144 are provided over the reticle R as shown in FIG. 5. Each of the reticle alignment microscopes 142, 144 comprises a TTR (Through The Reticle) alignment optical system based on the use of an exposure wavelength for simultaneously observing the reticle mark (not shown) on the reticle R and the marks on the fiducial mark plates FM1, Fm2 via the projection optical system PL. Detection signals obtained by using the reticle alignment microscopes 142, 144 are supplied to the main control unit 90. In this embodiment, polarizing mirrors 146, 148 for introducing detected light beams from the reticle R into the reticle alignment microscopes 142, 144 respectively are movably arranged. When the exposure sequence is started, the polarizing mirrors 146, 148 are retracted by means of unillustrated mirror-driving units in accordance with the command supplied from the main control unit 90. A system equivalent to the reticle alignment microscopes 142, 144 is disclosed, for example, in U.S. Pat. No. 5,646,416 corresponding to Japanese Laid-Open Patent Publication No. 7-176468, detailed explanation of which will be omitted herein.

Figure 4:
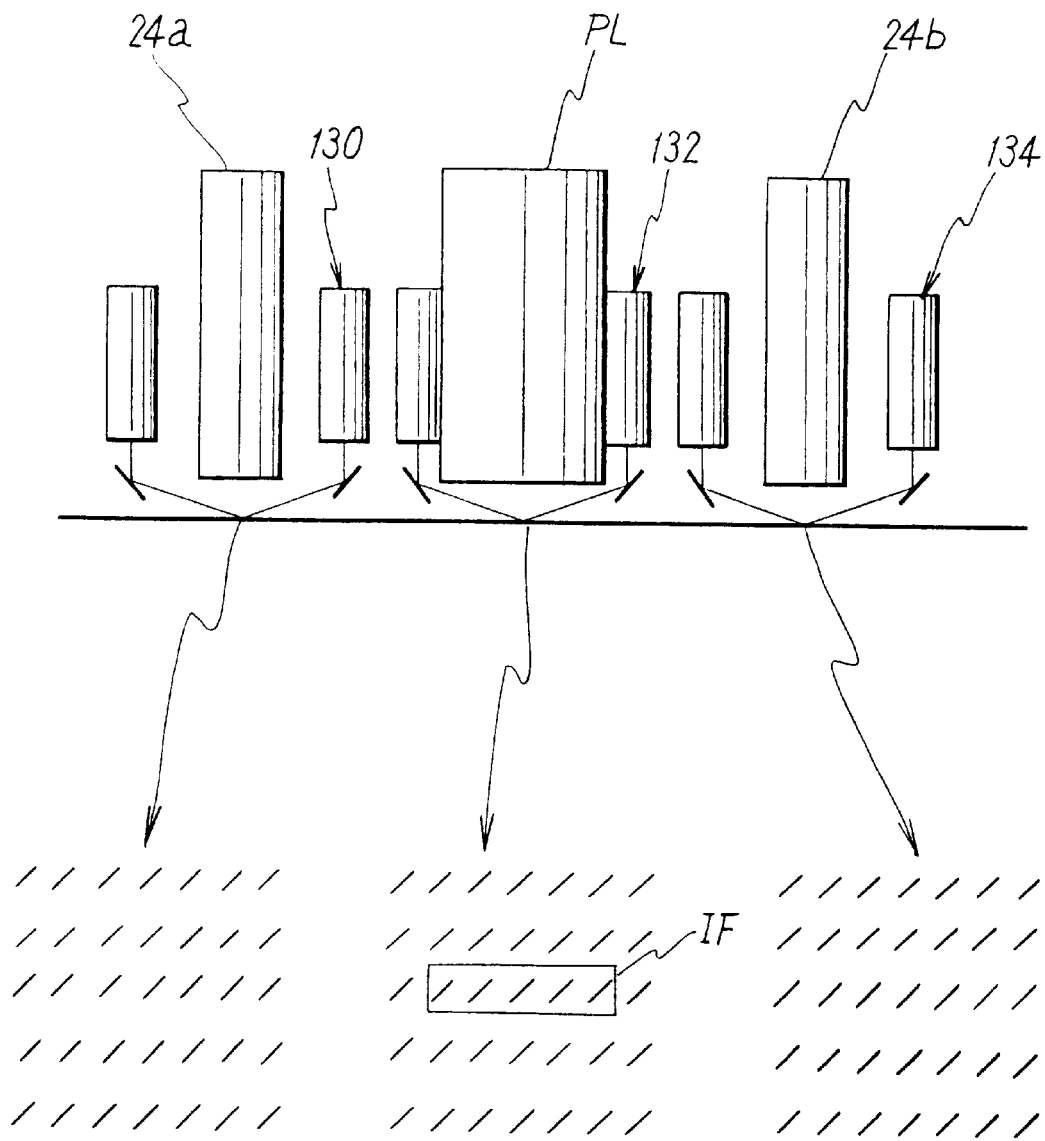
FIG. 4 shows the AF/AL systems provided for the projection optical system and the alignment systems respectively.

Although not shown in FIG. 1, autofocus/autoleveling measuring mechanisms (hereinafter referred to as "AF/AL system") 130, 132, 134 for investigating the focusing position are provided for the projection optical system PL and the alignment systems 24a, 24b respectively as shown in FIG. 4. Among them, the AF/AL system 132 is provided to detect whether or not the exposure surface of the wafer W coincides with (focuses with) the image plane of the projection optical system PL within a range of the depth of focus, because it is necessary that the pattern formation plane on the reticle R is conjugate to the exposure surface of the wafer W in relation to the projection optical system PL in order to accurately transfer the pattern on the reticle R onto the wafer (W1 or W2) by means of scanning exposure. In the first embodiment of the present invention, a so-called multi-point AF system is used as the AF/AL system 132.

Now, detailed arrangement of the multi-point AF system for constructing the AF/AL system 132 will be explained with reference to FIGS. 5 and 6.

As shown in FIG. 5, the AF/AL system (multi-point AF system) 132 comprises an irradiating optical system 151 including a bundle of optical fibers 150, a light-collecting lens 152, a pattern formation plate 154, a lens 156, a mirror 158, and an irradiating objective lens 160; and a light-collecting optical system 161 including a light-collecting objective lens 162, a rotary directional vibration plate 164, an image-forming lens 166, and a light receiving unit 168.

The respective constitutive components of the AF/AL system (multi-point AF system) 132 will be now explained together with their functions. The AF/AL system is disclosed in U.S. Pat. No. 5,502,311, the content of which is incorporated herein by reference.

An illumination light beam having a wavelength which is different from that of the exposure light beam EL and at which the photoresist on the wafer W1 (or W2) is not photosensitive is introduced from an unillustrated illumination light source via the optical fiber bundle 150. The illumination light beam radiated from the optical fiber bundle 150 passes through the light-collecting lens 152, and the pattern formation plate 154 is illuminated therewith. The illumination light beam transmitted through the pattern formation plate 154 passes through the lens 156, the mirror 158, and the irradiating objective lens 160, and the illumination light beam is projected onto the exposure surface of the wafer W. The image of the pattern on the pattern formation plate 154 is projected obliquely with respect to the optical axis AX, and the image is formed on the exposure surface of the wafer W1 (or W2). The illumination light beam is reflected by the wafer W1, and it is projected onto the light-receiving surface of the light receiving unit 168 via the light-collecting objective lens 162, the rotary directional vibration plate 164, and the image-forming lens 166. The image of the pattern on the pattern formation plate 154 is formed again on the light receiving surface of the light receiving unit 168. The main control unit 90 is now operated to give predetermined vibration to the rotary directional vibration plate 164 by the aid of a vibrating unit 172. Further, the main control unit 90 is operated to supply, to a signal-processing unit 170, detection signals from a large number of (specifically, the same number as that of slit patterns of the pattern formation plate 154) light-receiving elements of the light-receiving unit 168. The signal-processing unit 170 performs synchronized detection for the respective detection signals by using the driving signal of the vibrating unit 172 to obtain a large number of focus signals which are supplied to the main control unit 90 via the stage control unit 38.

Figure 6:
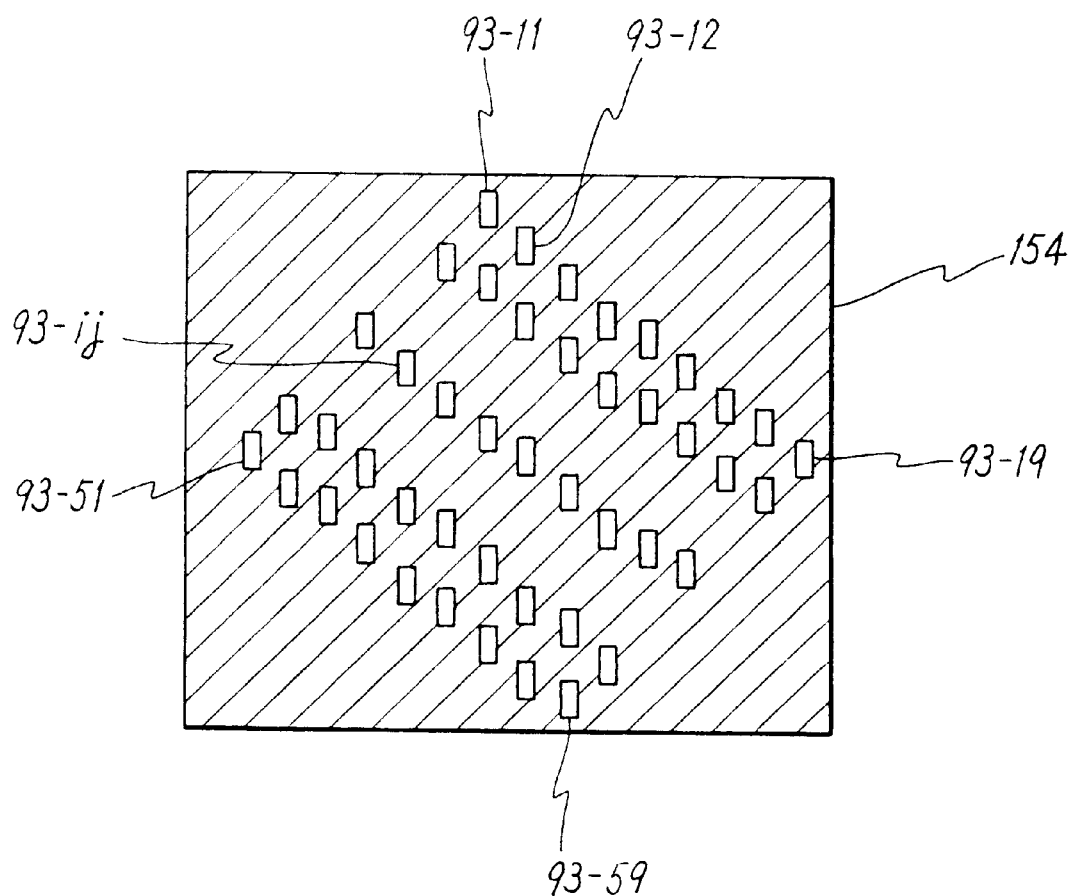
FIG. 6 shows the shape of the pattern formation plate shown in FIG. 5.

In this embodiment, as shown in FIG. 6, a slit-shaped aperture pattern 93-11 to 93-59, which comprises, for example, 5×9=45 individuals, is formed vertically on the pattern formation plate 154. The image of the slit-shaped aperture pattern is projected obliquely (at 45°) with respect to the X axis and the Y axis, onto the exposure surface of the wafer W. As a result, as shown in FIG. 4, the slit images are formed, which are arranged in matrix, and inclined by 45° with respect to the X axis and the Y axis. Reference symbol IF in FIG. 4 indicates an illumination field on the wafer conjugate to the illumination area on the reticle illuminated by the illumination system. As also clarified from FIG. 4, the detecting beam is radiated onto an area which is two-dimensionally sufficiently larger than the illumination field IF under the projection optical system PL.

Besides, the AF/AL systems 130, 134 are constructed in the same manner as the AF/AL system 132. That is, the first embodiment of the present invention is constructed such that approximately the same area as that for the AF/AL system 132 used to detect the focus during exposure can be also irradiated with the detecting beam by using the AF/AL mechanisms 130, 134 used when the alignment mark is measured. Accordingly, highly accurate alignment measurement can be performed by measuring the position of the alignment mark while executing the autofocus/autoleveling based on the use of the measurement and control of the AF/AL system similar to those performed during exposure, upon measurement by using the alignment sensors based on the use of the alignment systems 24a, 24b. In other words, no offset (error) occurs due to the posture of the stage, between the process of exposure and the process of alignment.

Next, the reticle-driving mechanism will be explained with reference to FIGS. 1 and 2.

The reticle-driving mechanism comprises a reticle stage RST which is movable in the XY two-dimensional direction over a reticle base plate 32 while holding the reticle R, an unillustrated linear motor for driving the reticle stage RST, and a reticle interferometer system for managing the position of the reticle stage RST.

The arrangement of the reticle-driving mechanism will be described in further detail below. As shown in FIG. 2, the reticle stage RST is constructed such that two sheets of reticles R1, R2 are placed in series in the scanning direction (Y axis direction). The reticle stage RST is supported in a floating manner over the reticle base plate 32 by the aid of, for example, an unillustrated air bearing. The reticle stage RST is subjected to fine driving in the X axis direction, minute rotation in the θ direction, and scanning driving in the Y axis direction by the aid of a driving mechanism 30 (see FIG. 1) comprising, for example, an unillustrated linear motor. The driving mechanism 30 is a mechanism which uses a linear motor as a driving source similar to the stage apparatus described above. However, the driving mechanism 30 is indicated as a simple block in FIG. 1 conveniently for illustration and conveniently for explanation. Accordingly, the reticles R1, R2 on the reticle stage RST are selectively used, for example, upon double exposure, in which each of the reticles can be subjected to scanning in synchronization with the wafer.

A parallel flat plate movement mirror 34, which is composed of the same material (for example, a ceramic) as that of the reticle stage RST, is provided at an end on one side in the X axis direction on the reticle stage RST to extend in the Y axis direction. A refractive surface, which is formed by means of mirror-finish processing, is formed on the other side surface of the movement mirror 34 in the X axis direction. An interferometer beam is radiated onto the reflective surface of the movement mirror 34 from the interferometer 36 indicated by the length-measuring axis BI6X. The reflected light beam is received by the interferometer to measure the relative displacement with respect to the reference plane in the same manner as performed for the wafer stage. Thus, the position of the reticle stage RST is measured. In this embodiment, the interferometer having the length-measuring axis BI6X actually has two interferometer optical axes capable of performing measurement independently, making it possible to measure the position of the reticle stage in the X axis direction and measure the yawing amount. The measured value obtained by using the interferometer having the length-measuring axis BI6X is used to perform synchronization control in the X direction and rotational control of the reticle state RST in the direction to cancel the relative rotation (rotational error) between the reticle and the wafer on the basis of the information on the X position and the information on the yawing of the wafer stages WS1, WS2 supplied from the interferometers 16, 18 having length-measuring axes BI1X, BI2X disposed on the wafer stage side.

On the other hand, a pair of corner cube mirrors 35, 37 are installed on the other side (front side in the plane of the paper in FIG. 1) of the reticle stage RST in the Y axis direction as the scanning direction. Interferometer beams, which are represented by length-measuring axes BI7Y, BI8Y in FIG. 2, are radiated from a pair of unillustrated double-path interferometers to the corner cube mirrors 35, 37. The beams are returned to the reflective surface of the reticle base plate 32 by the corner cube mirrors 35, 37. The respective reflected light beams reflected thereby return via the same optical paths, and they are received by the respective double-path interferometers. Thus, the relative displacements of the respective corner cube mirrors 35, 37 are measured with respect to the reference position (the reflective surface on the reticle base plate 32 as the reference position). Measured values obtained by the double-path interferometers are supplied to the stage control unit 38 shown in FIG. 1 to obtain an average value thereof on the basis of which the position of the reticle stage RST in the Y axis direction is measured. The information on the position in the Y axis direction is used for calculation of the relative position between the reticle stage RST and the wafer stage WS1 or WS2 on the basis of the measured value obtained by the interferometer disposed on the wafer side and having the length-measuring axis BI3Y. Further, the information is used for synchronization control between the reticle and the wafer in the scanning direction (Y axis direction) during the scanning exposure based thereon.

That is, in the first embodiment of the present invention, the reticle interferometer system is constructed by the interferometer 36 and the pair of double-path interferometers represented by the length-measuring axes BI7Y, BI8Y.

Next, an interferometer system for managing the positions of the wafer stages WST1, WST2 will be explained with reference to FIGS. 1 to 3.

Figure 2:
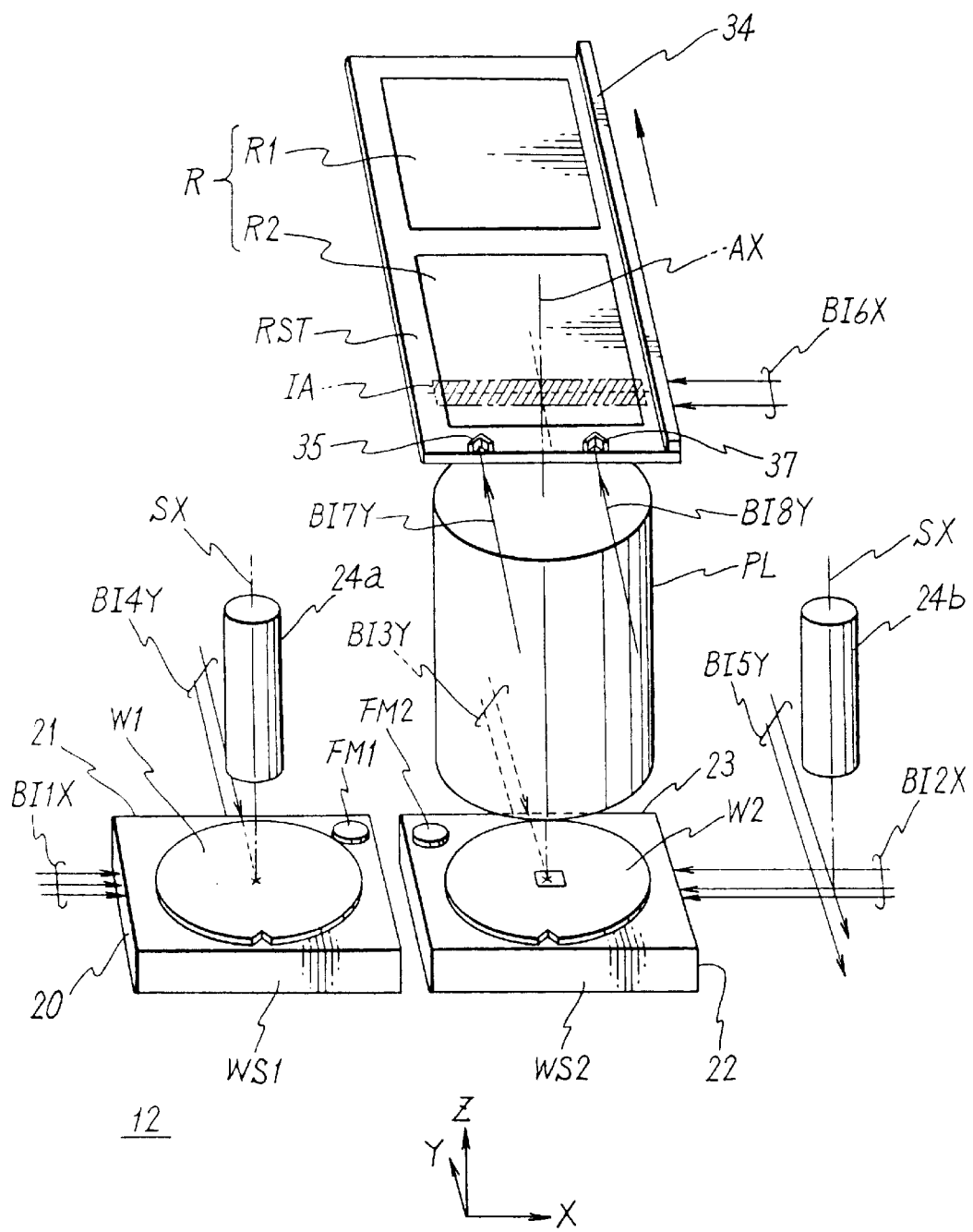
FIG. 2 shows a perspective view illustrating the positional relationship among the two wafer stages, the reticle stage, the projection optical system, and the alignment systems.

As shown in FIGS. 1 to 3, the interferometer beam, which is represented by the length-measuring axis BI1X from the interferometer 16 shown in FIG. 1, is radiated onto the surface of the wafer stage WS1 on one side in the X axis direction along the first axis (X axis) passing through the projection center of the projection optical system PL and the respective detection centers of the alignment systems 24a, 24b. Similarly, the interferometer beam, which is represented by the length-measuring axis BI2X from the interferometer 18 shown in FIG. 1, is radiated onto the surface of the wafer stage WS2 on the other side in the X axis direction along the first axis. Reflected light beams therefrom are received by the interferometers 16, 18 so as to measure the relative displacements of the respective reflective surfaces from the reference position and measure the positions of the wafer stages WS1, WS2 in the X axis direction. In this embodiment, as shown in FIG. 2, each of the interferometers 16, 18 is a three-axis interferometer having three optical axes, making it possible to perform tilt measurement and θ measurement, in addition to the measurement for the wafer stages WS1, WS2 in the X axis direction. Output values for the respective optical axes can be independently measured. In this embodiment, unillustrated θ stages for performing θ rotation for the wafer stages WS1, WS2, and unillustrated Z-leveling stages for performing minute driving and driving for inclination in the Z axis direction are actually disposed under the reflective surfaces (20 to 23). Accordingly, all of the driving amounts concerning tilt control of the wafer stages can be monitored by using the interferometers 16, 18.

The respective interferometer beams represented by the length-measuring axes BI1X, BI2X always hit the wafer stages WS1, WS2 in the all regions of the movement range of the wafer stages WS1, WS2. Therefore, as for the X axis direction, the positions of the wafer stages WS1, WS2 are managed on the basis of measured values obtained by using the length-measuring axes BI1X, BI2X at any time of, for example, the exposure based on the use of the projection optical system PL and the use of the alignment systems 24a, 24b.

As shown in FIGS. 2 and 3, the projection exposure apparatus is provided with an interferometer having a length-measuring axis BI3Y perpendicularly intersecting the first axis (X axis) at the projection center of the projection optical system PL, and interferometers having length-measuring axes BI4Y, BI5Y respectively perpendicularly intersecting the first axis (X axis) at the respective detection centers of the alignment systems 24a, 24b. However, only the length-measuring axes are shown in the drawings.

In the case of the first embodiment of the present invention, the measured values obtained by using the interferometer having the length-measuring axis BI3Y passing through the projection center of the projection optical system, i.e., the optical axis AX are used to measure the positions of the wafer stages WS1, WS2 in the Y direction during the exposure based on the use of the projection optical system PL. The measured value obtained by using the interferometer having the length-measuring axis BI4Y passing through the detection center of the alignment system 24a, i.e., the optical axis SX is used to measure the position of the wafer stage WS1 in the Y direction during the use of the alignment system 24a. The measured value obtained by using the interferometer having the length-measuring axis BI5Y passing through the detection center of the alignment system 24b, i.e., the optical axis SX is used to measure the position of the wafer stage WS2 in the Y direction during the use of the alignment system 24b.

Therefore, the length-measuring axis of the interferometer in the Y direction is deviated from the reflective surface of the wafer stage WS1, WS2 depending on the respective conditions of use. However, at least one of the length-measuring axes, i.e., the length-measuring axes BI1X, BI2X are not deviated from the reflective surfaces of the respective wafer stages WS1, WS2. Accordingly, it is possible to reset the interferometer on the Y side at an appropriate position at which the optical axis of the interferometer to be used enters the reflective surface. The method for resetting the interferometer will be described in detail later on.

The respective interferometers having the length-measuring axes BI3Y, BI4Y, BI5Y for Y measurement are two-axis interferometers each having two optical axes. They are capable of performing tilt measurement in addition to the measurement in the Y axis direction for the wafer stages WS1, WS2. Output values concerning the respective optical axes can be measured independently.

In the first embodiment of the present invention, the interferometer system for managing the two-dimensional coordinate positions of the wafer stages WS1, WS2 is constructed by the five interferometers in total including the interferometers 16, 18 and the three interferometers having the length-measuring axes BI3Y, BI4Y, BI5Y.

In the first embodiment of the present invention, the exposure sequence is executed on one of the wafer stages WS1, WS2, while the wafer exchange/wafer alignment sequence is executed on the other of the wafer stages WS1, WS2 as described later on. During this process, in order not to cause any interference between the both stages, the movement of the wafer stages WS1, WS2 is managed by the stage control unit 38 in accordance with the command given by the main control unit 90 on the basis of the output values obtained by the respective interferometers.

Next, the illumination system will be explained with reference to FIG. 1. As shown in FIG. 1, the illumination system comprises, for example, a light source unit 40, a shutter 42, a mirror 44, beam expanders 46, 48, a first fly's eye lens 50, a lens 52, a vibration mirror 54, a lens 56, a second fly's eye lens 58, an aperture diaphragm plate of the illumination system (hereinafter referred to as "revolver") 61, a lens 60, a fixed blind 62, a movable blind 64, and relay lenses 66, 68.

The respective components of the illumination system will now be explained together with their functions.

A laser beam is radiated from the light source unit 40 composed of a KrF excimer laser as a light source and a light-reducing system (for example, a light-reducing plate, an aperture diaphragm). The laser beam passes through the shutter 42, and then it is polarized by the mirror 44, followed by being shaped to have an appropriate beam diameter by means of the beam expanders 46, 48. The laser beam comes into the first fly's eye lens 50. The light beam coming into the first fly's eye lens 50 is divided into a plurality of light beams by elements of the fly's eye lens arranged two-dimensionally. The respective light beams come into the second fly's eye lens 58 again at different angles respectively by the aid of the lens 52, the vibration mirror 54, and the lens 56. The light beam outgoing from the second fly's eye lens 58 is shaped into a predetermined illumination light beam by the aid of any one of aperture diaphragms provided in the revolver 61 (this process will be described in detail later on), it thereafter passes through the lens 60, and it arrives at the fixed blind 62 installed at a position conjugate to the reticle R. At this position, the light beam is defined to have a predetermined cross-sectional configuration, and it passes through the movable blind 64 disposed at a position slightly de-focused from the conjugate plane of the reticle R. The light beam passes through the relay lenses 66, 68, and it is used as a uniform illumination light beam to illuminate a predetermined shape, i.e., a rectangular slit-shaped illumination area IA (see FIG. 2) on the reticle R defined by the fixed blind 62.

The revolver 61 is arranged in the vicinity of a radiating surface of the second fly's eye lens 58, i.e., in the vicinity of a Fourier transformation plane for the reticle R. The spatial coherency of the illumination light beam for illuminating the reticle R is controlled by using any of the aperture diaphragms 59 (which will be described in detail later on) of the revolver 61. In general, the spatial coherency is represented by a coherence factor ($\sigma$ value) which is a ratio between the numerical aperture of the projection optical system PL and the numerical aperture of the illumination optical system.

Figure 7:
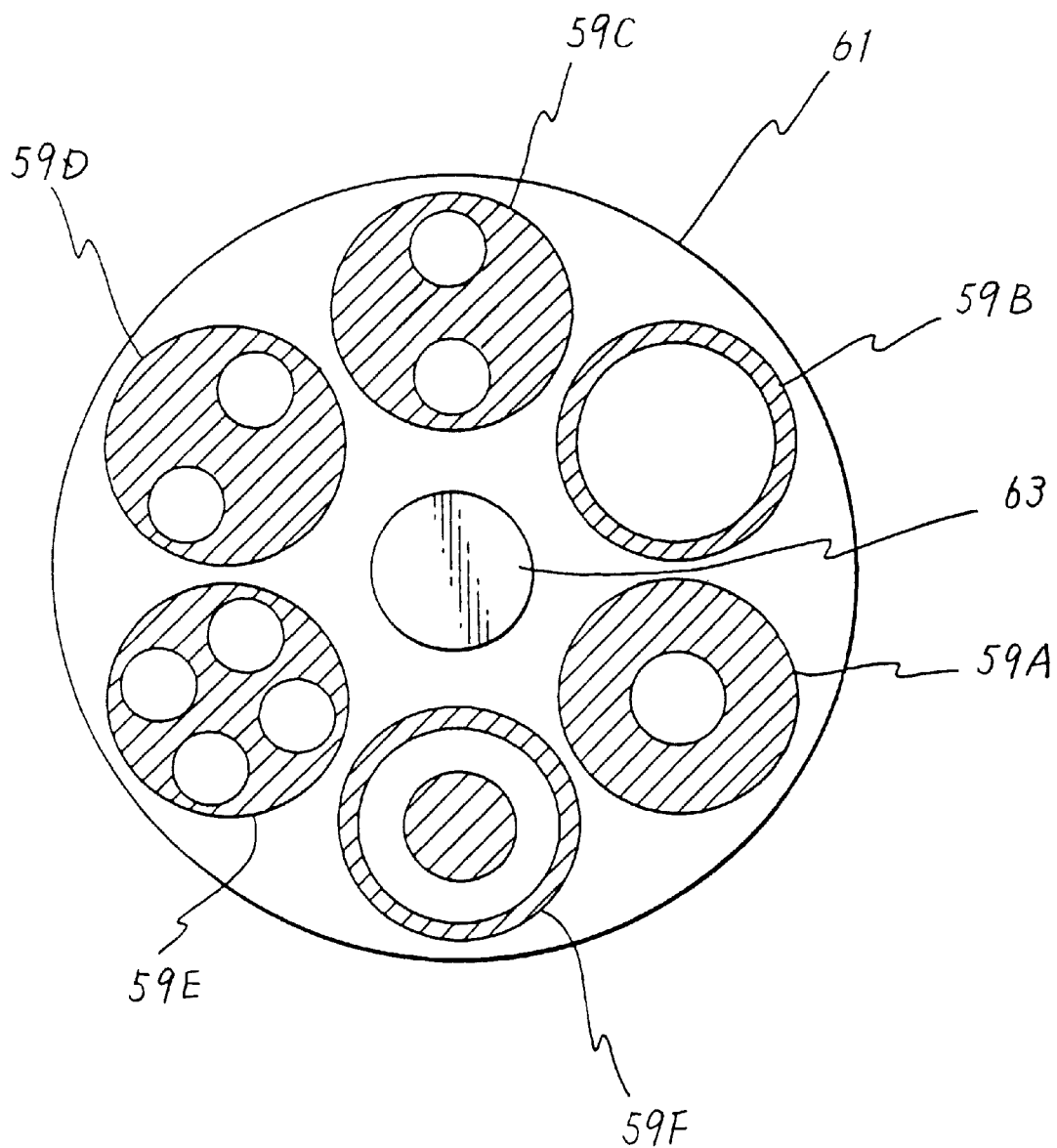
FIG. 7 shows an example of an aperture diaphragm plate of an illumination system.

As shown in a magnified illustration in FIG. 7, the revolver 61 is provided with a plurality of types (six types in this embodiment) of aperture diaphragms 59 (59A to 59F) which are arranged at a spacing distance corresponding to an equal angle. The revolver 61 is constructed to be rotatable by the aid of a revolver-driving mechanism 63 comprising a rotary motor. The angle of rotation of the revolver 61 is controlled by the main control unit 90 by the aid of the revolver-driving mechanism 63. Thus, a desired aperture diaphragm of the aperture diaphragms 59A to 59F is selectively set on the optical path of the illumination light beam.

The aperture diaphragms 59A to 59F will now be briefly explained. The aperture diaphragm 59A is composed of a small circular aperture, and it functions as an aperture diaphragm to decrease the a value as the coherence factor (hereinafter referred to as "small $\sigma$ diaphragm"). The aperture diaphragm 59B is an aperture diaphragm for ordinary illumination composed of a circular aperture (hereinafter referred to as "ordinary diaphragm"). The aperture diaphragms 59C, 59D, 59E are modified aperture diaphragms for modified illumination each comprising a plurality of apertures arranged in an eccentric manner. Among them, the aperture diaphragms 59C, 59D will be hereinafter referred to as "two-opening diaphragm" (in each of the aperture diaphragms 59C, 59D, the line formed by connecting the two openings is in a relationship of mutual orthogonality (90°) with respect to the transmitted light beam). The aperture diaphragm 59E of the illumination system will be hereinafter referred to as "four-opening diaphragm". The remaining aperture diaphragm 59F is an aperture diaphragm of the illumination system for zonal illumination, in which the zonal ratio (ratio between the diameter of the central shielding section and the outer diameter of the circumferential transmitting section) is, for example, ½ in this embodiment.

As described above, the revolver 61 is arranged on the Fourier transformation plane for the pattern formation plane on the reticle R, or in the vicinity thereof. The revolver 61 restricts the secondary light source image (surface light source image) coming from the second fly's eye lens 58.

Next, the control system will be explained with reference to FIG. 1. The control system centers the main control unit 90 as a control device or a control system for controlling and supervising the entire apparatus, and it comprises, for example, the exposure amount control unit 70 and the stage control unit 38 which are under the control of the main control unit 90.

Explanation will now be made mainly for the operations of the respective constitutive components of the control system as well as the operation of the projection exposure apparatus 10 according to the embodiment of the present invention during the exposure.

Prior to the start of the synchronized scanning for the reticle R and the wafer (W1 or W2), the exposure amount control unit 70 instructs a shutter-driving unit 72 to drive a shutter-driving unit 74 so that the shutter 42 is opened.

After that, the stage control unit 38 starts synchronized scanning (scan control) for the reticle R and the wafer (W1 or W2), i.e., the reticle stage RST and the wafer stage (WS1 or WS2) in accordance with the instruction given by the main control unit 90. The synchronized scanning is performed by controlling the respective linear motors for constructing the reticle-driving unit 30 and the driving system for the wafer stages by using the stage control unit 38 while monitoring the measured values obtained by the length-measuring axis BI3Y and the length-measuring axis BI1X or BI2X of the interferometer system and the length-measuring axes BI7Y, BI8Y and the length-measuring axis BI6X of the reticle interferometer system.

At the point of time at which the both stages have been subjected to constant velocity control within a predetermined allowable range, the exposure amount control unit 70 instructs a laser control unit 76 to start pulse light emission. Accordingly, the rectangular illumination area IA on the reticle R, on which a pattern is chromium vapor-deposited on its lower surface, is illuminated with the illumination light beam emitted from the illumination system and transmitted through the aperture diaphragm 59 of the illumination system. The light beam is diffracted by the pattern formed on the reticle R, and it comes into the projection optical system PL. The projection optical system PL has its pupil plane EP which is arranged in a mutually conjugate positional relationship with respect to the secondary light source surface, giving a positional relationship of Fourier transformation with respect to the pattern formation plane on the reticle R. As described above, the diffracted light beam passes through the pupil plane EP of the projection optical system PL after being transmitted through the aperture diaphragm 59 of the illumination system and being diffracted by the pattern on the reticle R. The diffracted light beam forms an image on the resist layer on the wafer placed in the mutually conjugate positional relationship with respect to the reticle R. In this embodiment, as also clarified from FIG. 2, the slit width of the illumination area IA in the scanning direction is narrow as compared with the pattern area on the reticle. The image of the entire surface of the pattern is successively formed on the shot area on the wafer by performing synchronized scanning for the reticle R and the wafer (W1 or W2) as described above.

The image of the pattern formed on the reticle R illuminated with the illumination light beam as described above is projected onto the wafer W placed on the wafer stage WST at a predetermined projection magnification (for example, ¼-fold, ⅕-fold, or ⅙-fold) by the aid of the projection optical system PL. Thus, a reduced image of the pattern is formed in a predetermined area on the wafer W.

Simultaneously with the start of the pulse light emission described above, the exposure amount control unit 70 instructs a mirror-driving unit 78 to vibrate the vibration mirror 54 so that the vibration of the vibration mirror is continuously performed until the pattern area on the reticle R completely passes over the illumination area IA (see FIG. 2), i.e., until the image on the entire surface of the pattern is formed on the shot area on the wafer. Thus, the non-uniformity of interference fringe is reduced, which would be otherwise produced on account of the two fly's eye lenses 50, 58. The structure and the control method of the vibration mirror are disclosed in U.S. Pat. No. 5,591,958, the content of which is incorporated herein by reference.

The movable blind 64 is driven and controlled by the blind control unit 39 in synchronization with the scanning for the reticle R and the wafer W so that the illumination light does not leak out to the outside of the shielding area on the reticle at the shot edge portion during the scanning exposure. The series of synchronized operations are managed by the stage control unit 38.

In relation to the pulse light emission effected by the laser control unit 76 described above, it is necessary to emit light n times (n is a positive integer) during a period in which an arbitrary point on the wafer W1, W2 passes over the width (w) of the illumination field. Therefore, it is necessary to satisfy the following expression (2) provided that the oscillation frequency is f, and the wafer scanning velocity is V. The control of the pulse light emission is disclosed in U.S. Pat. No. 5,591,958, the content of which is incorporated herein by reference.

$$f/n = V/w \quad (2)$$

Further, it is necessary to satisfy the following expression (3) provided that the radiation energy of one pulse radiated onto the wafer is P, and the resist sensitivity is E.

$$nP = E \quad (3)$$

As described above, the exposure amount control unit 70 is constructed such that computing operation is performed for all variable quantities of the radiation energy P and the oscillation frequency f to give a command to the laser control unit 76 so that the light-reducing system provided in the light source unit 40 is controlled. Thus, the radiation energy P and the oscillation frequency f are varied, and the shutter-driving unit 72 and the mirror-driving unit 78 are controlled.

Further, for example, when correction is made for the movement start positions (synchronization positions) of the reticle stage and the wafer stage to be subjected to the synchronized scanning during the scanning exposure, the main control unit 90 instructs the stage control unit 38 which controls the movement of the respective stages to make correction for the stage position corresponding to an amount of correction.

The projection exposure apparatus according to the embodiment of the present invention further comprises a first transport system for performing wafer exchange between itself and the wafer stage WS1, and a second transport system for performing wafer exchange between itself and the wafer stage WS2.

Figure 8:
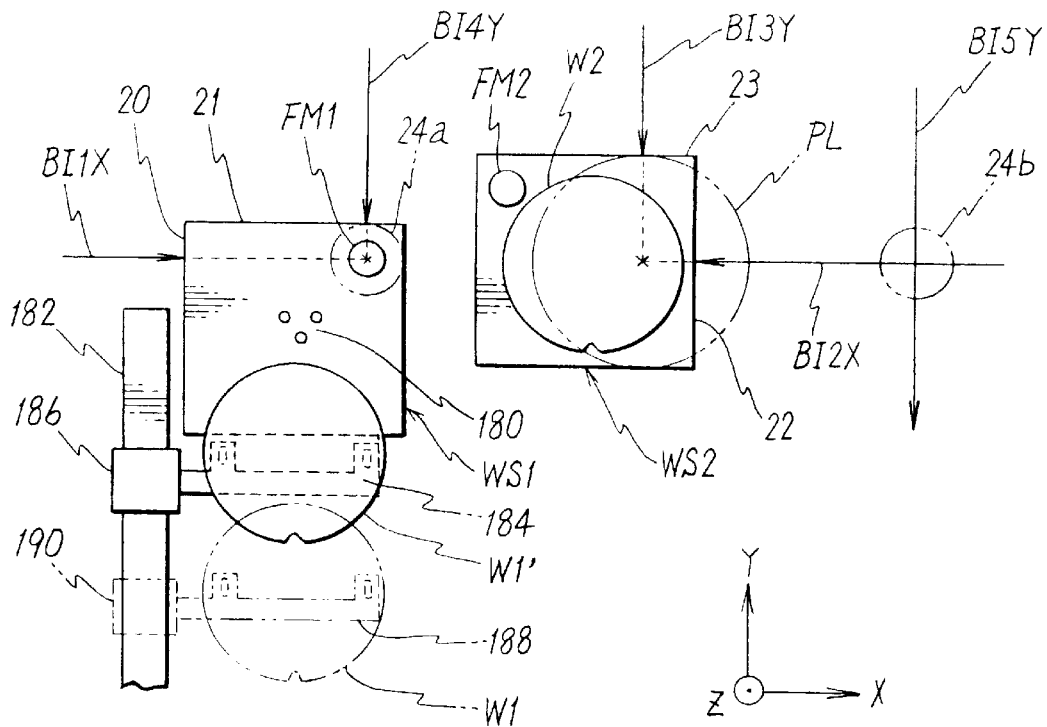
FIG. 8 shows a plan view illustrating the state in which the wafer exchange/alignment sequence and the exposure sequence are executed by using the two wafer stages.

As shown in FIG. 8, the first transport system performs wafer exchange as described later on between itself and the wafer stage WS1 disposed at a wafer loading position on the left side. The first transport system comprises a first wafer loader including, for example, a first loading guide 182 which extends in the Y axis direction, first and second sliders 186, 190 which are movable along the loading guide 182, a first unload arm 184 which is attached to the first slider 186, and a first load arm 188 which is attached to the second slider 190, and a first center-up 180 including three vertically movable members provided on the wafer stage WS1.

The operation of wafer exchange effected by the first transport system will now be briefly explained.

As shown in FIG. 8, explanation will be made for a case in which the wafer W1' placed on the wafer stage WS1 disposed at the wafer loading position on the left side is exchanged with the wafer W1 transported by the first wafer loader.

At first, the main control unit 90 is operated to turn-off vacuum attraction effected by the unillustrated wafer holder on the wafer stage WS1 by the aid of an unillustrated switch so that attraction for the wafer W1' is de-energized.

Next, the main control unit 90 is operated to drive and raise the center-up 180 by a predetermined amount by the aid of an unillustrated center-up-driving system. Accordingly, the wafer W1' is lifted up to a predetermined position. In this state, the main control unit 90 instructs an unillustrated wafer loader control unit to move the first unload arm 184. Accordingly, the first slider 186 is driven and controlled by the wafer loader control unit. The first unload arm 184 is moved to a position over the wafer stage WS1 along the loading guide 182, and it is located at the position just under the wafer W1'.

In this state, the main control unit 90 is operated to downwardly drive the center-up 180 to a predetermined position. During the downward movement of the center-up 180, the wafer W1' is transmitted to and received by the first unload arm 184. Therefore, the main control unit 90 instructs the wafer loader control unit to start vacuum attraction for the first unload arm 184. Accordingly, the wafer W1' is attracted and held by the first unload arm 184.

Next, the main control unit 90 instructs the wafer loader control unit to start retraction of the first unload arm 184 and movement of the first load arm 188. Accordingly, the first unload arm 184 starts movement in the −Y direction in FIG. 10 integrally with the first slider 186, simultaneously with which the second slider 190 starts movement in the +Y direction integrally with the first load arm 188 which holds the wafer W1. When the first load arm 188 arrives at a position over the wafer stage WS1, the wafer loader control unit stops movement of the second slider 190, and the vacuum attraction for the first load arm 188 is de-energized.

In this state, the main control unit 90 is operated to upwardly drive the center-up 180. Thus, the underlying center-up 180 is allowed to lift up the wafer W1. Next, the main control unit 90 instructs the wafer loader control unit to retract the load arm. Accordingly, the second slider 190 starts movement in the −Y direction integrally with the first load arm 188, and the first load arm 188 is retracted. Simultaneously with the start of retraction of the first load arm 188, the main control unit 90 starts downward driving for the center-up 180. Thus, the wafer W1 is placed on the unillustrated wafer holder on the wafer stage WS1, and vacuum attraction effected by the wafer holder is turned on. Accordingly, a series of sequence for wafer exchange is completed.

Figure 9:
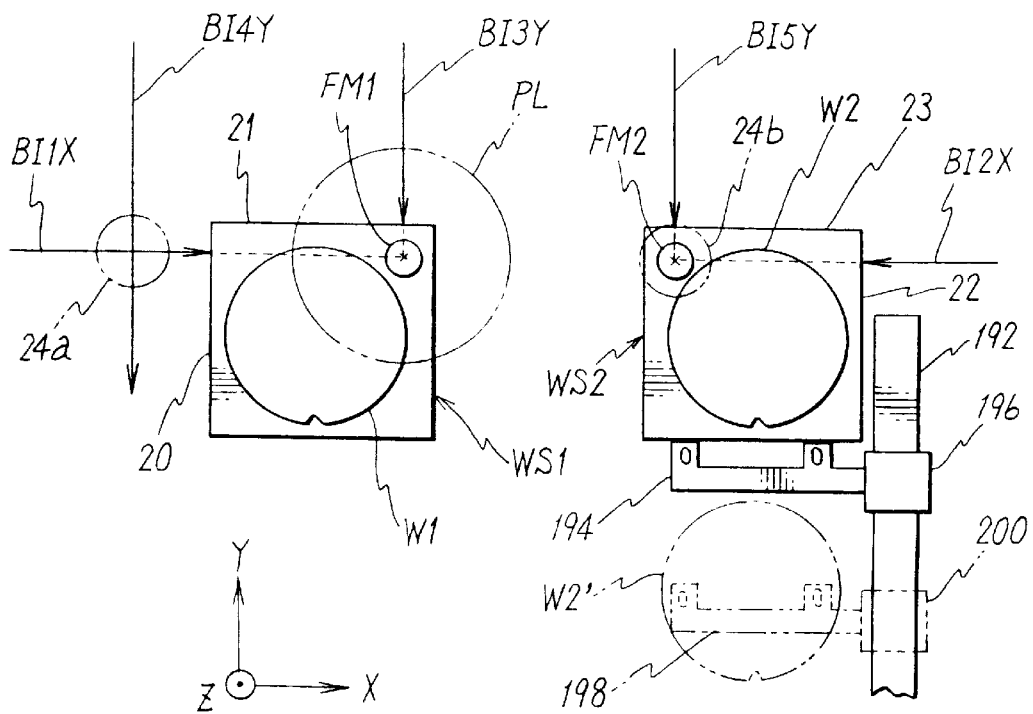
FIG. 9 shows the state obtained after the change between the wafer exchange/alignment sequence and the exposure sequence shown in FIG. 8.

Similarly, as shown in FIG. 9, a second transport system performs wafer exchange in the same manner as described above between itself and the wafer stage WS2 disposed at a wafer loading position on the right side. The second transport system comprises a second wafer loader including, for example, a second loading guide 192 which extends in the Y axis direction, third and fourth sliders 196, 200 which are movable along the second loading guide 192, a second unload arm 194 which is attached to the third slider 196, and a second load arm 198 which is attached to the fourth slider 200, and an unillustrated second center-up provided on the wafer stage WS2.

Next, explanation will be made with reference to FIGS. 8 and 9 for the concurrent or parallel process based on the use of the two wafer stages, which is the feature of the first embodiment of the present invention.

FIG. 8 shows a plan view of a state in which the wafer is exchanged between the wafer stage WS1 and the first transport system as described above at the left loading position, during the period in which the exposure operation is performed for the wafer W2 on the wafer stage WS2 by the aid of the projection optical system PL. In this process, after performing the wafer exchange, the alignment operation is continuously performed on the wafer stage WS1 as described later on. In FIG. 8, the position of the wafer stage WS2 during the exposure operation is controlled on the basis of measured values obtained by using the length-measuring axes BI2X, BI3Y of the interferometer system. The position of the wafer stage WS1, on which the wafer exchange and the alignment operation are performed, is controlled on the basis of measured values obtained by using the length-measuring axes BI1X, BI4Y of the interferometer system.

At the left loading position shown in FIG. 8, the arrangement is made such that the reference mark on the fiducial mark plate FM1 of the wafer stage WS1 is disposed just under the alignment system 24a. Accordingly, the main control unit 90 carries out reset for the interferometer having the length-measuring axis BI4Y of the interferometer system prior to the measurement of the reference mark on the fiducial mark plate FM1, performed by using the alignment system 24a.

Search alignment is performed continuously after the wafer exchange and the reset for the interferometer described above. The search alignment, which is performed after the wafer exchange, is pre-alignment performed again on the wafer stage WS1, because the positional error is large if pre-alignment is performed during only the period of transport of the wafer W1. Specifically, positions of three search alignment marks (not shown), which are formed on the wafer W1 placed on the stage WS1, are measured by using, for example, the sensor of the LSA system of the alignment system 24a. Positional adjustment is performed for the wafer W1 in the X, Y, θ directions on the basis of obtained results of the measurement. During the search alignment, the operations of the respective components are controlled by the main control unit 90.

After completion of the search alignment, fine alignment is performed to determine the arrangement of the respective shot areas on the wafer W1 by using EGA in this embodiment. The method of EGA is disclosed in U.S. Pat. No. 4,780,617, the content of which is incorporated herein by reference. Specifically, positions of the alignment marks of predetermined sample shots on the wafer W1 are measured by using, for example, the sensor of the FIA system of the alignment system 24a while successively moving the wafer stage WS1 on the basis of designed shot array data (data on alignment mark positions), while managing the position of the wafer stage WS1 by using the interferometer system (length-measuring axes BI1X, BI4Y). All shot array data are computed in accordance with statistical operation based on the least square method on the basis of obtained results of the measurement and the designed coordinate data on the shot array. During the process of EGA, the operations of the respective components are controlled by the main control unit 90. The computing operation described above is performed by the main control unit 90. It is desirable that results of the computing operation are converted into those based on the coordinate system on the basis of the reference mark position of the fiducial mark plate FM1.

As described above, in the case of the embodiment of the present invention, the position of the alignment mark is measured while executing autofocus/autoleveling based on the measurement and control effected by the AF/AL system 132 (see FIG. 4) in the same manner as performed during the exposure, during the measurement performed by the alignment system 24a. Thus, it is possible to avoid occurrence of any offset (error) which would be otherwise caused between the process of alignment and the process of exposure, due to the posture of the stage.

Figure 10:
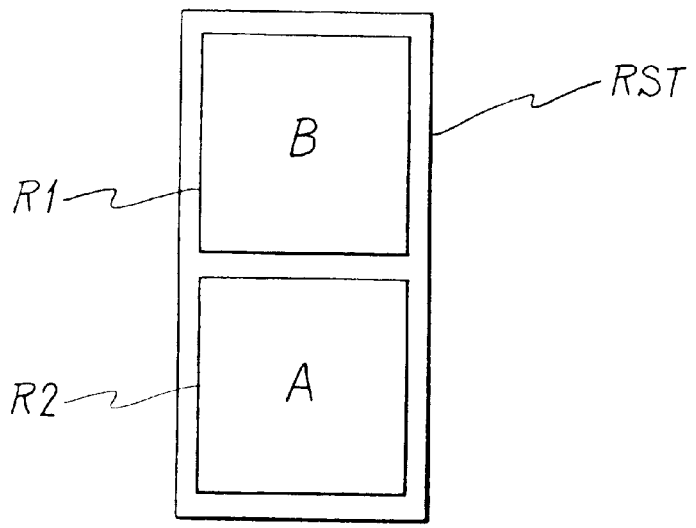
FIG. 10 shows the reticle stage for the double exposure for holding the two reticles.

During the period in which the wafer exchange and the alignment operation are performed for the wafer stage WS1 as described above, double exposure is performed for the wafer stage WS2 in a continuous manner in accordance with the step-and-scan system while changing the exposure condition by using two reticles R1, R2 as shown in FIG. 10.

Figure 11A:
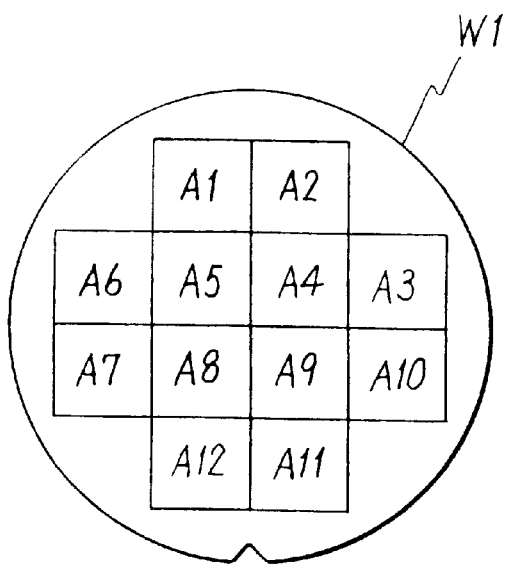
FIG. 11A shows the state in which the wafer is exposed by using the reticle having the pattern A shown in FIG. 10.
Figure 11B:
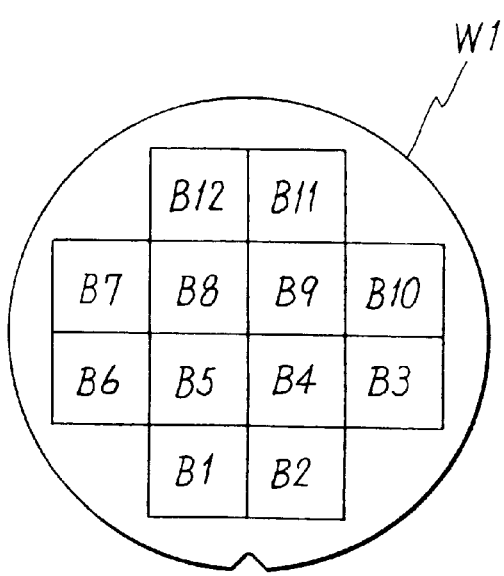
FIG. 11B shows the state in which the wafer is exposed by using the reticle having the pattern B shown in FIG. 10.

Specifically, fine alignment based on EGA is previously performed in the same manner as performed for the wafer W1. The shot areas on the wafer W2 are successively moved to the position under the optical axis of the projection optical system PL, on the basis of resultant shot array data on the wafer W2 obtained by the fine alignment (based on the reference mark on the fiducial mark plate FM2 as a reference). After that, every time when each of the shot areas is exposed, the reticle stage RST and the wafer stage WS2 are subjected to synchronized scanning in the scanning direction. Thus, the scanning exposure is performed. The exposure for all of the shot areas on the wafer W2 as described above is also continuously performed after the reticle exchange. Specifically, the exposure procedure of the double exposure proceeds in the following order as shown in FIG. 11(A). That is, the respective shot areas on the wafer W1 are successively subjected to scanning exposure from A1 to A12 by using the reticle R2 (pattern A). After that, the reticle stage RST is moved in a predetermined amount in the scanning direction by using the driving system 30 to set the reticle R1 (pattern B) at the exposure position. Thereafter, scanning exposure is performed in an order from B1 to B12 as shown in FIG. 11(B). In this procedure, the exposure condition (AF/AL, exposure amount) and the transmittance differ between the reticle R2 and the reticle R1. Therefore, it is necessary that the respective conditions are measured during the reticle alignment, and the conditions are changed depending on obtained results.

The operations of the respective components during the double exposure for the wafer W2 are also controlled by the main control unit 90. Specified method (embodiment) of the double exposure as well as its principle will be described in detail later on.

The exposure sequence and the wafer exchange/alignment sequence are concurrently performed in parallel on the two wafer stages WS1, WS2 shown in FIG. 8 described above. In this process, the wafer stage of the two wafer stages WS1, WS2, on which the operation has been firstly completed, takes a waiting state. At the point of time at which the operations for the both have been completed, the wafer stages WS1, WS2 are controlled and moved to the positions shown in FIG. 9 respectively. The wafer W2 on the wafer stage WS2, for which the exposure sequence has been completed, is subjected to wafer exchange at the right loading position. The wafer W1 on the wafer stage WS1, for which the alignment sequence has been completed, is subjected to the exposure sequence under the projection optical system PL.

The arrangement is made at the right loading position shown in FIG. 9 so that the reference mark on the fiducial mark plate FM2 comes under the alignment system 24b in the same manner as operated for the left loading position. The wafer exchange operation and the alignment sequence are executed as described above. Of course, the reset operation for the interferometer having the length-measuring axis BI5Y of the interferometer system has been executed prior to the detection of the mark on the fiducial mark plate FM2 effected by the alignment system 24b.

Next, explanation will be made for the reset operation for the interferometer, performed by the main control unit 90 during the change from the state shown in FIG. 8 to the state shown in FIG. 9.

After the alignment is performed at the left loading position, the wafer stage WS1 is moved to the position at which the reference mark on the fiducial plate FM1 comes just under the center (projection center) of the optical axis AX of the projection optical system PL shown in FIG. 9. During this movement, the interferometer beam for the length-measuring axis BI4Y does not comes into the reflective surface 21 of the wafer stage WS1. Therefore, it is difficult to move the wafer stage to the position shown in FIG. 9 immediately after completion of the alignment. For this reason, in the embodiment of the present invention, the following artifice is conceived.

That is, as explained above, the embodiment of the present invention lies in the setting in which the fiducial mark plate FM1 comes just under the alignment system 24a when the wafer stage WS1 is disposed at the left loading position. The interferometer having the length-measuring axis BI4Y is reset at this position. Therefore, the wafer stage WS1 is once returned to this position. The wafer stage WS1 is moved from the position rightwardly in the X axis direction by a distance BL while monitoring the measured value obtained by using the interferometer 16 having the length-measuring axis BI1X for which the interferometer beam is not intercepted, on the basis of the previously known distance (conveniently referred to as "BL") between the detection center of the alignment system 24a and the center (projection center) of the optical axis of the projection optical system PL. Accordingly, the wafer stage WS1 is moved to the position shown in FIG. 9. The main control unit 90 resets the interferometer having the length-measuring axis BI3Y prior to the measurement of the relative positional relationship between the mark on the fiducial mark plate FM1 and the reticle mark, by using at least one of the reticle alignment microscopes 142, 144. This reset operation can be executed at the point of time at which the length-measuring axis to be used next is available to radiate the side surface of the wafer stage.

The reason why the highly accurate alignment can be performed even when the reset operation is performed for the interferometer as described above is as follows. That is, the spacing distance between the reference mark and the imaginary position calculated in accordance with the measurement of the wafer mark is calculated by using the identical sensor by measuring the reference mark on the fiducial mark plate FM1 by means of the alignment system 24a, and then measuring the alignment mark on each of the shot areas on the wafer W1. At this point of time, the relative distance between the reference mark and the position to be subjected to exposure is determined. Accordingly, if the correspondence between the exposure position and the reference mark position is established before the exposure by using the reticle alignment microscopes 142, 144, it is possible to perform the highly accurate exposure operation by adding the relative distance to the obtained value, even when the interferometer beam for the interferometer in the Y axis direction is intercepted during the movement of the wafer stage, and the reset is performed again.

When the length-measuring axis BI4Y is not intercepted during the period of movement of the wafer stage WS1 from the alignment completion position to the position shown in FIG. 9, it is a matter of course that the wafer stage may be linearly moved to the position shown in FIG. 9 immediately after completion of the alignment while monitoring the measured values obtained by using the length-measuring axes BIX, BI4Y. In this case, it is preferable to perform the reset operation for the interferometer at the point of time at which the length-measuring axis BI3Y passing through the optical axis AX of the projection optical system PL overlaps the reflective surface 21 of the wafer stage WS1 perpendicular to the Y axis.

The wafer stage WS2 may be moved from the exposure completion position to the right loading position shown in FIG. 9 in the same manner as described above to perform the reset operation for the interferometer having the length-measuring axis BI5Y.

Figure 12:
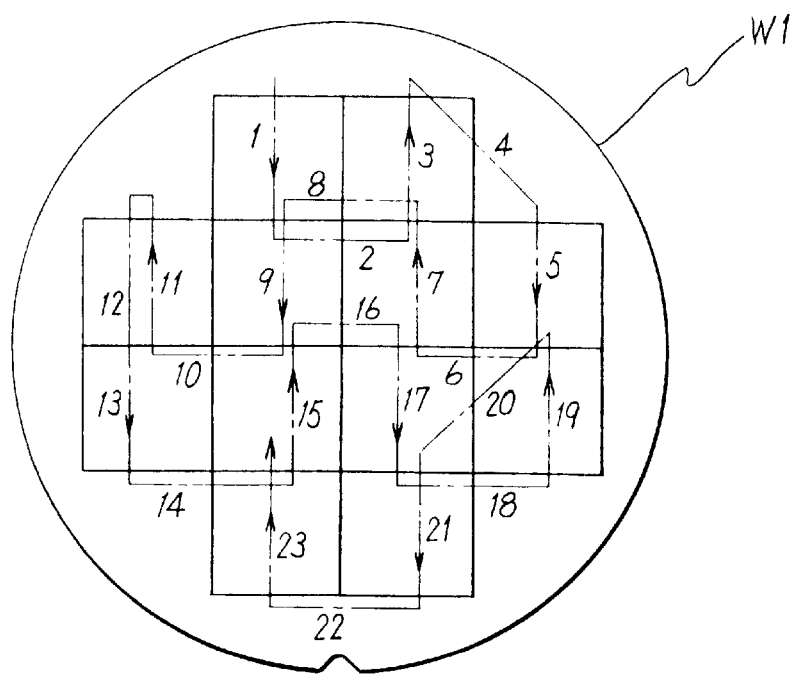
FIG. 12 shows the order of exposure for each of the respective shot areas on the wafer held on one of the two wafer stages.
Figure 13:
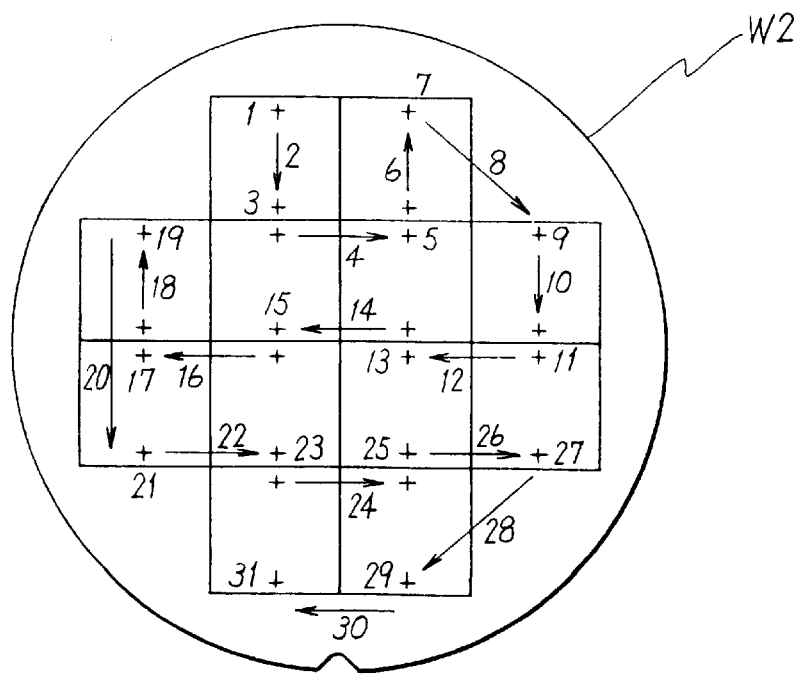
FIG. 13 shows the order of mark detection for each of the respective shot areas on the wafer held on the other of the two wafer stages.

Alternatively, FIG. 12 shows an example of the timing of the exposure sequence for successively exposing the respective shot areas on the wafer W1 held on the wafer stage WS1. FIG. 13 shows the timing of the alignment sequence for the wafer W2 held on the wafer stage WS2, performed concurrently in parallel thereto. In the first embodiment of the present invention, the exposure sequence and the wafer exchange/alignment sequence are concurrently performed in parallel to one another for the wafers W1, W2 held on the respective wafer stages while independently moving the two wafer stages WS1, WS2 in the two-dimensional direction so that the throughput is improved.

However, when the two operations are dealt with concurrently in parallel to one another by using the two wafer stages, the operation performed on one of the stages affects, as a disturbance factor, the operation performed on the other wafer stage in some cases. On the contrary, some of the operations performed on one of the wafer stages do not affect the operations performed on the other wafer stage. Thus, in the first embodiment of the present invention, the operations performed concurrently in parallel are divided into the operations which correspond to the disturbance factor, and the operations which do not correspond to the disturbance factor. Further, the timings of the respective operations are adjusted so that the operations which correspond to the disturbance factor are mutually performed simultaneously, or the operations which do not correspond to the disturbance factor are mutually performed simultaneously.

For example, during the scanning exposure, the synchronized scanning for the wafer W1 and the reticle R is performed at constant velocities, in which no disturbance factor is included. Further, it is necessary to exclude any external disturbance factor as less as possible. Therefore, during the scanning exposure performed on one of the wafer stages WS1, the timing is adjusted to give a stationary state in the alignment sequence effected for the wafer W2 on the other wafer stage WS2. That is, the measurement of the mark in the alignment sequence is performed in a state in which the wafer stage WS2 is allowed to stand still at the mark position. Therefore, the measurement of the mark is not the disturbance factor for the scanning exposure. Thus, it is possible to perform the measurement of the mark concurrently with the scanning exposure in parallel. In this context, with reference to FIGS. 12 and 13, it is understood that the scanning exposure effected for the wafer W1 indicated by the operation numbers of "1, 3, 5, 7, 9, 11, 13, 15, 17, 19, 21, 23" shown in FIG. 12 is performed in a mutually synchronized manner with respect to the mark measurement operation effected at the respective alignment mark positions for the wafer W2 indicated by the operation numbers of "1, 3, 5, 7, 9, 11, 13, 15, 17, 19, 21, 23" shown in FIG. 13. On the other hand, in the case of the alignment sequence, the constant velocity movement is also performed during the scanning exposure. Therefore, no disturbance occurs, and it is possible to perform the measurement highly accurately.

The same situation as that described above is also considered for the wafer exchange. Especially, for example, any vibration, which is generated when the wafer is transmitted from the load arm to the center-up, may serve as a disturbance factor. Therefore, the wafer may be transmitted in conformity with acceleration or deceleration (which may serve as a disturbance factor) before or after the synchronized scanning is performed at a constant velocity.

The timing adjustment described above is performed by using the main control unit 90.

Next, a specified method of the double exposure performed in the first embodiment of the present invention will be explained. At first, explanation will be made for the basic principle of the modified illumination adopted in the first and second exposure steps in the exposure method, on the basis of FIGS. 14 and 15. The basic principle is equivalent to one described in Japanese Laid-Open Patent Publication No. 4-273245 and U.S. Pat. No. 5,638,211. The content of U.S. Pat. No. 5,638,211 is incorporated herein by reference.

Figure 14A:
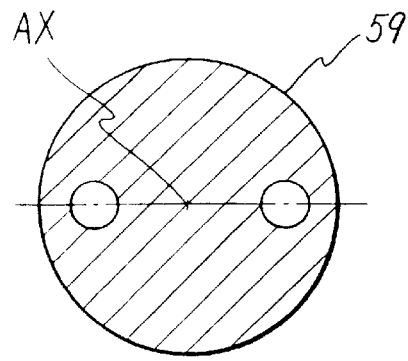
FIG. 14A shows an aperture diaphragm to be used for the double exposure performed in the first embodiment.
Figure 14B:
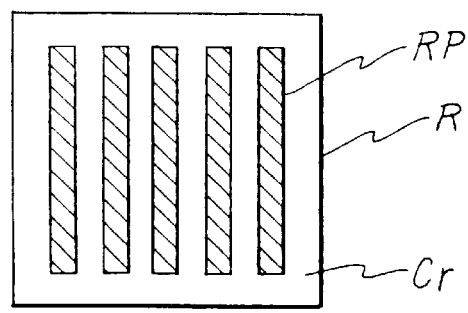
FIG. 14B shows a reticle pattern to be used for the double exposure performed in the first embodiment.
Figure 15:
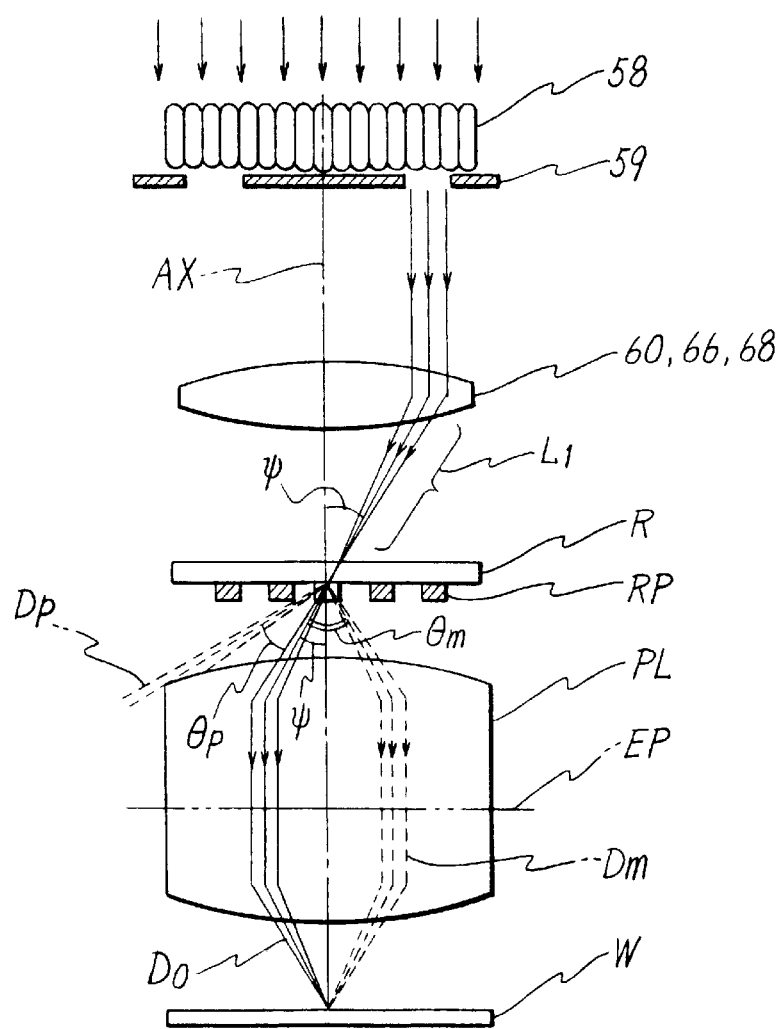
FIG. 15 shows a schematic arrangement of the projection exposure apparatus for explaining the basic principle of the double exposure performed in the first embodiment.

For example, the circuit pattern formed on the reticle R contains a lot of line patterns (L/S's and isolated lines) as shown in FIG. 14(B). The patterns are directed in a plurality of directions. Especially, when a reticle pattern RP, which comprises isolated lines (isolated L's) and L/S's formed in a predetermined direction, is irradiated with the illumination light beam radiated from the illumination optical system, a 0-order diffracted light component ($D_0$), ±1-order diffracted light components ($D_p$, $D_m$), and higher-order diffracted light components are generated from the reticle pattern RP in directions corresponding to the periodicity of the pattern. This situation is shown in FIG. 15. As shown in FIG. 15, the aperture diaphragm 59, which is provided in the revolver 61, is arranged in the plane substantially corresponding to one obtained by Fourier transformation for the pattern plane of the reticle R formed with the reticle pattern RP thereon, or in the plane in the vicinity thereof. The secondary light source image coming from the fly's eye lens 58 is restricted in accordance with the predetermined shape of the aperture by the aid of the aperture diaphragm 59. As for the aperture diaphragm, this process uses an aperture diaphragm having a shape for transmitting the illumination light beam through two eccentric areas with their respective centers located at positions of point symmetry in relation to the optical axis AX (shape equivalent to the two-opening diaphragm 59C or 59D described above) as shown in FIG. 14(A). In this case, the illumination light beam, which has passed through the aperture diaphragm 59, is transmitted through the lens system 60, 66, 68 as shown in FIG. 15, and then it comes into the reticle R while being inclined by a predetermined angle with respect to the periodic direction of the reticle pattern RP. Therefore, it is possible to allow the diffracted light components of the respective degrees or orders generated from the reticle pattern RP to have a certain inclination (angular deviation). It is assumed that the illumination light beam L1 shown in FIG. 15 comes into the reticle R while being inclined by an angle $\psi$ with respect to the optical axis AX.

Accordingly, those generated from the reticle pattern RP include the 0-order diffracted light beam $D_0$ which advances in the direction inclined by $\psi$ with respect to the optical axis AX, the +1-order diffracted light beam $D_p$ which is inclined by $\theta_p$ with respect to the 0-order diffracted light beam $D_0$, and the −1-order diffracted light beam $D_m$ which advances while being inclined by $\theta_m$ with respect to the 0-order diffracted light beam $D_0$. Therefore, the +1-order diffracted light beam $D_p$ advances in a direction of ($\theta_p+\psi$) with respect to the optical axis AX, and the −1-order diffracted light beam $D_m$ advances in a direction of ($\theta_m-\psi$) with respect to the optical axis AX. In this process, the angles of diffraction $\theta_p$, $\theta_m$ can be represented as follows provided that the exposure wavelength is $\lambda$, and the pattern pitch is P.

$$\sin(\theta_p+\psi)-\sin\psi=\lambda/P \tag{4}$$

$$\sin(\theta_m-\psi)-\sin\psi=\lambda/P \tag{5}$$

When the reticle pattern RP is made fine, and the angle of diffraction is increased, although the +1-order diffracted light beam DP and the −1-order diffracted light beam $D_m$ would be otherwise transmitted through the pupil EP of the projection optical system PL, the +1-order diffracted light beam $D_p$, which advances in the direction of ($\theta_p+\psi$), fails to be transmitted through the pupil EP of the projection optical system PL. That is, there is given a relationship of $\sin(\theta_p+\psi)>NA_R$ (numerical aperture on the side of the reticle). However, even in the case of the angle of diffraction at this time, the −1-order diffracted light beam $D_m$ is capable of coming into the projection optical system PL, because the illumination light beam L1 comes into the reticle R while being inclined with respect to the optical axis AX as described above. That is, there is given a relationship of $\sin(\theta_m-\psi)<NA_R$.

Therefore, interference fringes appear on the wafer W, which are caused by the two light beams of the 0-order diffracted light beam $D_0$ and the −1-order diffracted light beam $D_m$. The interference fringes reside in an image of the reticle pattern RP. At this time, the resolution limit is represented as follows.

$$\sin(\theta_m-\psi)=NA_R \tag{6}$$

Therefore, when the expression (6) is substituted with the expression (5), there is given $NA_R+\sin\psi=\lambda/P$ which is expanded as follows.

$$P=\lambda/(NA_R+\sin\psi) \tag{7}$$

This expression represents the pitch on the side of the reticle, of the minimum transferable pattern.

If sin ψ in the foregoing expression (7) is determined, for example, to be approximately 0.5×NA$_R$, the minimum pitch of the transferable pattern on the reticle is represented as follows.

$$P=\lambda/(NA_R+0.5NA_R)=2\lambda/3(NA_R) \qquad (8)$$

The spacing distance on the pupil plane between the 0-order diffracted light component and the −1-order diffracted light component in the periodic direction is proportional to the degree of fineness (spatial frequency) of the reticle pattern RP. The foregoing expression (6) means that the spacing distance is maximized in order to obtain the maximum resolution. On the contrary, in the case of the conventional exposure apparatus in which the illumination light beam is distributed on the pupil EP in a circular area centered about the optical axis AX of the projection optical system PL, the resolution limit is given by P≈λ/NA$_R$. Therefore, when this expression is compared with the expression (8), it is understood that the higher resolution can be realized.

Next, explanation will be made below for the fact that the depth of focus can be increased by irradiating the reticle pattern RP with the exposure light beam inclined by the predetermined angle in the periodic direction so that the image formation pattern is formed on the wafer by using the 0-order diffracted light component and the 1-order diffracted light component generated as a result thereof. As shown in FIG. 15, when the position of the wafer W is coincident with the position of focus (best image formation plane) of the projection optical system PL, all of the respective diffracted light beams, which go out of one point in the reticle pattern RP and arrive at one point on the wafer W, can have an equal optical path length, regardless of the portions of the projection optical system PL through which the diffracted light beams pass. Accordingly, even when the 0-order diffracted light component approximately penetrates through the center (the vicinity of the optical axis) of the pupil plane EP of the projection optical system PL as in the conventional technique, the mutual wave front aberration is zero, because the optical path length of the 0-order diffracted light component is equal to those of other diffracted light components. However, in the case of a defocus state in which the position of the wafer W is not precisely coincident with the position of focus of the projection optical system PL, then the optical path length of a higher-order diffracted light beam which comes obliquely is shorter than that of the 0-order diffracted light beam which passes through the vicinity of the optical axis in front of the focal point (at a position far from the projection optical system PL), and the former is longer than the latter at the back of the focal point (at a position near to the projection optical system PL). The difference therebetween corresponds to a difference between angles of incidence. Therefore, the respective diffracted light beams of 0-order, 1-order, and higher-orders mutually form the wave front aberration, resulting in occurrence of fuzziness in front of or at the back of the position of focus.

The wave front aberration described above is an amount which is given by $\Delta F \cdot r^2/2$ provided that the amount of discrepancy of the wafer W from the position of focus is $\Delta F$, and the sine of the angle of incidence $\theta_m$ given when the respective diffracted light beams come into the wafer W is r (r=sin $\theta_m$), wherein r represents the distance from the optical axis AX on the pupil plane EP, of the respective diffracted light beams. In the case of the conventional projection exposure apparatus, there is given r (0-order)=0 because the 0-order diffracted light beam D$_0$ passes through the vicinity of the optical axis AX, while there is given r (1-order)=M·λ/P for the ±1-order diffracted light beams D$_p$, D$_m$ (M represents the magnification of the projection optical system). Therefore, the wave front aberration, which is caused by defocus of the 0-order diffracted light beam D$_0$ and the ±1-order diffracted light beams D$_p$, D$_m$, is given by $$\Delta F \cdot M^2 (\lambda/P)^2/2.$$

On the contrary, in the case of the modified illumination method adopted in the first embodiment of the present invention, the 0-order diffracted light component D$_0$ is generated in the direction inclined by the angle ψ from the optical axis AX, because the illumination light beam L1 comes into the reticle R while being inclined by the angle ψ with respect to the optical axis AX as shown in FIG. 15. The distance of the 0-order light component from the optical axis AX on the pupil plane EP is represented by r (0-order)= M·sin ψ. On the other hand, the distance from the optical axis on the pupil plane EP, of the −1-order diffracted light component D$_m$ is represented by r (−1-order)=M·sin($\theta_m$−ψ). At this time, if there is given sin ψ=sin($\theta_m$−ψ), the relative wave front aberration, which is caused by the defocus of the 0-order diffracted light component D$_0$ and the −1-order diffracted light component D$_m$ is zero. Even when the wafer W is slightly deviated in the optical axis direction from the position of focus, the image fuzziness of the reticle pattern RP is not caused so much as compared with the conventional technique. That is, the depth of focus is increased. Further, there is given sin($\theta_m$−ψ)+sin ψ=λ/P as shown in the expression (5) described above. Therefore, it is possible to greatly increase the depth of focus, if the angle of incidence ψ of the illumination light beam L1 into the reticle R has the following relation with respect to the pattern having the pitch P.

$$\sin \psi = \lambda/2P \qquad (9)$$

It is now assumed that the pattern formed on the reticle R is the reticle pattern RP as shown in FIG. 14(B), comprising the shielding section (Cr) and the transmitting sections (glass portions indicated by hatching in the drawing) in which the periodic direction is oriented in one direction. In this case, the relationship of the expression (9) is satisfied, and the aperture diaphragm 59 of the illumination system as shown in FIG. 14(A) is arranged in the plane substantially corresponding to one obtained by Fourier transformation for the pattern formation plane on the reticle R, or in the plane in the vicinity thereof so that the illumination light beam is transmitted therethrough. Thus, the illumination light beam L1 comes into the reticle R while being inclined by the predetermined angle with respect to the periodic direction of the reticle pattern RP. Accordingly, the 0-order diffracted light component D$_0$ and the −1-order diffracted light component D$_m$ can be distributed at an approximately identical distance with respect to the optical axis AX on the pupil plane EP of the projection exposure apparatus PL shown in FIG. 15. Therefore, it is possible to perform the exposure for the pattern at a high resolution and with a large depth of focus.

As described above, the illumination light beam is radiated while being inclined by the predetermined angle with respect to the periodic direction of the reticle pattern RP formed in the predetermined direction. Thus, the exposure for the pattern can be performed at the high resolution and with the large depth of focus. However, the resolution and the depth of focus can be improved in accordance with the method described above, at edge portions of the line pattern in the longitudinal direction perpendicular to the periodic direction. The pattern image is markedly deteriorated at both end edge portions of the line pattern in the longitudinal direction, because there is no illumination in the vertical direction or in the oblique direction for resolving the pattern at such portions. In the conventional technique, the zonal illumination has been relatively often used, because of the reason as described above. However, in the case of the zonal illumination, the complete two-beam interference is not obtained, in compensation for the absence of marked deterioration of the image which would be otherwise occur at the both end portions of the pattern. Therefore, the zonal illumination has had a certain limit to improve the resolution and the depth of focus, because of occurrence of the wave front aberration.

Accordingly, the first embodiment of the present invention adopts the following double exposure method.

Explanation will now be made for the double exposure method according to the first embodiment of the present invention, as being exemplified by a case in which an L/S pattern image shown in FIG. 18 is intended to be obtained.

In the first exposure step, the aperture diaphragm 59C is used, in which the amount of light in the plane substantially corresponding to one obtained by Fourier transformation for the pattern formation plane on the reticle R or in the plane in the vicinity thereof is distributed such that the light beam is transmitted through two areas having their centers at positions which are symmetrically eccentric from the optical axis center in the direction perpendicular to the periodic direction of the L/S pattern to be formed, and the other portion serves as a shielding area, as shown in FIG. 16(A). In the second exposure step, the aperture diaphragm 59D is used, in which the amount of light in the plane substantially corresponding to one obtained by Fourier transformation for the pattern formation plane on the reticle R or in the plane in the vicinity thereof is distributed such that the light beam is transmitted through two areas having their centers at positions which are symmetrically eccentric from the optical axis center in the direction perpendicular to the direction concerning FIG. 16(A), and the other portion serves as a shielding area, as shown in FIG. 17(A).

In the first exposure step, a reticle (hereinafter referred to as "reticle R1" for convenience for explanation) is used, which is formed with an L/S pattern RP1 similar to the pattern to be formed as shown in FIG. 16(B). In the second exposure step, a reticle (hereinafter referred to as "reticle R2" for convenience for explanation) is used, which is formed with a pattern RP2 comprising two isolated lines arranged and separated by a predetermined spacing distance in the direction perpendicular to the pattern to be formed as shown in FIG. 17(B). In FIGS. 16(B) and 17(B), hatched portions indicate transmitting sections composed of glass, and the other portions indicate shielding sections composed of Cr.

In this process, it is assumed that the reticles R1, R2 are carried on the reticle stage RST (see FIG. 2).

At first, in the first exposure step, the main control unit 90 is operated to control rotation of the revolver-driving mechanism 63 so that the aperture diaphragm 59C is set on the optical path of the illumination light beam. When the scanning exposure is performed by using the reticle R1 under this illumination condition, then the illumination light beams are transmitted through the respective apertures of the aperture diaphragm 59, and they pass through the lens system 60, 66, 68. The pattern plane on the reticle R1 is illuminated therewith respectively in the direction inclined by the predetermined angle (at the angle $\psi$ symmetrically in relation to the optical axis AX in this embodiment) with respect to the optical axis AX in the pitch direction of L/S of the reticle pattern RP1 (see FIG. 15). As a result, the reticle pattern RP1 is irradiated with the illumination light beam L1 transmitted through one of the apertures 59C1 of the aperture diaphragm 59C. Accordingly, in the same manner as in FIG. 15 explained above, the diffracted light beams are generated from the reticle pattern RP1, i.e., the 0-order diffracted light beam $D_{01}$ inclined by the angle $\psi$ with respect to the optical axis AX, and the ±1-order diffracted light beams $D_{p1}$, $D_{m1}$ resulting from diffraction. Similarly, the reticle pattern RP1 is irradiated with the illumination light beam transmitted through the other aperture 59C2 of the aperture diaphragm 59C. Accordingly, the diffracted light beams are generated from the reticle pattern RP1, i.e., the 0-order diffracted light beam $D_{02}$ inclined by the angle $\psi$ symmetrically to the 0-order diffracted light beam $D_{01}$ of the illumination light beam L1 with respect to the optical axis AX, and the ±1-order diffracted light beams $D_{p2}$, $D_{m2}$ resulting from diffraction. In this arrangement, the two apertures 59C1, 59C2 on the aperture diaphragm 59C are disposed as follows. That is, the amounts of eccentricity of the two apertures of the aperture diaphragm 59 of the illumination system are set depending on the line width of the reticle pattern RP1 so that the reticle pattern RP1 is irradiated at the inclination angle $\psi$ at which the one 0-order diffracted light beam $D_{01}$ and the −1-order diffracted light beam $D_{m1}$ in the projection optical system PL are symmetrical in relation to the optical axis AX, the other 0-order diffracted light beam $D_{02}$ and the +1-order diffracted light beam $D_{p2}$ are symmetrical in relation to the optical axis AX, the optical path of the one 0-order diffracted light beam $D_{01}$ is coincident with that of the other +1-order diffracted light beam $D_{p2}$, the optical path of t he other 0-order diffracted light beam $D_{02}$ is coincident with that of the one −1-order diffracted light beam $D_{m1}$, and all of the 0-order diffracted light beams $D_{01}$, $D_{02}$, the +1-order diffracted light beam $D_{p2}$, and the −1-order diffracted light beam $D_{m1}$ have the same optical path length. Therefore, only the two light beams pass through the projection optical system PL, and the complete two-beam interference is achieved. Thus, no wave front aberration occurs on the wafer W.

As a result, for example, when a positive resist is used as the resist applied onto the wafer W, in which a resist image remains at an unilluminated portion, then a pattern image P1 shown in FIG. 16(C) remains after development (However, in the case of the embodiment of the present invention, no development is actually performed until completion of the double exposure). In this procedure, as explained above, the exposure for the pattern RP1 can be performed in the periodic direction of the pattern RP1 at the high resolution and with the large depth of focus. Therefore, the pattern image P1 is a good image in relation to the periodic direction. However, as shown in FIG. 16(C), the pattern image is markedly deteriorated (the edge portions become dull and tapered) at both end portions of the pattern image P1, because no illumination is given for resolving the pattern corresponding to such portions in the vertical direction or in the oblique direction.

Accordingly, in the first embodiment of the present invention, the good pattern image located at central portions is effectively utilized by removing the portions (both end portions of the pattern) at which the image is deteriorated, in accordance with the subsequent second exposure step, after completion of the exposure under the two-beam interference condition in accordance with the first exposure step described above.

That is, in the second exposure step, the pattern RP2 on the reticle R2 is arranged at a position capable of removing the both end portions of the virtual L/S pattern image assumed to be formed in the first exposure step.

The main control unit 90 controls rotation of the revolver-driving mechanism 63 so that the aperture diaphragm 59D is set on the optical path of the illumination light beam. Accordingly, the direction of the illumination distribution of the aperture diaphragm 59D and the direction of the reticle pattern RP2 formed on the reticle R2 are in an orthogonal relationship with respect to that in the first exposure step. when the scanning exposure is performed by using the reticle R2 under the same two-beam interference condition as that described above, if a negative resist is used in which a resist image remains at an illuminated portion, the pattern image P1 as indicated by solid lines in FIG. 17(C) ought to remain after development. However, in the embodiment of the present invention., the positive resist is used. Therefore, the reticle pattern RP2 functions as a removal pattern. The pattern image P2 is subjected to overlay exposure on the both end portions of the pattern image P1 indicated by broken lines as shown in FIG. 17(C). As a result, the exposure-defective portions of the pattern image P1 are removed. A final pattern image, which is obtained by development after the exposure, is a resist pattern image with vivid edge portions as shown in FIG. 18. In this embodiment, the remaining L/S is formed by using the positive resist. Any remaining isolated line can be also formed in accordance with the same method.

Penetrating L/S's and penetrating isolated lines can be also formed by performing the same processes as those in the first and second exposure steps by using a negative resist.

A pattern to be formed may divided into at least two types of line patterns, i.e., a line pattern in a predetermined direction and a line pattern in a direction perpendicular thereto, in the same manner as the first end second exposure steps explained above. An identical reticle R or separate reticles R are prepared, in which the respective patterns are formed on the reticle R or reticles R respectively. The aperture diaphragms 59C, 59D are changed by the aid of the revolver-driving mechanism 63 by using the main control unit 90 to perform overlay exposure equivalently to those performed in the first and second exposure steps. Thus, for example, it is also possible to form a pattern image having a two-dimensional lattice-shaped configuration.

In the first embodiment of the present invention, for example, the double exposure is performed such that the overlay exposure is carried out by using two or more reticles (for example, R1, R2) as described above. When a plurality of reticles are handled in an identical exposure step as described above, it is desirable to manage the reticles as a set. Accordingly, in the first embodiment of the present invention, reticle cassettes and a reticle library for accommodating the reticle cassettes therein are used as shown in FIGS. 19 to 23.

Figure 19:
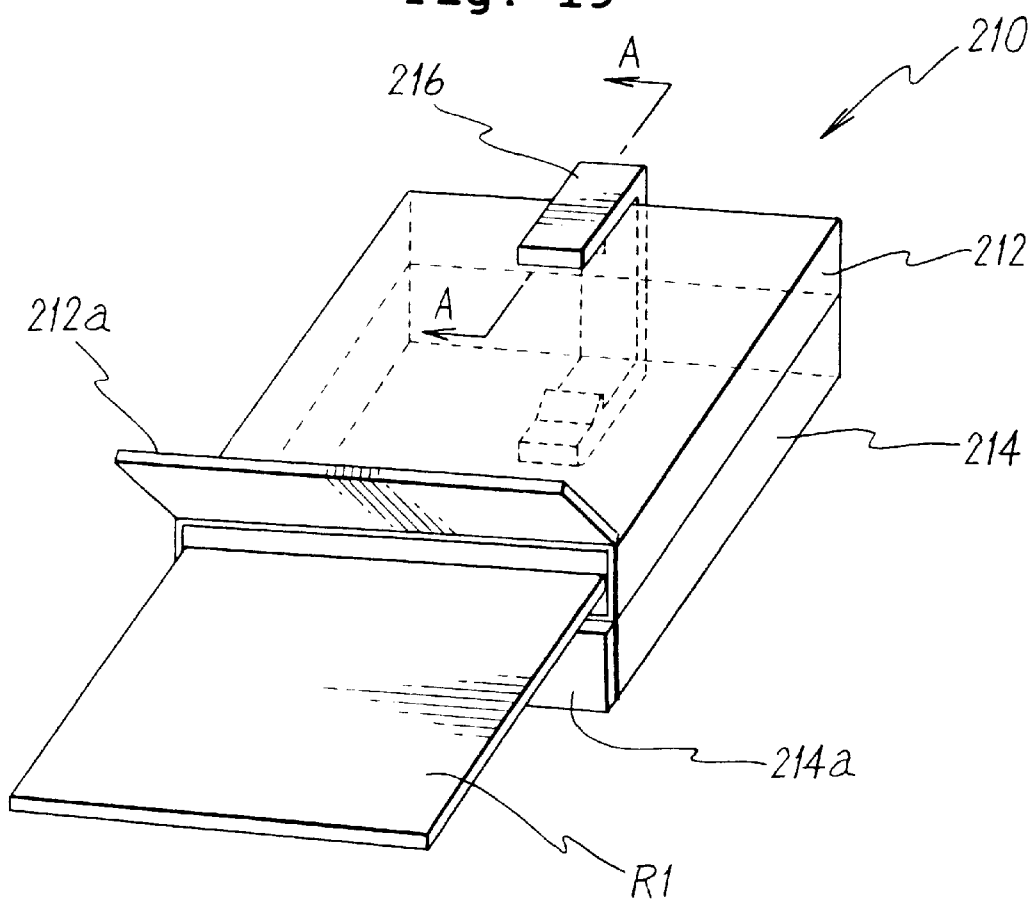
FIG. 19 shows a perspective view illustrating a state in which a plurality of reticle cassettes are fixed and integrated by using a fixing member.

FIG. 19 shows a perspective view in a state in which, for example, the reticle cassettes 212, 214 to serve as individual accommodating containers for individually accommodating the reticles R1, R2 therein are fixed and integrated by a cassette-fixing member 216 to serve as a fixing tool.

Lids 212*a*, 214*a*, which can be opened and closed when the reticle is taken out and inserted, are provided at front surfaces of the reticle cassettes 212, 214 respectively.

Figure 20:
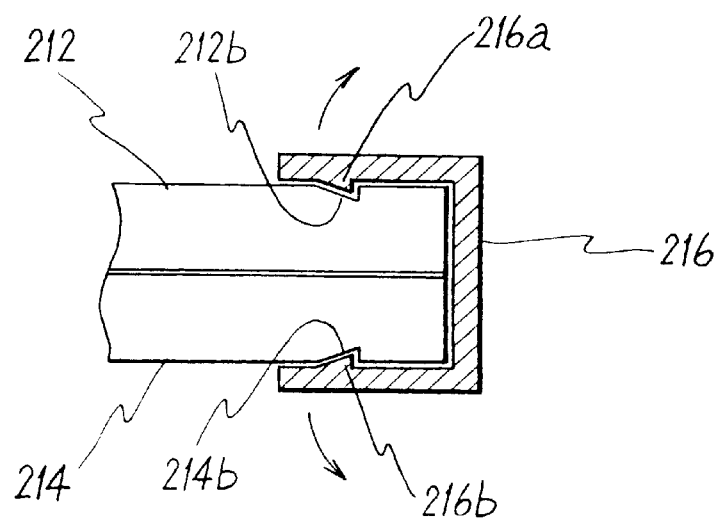
FIG. 20 shows a vertical cross-sectional view taken along a line A shown in FIG. 19.

The cassette-fixing member 216 is constructed, for example, by a fixing member having a ]-shaped cross section as shown in FIGS. 19 and 20. The cassette-fixing member 216 is used such that the reticle cassettes 212, 214 in a stacked state are inserted thereinto from a back surface side (side opposite to the side on which the lids 212*a*, 214*a* are provided). Thus, the reticle cassettes 212, 214 are vertically interposed and integrated into one unit. More particularly, as shown in FIG. 20 illustrating a vertical cross-sectional view taken along the position of the line A shown in FIG. 19, pawls 216*a*, 216*b* each having a wedge-shaped cross section are formed at portions of the ]-shaped cassette-fixing member 216 opposing to the reticle cassettes 212, 214 respectively. The pawls are engaged with inclined grooves 212*b*, 214*b* of the reticle cassettes 212, 124. Thus, the reticle cassettes 212, 214 are integrated into one unit. It is desirable that the inclined grooves are formed on upper and lower surfaces of the reticle cassettes respectively, because of the following reason. That is, by doing so, two reticles can be integrated into one unit by the aid of the fixing member 216 even when any reticle is accommodated in any reticle cassette.

Of course, it is needless to say that the pawls 216*a*, 216*b*, which have been engaged with the grooves 212*b*, 214*b*, can be disengaged by opening both end portions of the cassette-fixing member 216 in directions indicated by arrows shown in FIG. 20 to separate the integrated reticle cassettes 212, 214 from each other.

The cassette-fixing member 216 shown in FIG. 19 functions to fix two reticle cassettes. However, the present invention is not limited thereto. Those usable for three, four, or more reticle cassettes may be previously prepared depending on the number of reticle cassettes to be fixed. The method for fixing reticle cassettes is not limited to the method described above based on the use of the grooves and pawls. Reticle cassettes may be fixed to one another by using, for example, those based on an adhesive tape or a magnet.

Figure 21:
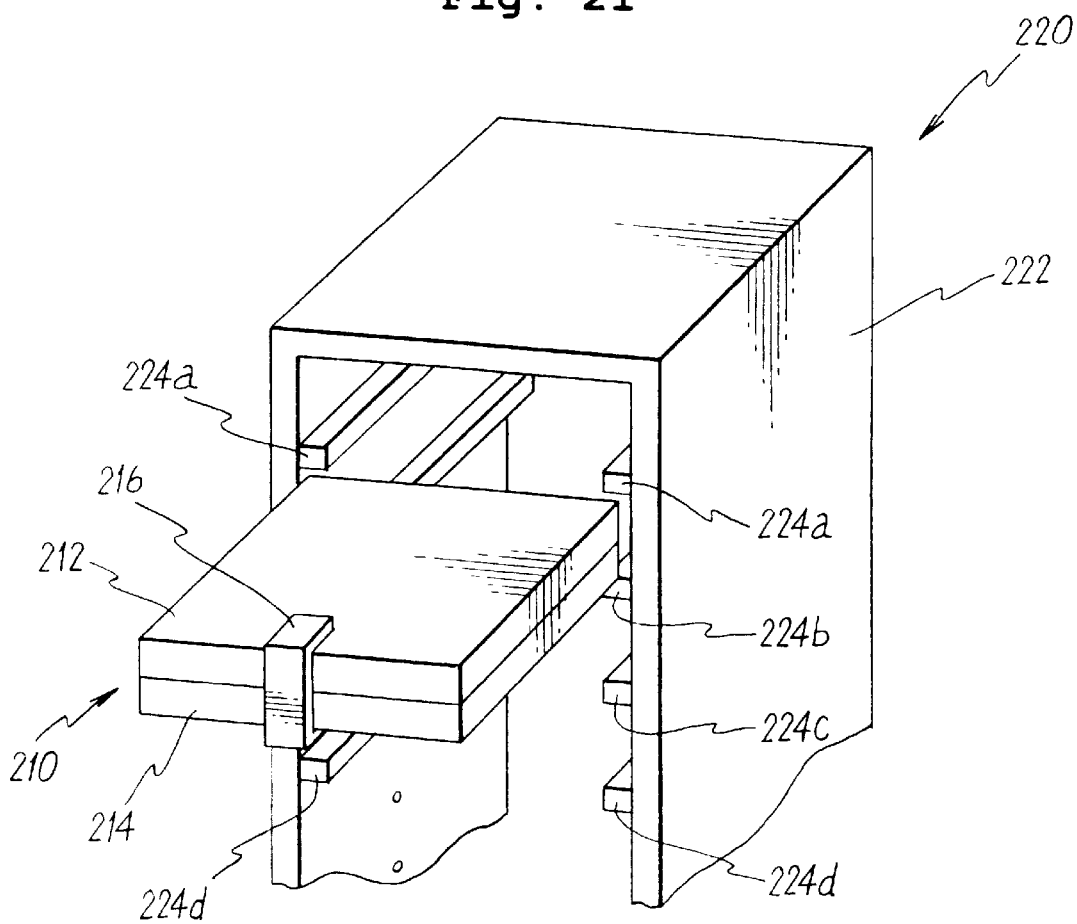
FIG. 21 shows a perspective view illustrating a reticle library for accommodating the reticle cassette shown in FIG. 19.

FIG. 21 shows a perspective view of a reticle library 220 capable of accommodating the reticle cassettes 212, 214 in a state of being integrated into one unit by the aid of the fixing member 216 shown in FIG. 19. The reticle library 220 can accommodate plural sets of the reticle cassettes integrated two by two into one unit by the aid of the fixing member 216. An unillustrated "foreign matter-detecting unit" for inspecting foreign matters adhered to reticles, and a "transport unit" for transporting reticles are arranged near to the reticle library 220. Thus, the reticles are mutually delivered between the reticle library 220 and the aforementioned units.

The reticle library 220 is composed of a box-shaped housing 222 with open front and back surfaces. Cassette support sections 224*a* to 224*d* for supporting the set of reticle cassettes integrated two by two into one unit by the aid of the fixing member 216 are vertically provided at a predetermined spacing distance on both sides of inner walls of the housing 222. In the reticle library 220, the vertical spacing distance between the cassette support sections 224*a* to 224*d* is set depending on the thickness (spacing distance corresponding to two pieces of the reticle cassettes in this embodiment) of the reticle cassettes fixed by the cassette-fixing member 216.

Figure 33:
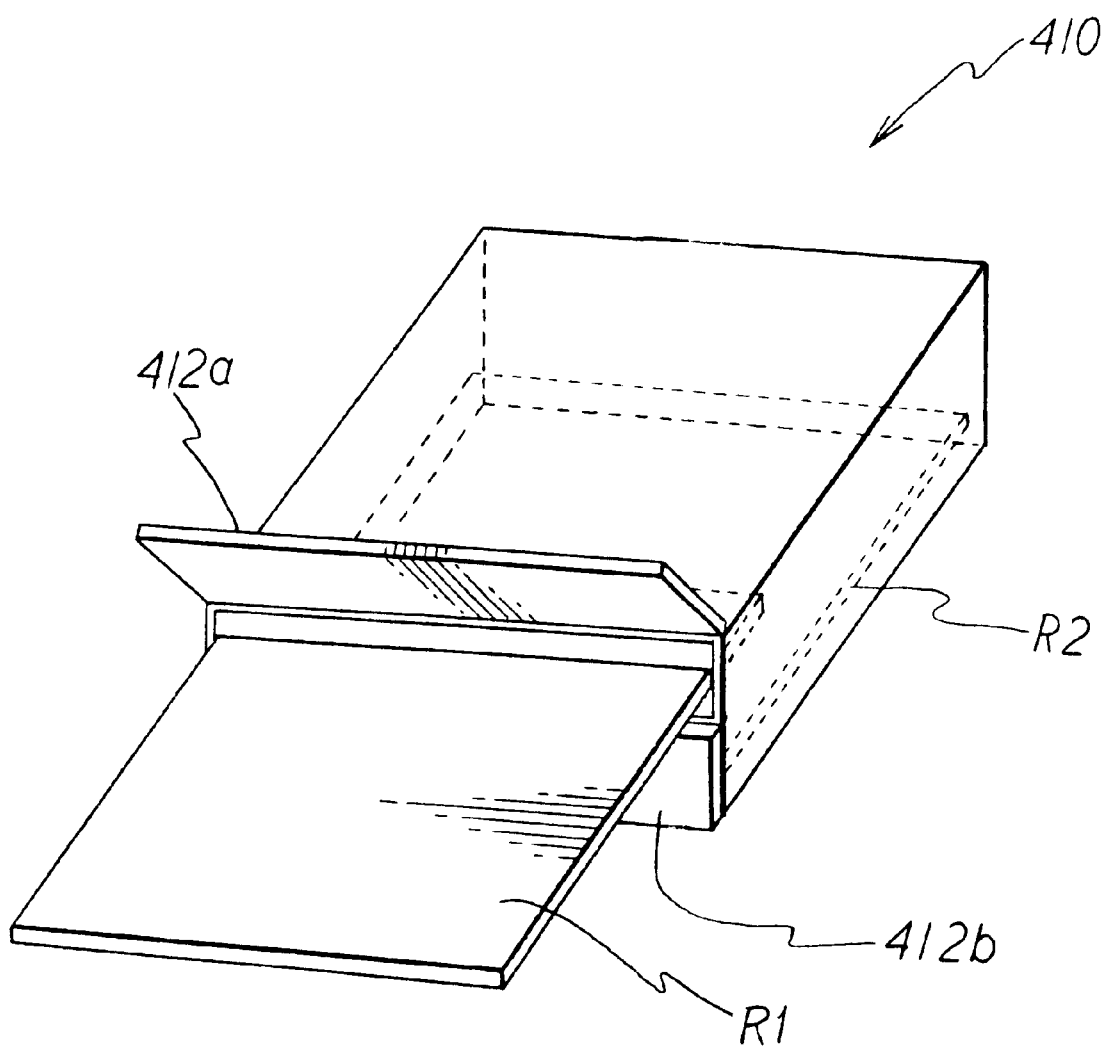
FIG. 33 shows a perspective view illustrating a modified embodiment of the reticle cassette shown in FIG. 19 and depicting a structure of the reticle cassette in which the internal space of the reticle cassette is vertically divided to make it possible to accommodate reticles R1, R2 in respective divided spaces.

As described above, in the first embodiment of the present invention, the cassette-fixing member 216 can be used to integrate and fix the reticle cassettes of a number corresponding to a number of sets. Therefore, it is possible to easily manage a plurality of reticle cassettes as set units. When the plurality of reticle cassettes are released from the fixation effected by the cassette-fixing member 216, they may be returned to be individual reticle cassettes equivalent to those hitherto used. Therefore, it is possible to perform the inspection for foreign matters by using the conventional foreign matter-detecting unit. However, considering only the procedure of management of reticles, it is also possible to adopt a structure of a reticle cassette 410 as shown in FIG. 33 in which the internal space of one reticle cassette 410 is vertically divided so that reticles R1, R2 are accommodated in respective divided spaces. The reticle cassette 410 is provided, at insertion slots for the reticles R1, R2, with lids 412a, 412b which can be opened and closed respectively. The reticle cassette 410 can be accommodated in the reticle library 220 shown in FIG. 21.

The present invention is not limited to the cassette support sections which are fixed at the constant spacing distance. Alternatively, a plurality of types of spacing distances may be set depending on the number of reticle cassettes to be used (those for one individual, two individuals, three individuals and so on). Further alternatively, the cassette support sections may be vertically movable so that the spacing distance therebetween is optionally changed. The vertical spacing distance between the cassette support sections 224a to 224d may be determined, for example, depending on whether or not the exposure apparatus is more often used for the ordinary exposure step, or whether or not the exposure apparatus is more often used for the double exposure step.

In this embodiment, the reticle (for example, R1), which is taken out of the reticle cassette (for example, 212) accommodated in the reticle library 220 in the state of being integrated as the set unit by the aid of the cassette-fixing member 216, is transported to the reticle stage RST (see FIG. 2) by the aid of an unillustrated reticle loader. After the transport, the reticle R1 is placed on the reticle stage RST. During a period in which the reticle alignment is executed for the reticle R1, the other reticle R2 is taken out of the reticle cassette 214, and it is allowed to wait at a reticle waiting position (not shown). At a point of time at which the reticle alignment is completed for the first reticle R1, the reticle R2 is placed on the reticle stage RST to perform the reticle alignment for the reticle R2. Thus, the loading operation is completed for the two reticles R1, R2 on the reticle stage RST.

Figure 22:
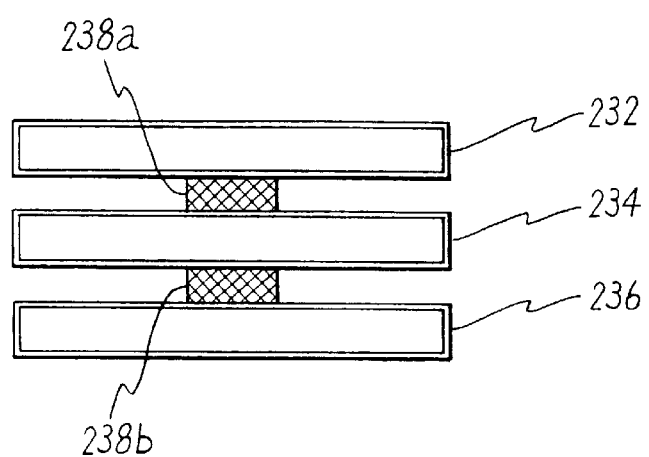
FIG. 22 shows a front view illustrating a state in which a plurality of reticle cassettes are fixed by using a cassette-fixing member.
Figure 23:
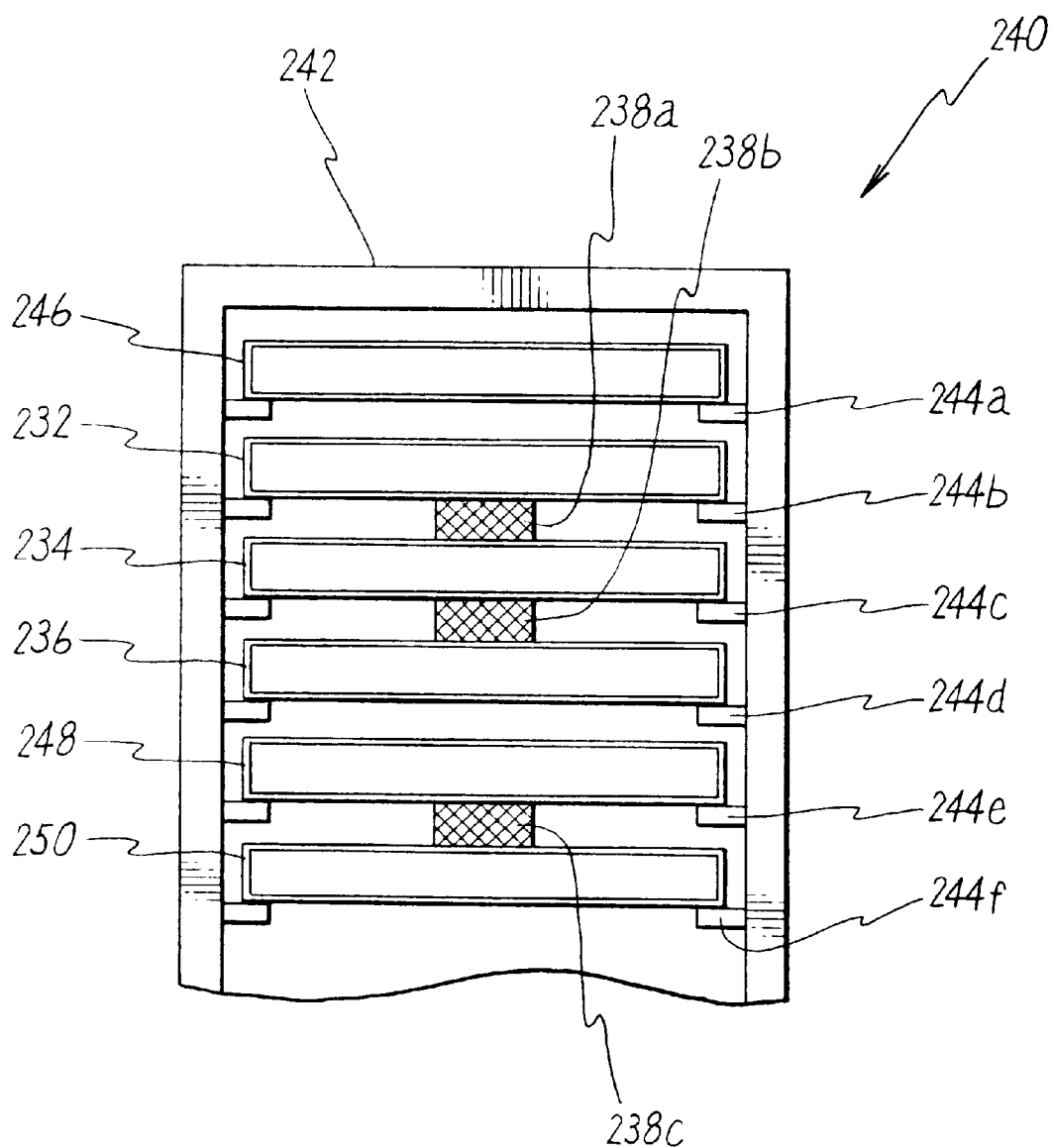
FIG. 23 shows a front view of the reticle library illustrating a state in which the reticle cassettes as shown in FIG. 22 and other components are accommodated.

When the reticle cassettes are integrated into one unit by using the fixing member 216 as described above, it is necessary to use the special reticle library in which the spacing distance between the cassette support sections is different from those ordinarily used. However, as shown in FIG. 22, it is available to use cassette-fixing members 238a, 238b as the fixing tool for mutually coupling and integrating reticle cassettes 232, 234, 236 while being separated by a predetermined spacing distance in the superimposing direction. By doing so, as shown in FIG. 23, for example, it is possible to accommodate, at desired positions, a reticle cassette 246 (single piece), reticle cassettes 232, 234, 236 (set of three pieces), and reticle cassettes 248, 250 (set of two pieces), even in the case of the use of an ordinary reticle library 240 comprising a housing 242 provided with cassette support sections 244a to 244f for individually supporting the reticle cassettes. It is possible to use, as the fixing members 238a, 238b, arbitrary members such as those composed of resins and metals capable of adhesion to the reticle cassettes 232, 234, 236 based on the use of an adhesive or the like.

As explained above, according to the projection exposure apparatus 10 of the first embodiment of the present invention, the pattern to be formed on the wafer is constructed as follows. That is, the first pattern comprising the line pattern in the predetermined direction and the second pattern perpendicular to the first pattern are formed on the reticles. The patterns are illuminated with illumination (so-called modified illumination) based on the use of the beams inclined by the predetermined amount in the direction perpendicular to the line direction of each of the patterns with respect to the optical axis. Thus, it is possible to form the pattern images having the large resolution and having the large depth of focus in the respective line directions. Therefore, it is possible to form the pattern image having the high resolution and having the large depth of focus in the respective line directions in accordance with the double exposure in which the overlay exposure is performed with respect to the first and second patterns so that the image-defective portions concerning one of the patterns are removed by using the other pattern.

According to the first embodiment of the present invention, for example, when a plurality of reticles are used as the set as in the double exposure, then a predetermined number of reticles are independently accommodated in one accommodating container, or they are accommodated in a plurality of individual accommodating containers respectively so that they are united and fixed by using the fixing tool, and they may be also accommodated in the reticle library. Therefore, it is possible to easily manage the plurality of reticles as the set unit.

Further, according to the projection exposure apparatus 10 concerning the first embodiment of the present invention, there are provided the two wafer stages for independently holding the two wafers respectively. The two wafer stages are independently moved in the XYZ directions, wherein the wafer exchange operation and the alignment operation are executed for one of the wafer stages, during which the exposure operation is executed for the other wafer stage. The operations of the both are mutually changed at the point of time at which the both operations are completed. Accordingly, it is possible to greatly improve the throughput.

According to the first embodiment of the present invention, there are provided at least two alignment systems for detecting the mark, the two alignment systems being disposed with the projection optical system PL interposed therebetween. Accordingly, the alignment operation and the exposure operation, which are performed by alternately using the respective alignment systems, can be concurrently dealt with in parallel to one another by alternately moving the two wafer stages.

According to the first embodiment of the present invention, the wafer loader for exchanging the wafer is arranged in the vicinity of the alignment system, especially to perform the operation at the respective alignment positions. Accordingly, the change from the wafer exchange to the alignment sequence is smoothly performed. Thus, it is possible to obtain a higher throughput.

According to the first embodiment of the present invention, the influence to cause deterioration of throughput disappears almost completely, even when the off-axis alignment system is installed at a position greatly separated from the projection optical system PL, because the high throughput is obtained as described above. Therefore, it is possible to design and install a straight cylinder type optical system having a high N.A. (numerical aperture) and having a small aberration.

According to the first embodiment of the present invention, each of the optical systems has the interferometer beam radiated from the interferometer for measuring the approximate center of each of the optical axes of the two alignment systems and the projection optical system PL. Accordingly, the positions of the two wafer stages can be accurately measured in a state free from any Abbe error at any time of the alignment and the pattern exposure by the aid of the projection optical system. Thus, it is possible to independently move the two wafer stages.

The length-measuring axes BI1X, BI2X, which are provided toward the projection center of the projection optical system PL from the both sides in the direction (X axis direction in this embodiment) along which the two wafer stages WS1, WS2 are aligned, are always used to effect radiation to the wafer stages WS1, WS2 so that the positions of the respective stages in the X axis direction are measured. Therefore, it is possible to move and control the two stages so that they exert no interference with each other.

The interferometers are arranged so that the length-measuring axes BI3Y, BI4Y, BI5Y effect radiation in the direction (Y axis direction in this embodiment) intersecting perpendicularly toward the positions of the detection center of the alignment system and the projection center of the projection optical system PL with respect to the length-measuring axes BI1X, BI2X. The position of the wafer stage can be accurately controlled by resetting the interferometers even when the length-measuring axis is deviated from the reflective surface due to movement of the wafer stage.

The fiducial mark plates FM1, FM2 are provided on the two wafer stages WS1, WS2 respectively. The positional adjustment for the wafer can be performed by adding the spacing distance from the correction coordinate system obtained by previously measuring the mark position on the fiducial mark plate and the mark position on the wafer by using the alignment system, to the measured position of the fiducial plate before the exposure, without performing the baseline measurement for measuring the spacing distance between the projection optical system and the alignment system as performed in the conventional technique. It is unnecessary to carry a large fiducial mark plate as described in Japanese Laid-Open Patent Publication No. 7-176468.

According to the first embodiment of the present invention, the double exposure is performed by using a plurality of reticles R. Accordingly, an effect is obtained to increase the resolution and improve DOF (depth of focus). However, in the double exposure method, it is necessary to repeat the exposure step at least twice. For this reason, in general, the exposure time is prolonged, and the throughput is greatly decreased. However, the use of the projection exposure apparatus according to the embodiment of the present invention makes it possible to greatly improve the throughput. Therefore, the effect is obtained to increase the resolution and improve DOF without decreasing the throughput. For example, it is assumed that the respective processing times of T1 (wafer exchange time), T2 (search alignment time), T3 (fine alignment time), and T4 (exposure time for one exposure) for an 8-inch wafer are T1: 9 second, T2: 9 seconds, T3: 12 seconds, and T4: 28 seconds. When the double exposure is performed in accordance with the conventional technique in which a series of exposure processes are performed by using one wafer stage, there is given a throughput THOR=3600/(T1+T2+T3+T4×2)=3600/(30+ 28×2)=41 [sheets/hour]. Therefore, the throughput is lowered to be up to 66% as compared with a throughput (THOR=3600/(T1+T2+T3+T4)=3600/58=62 [sheets/hour]) obtained by using a conventional apparatus in which the single exposure method is carried out by using one wafer stage. However, when the double exposure is performed by using the projection exposure apparatus according to the embodiment of the present invention while concurrently processing T1, T2, T3, T4 in parallel to one another, there is given a throughput THOR=3600/(28+28)=64 [sheets/hour], because of large contribution of the exposure time. Therefore, the throughput can be improved while maintaining the effect to increase the resolution and improve DOF. The number of points for EGA can be increased in a degree corresponding to the long exposure time. Thus, the alignment accuracy is improved.

In the first embodiment of the present invention, explanation has been made for the case in which the present invention is applied to the apparatus for exposing the wafer based on the use of the double exposure method. However, the present invention may be also applied to the stitching which is a similar technique. Further, such explanation has been made because of the following reason. That is, as described above, when the exposure is performed twice with the two reticles (double exposure, stitching) on the side of one of the wafer stages, during which the wafer exchange and the wafer alignment are concurrently carried out in parallel on the side of the other wafer stage which is independently movable, by using the apparatus according to the present invention, then the especially large effect is obtained in that the high throughput can be obtained as compared with the conventional single exposure, and it is possible to greatly improve the resolving power. However, the range of application of the present invention is not limited thereto. The present invention can be preferably applied when the exposure is performed in accordance with the single exposure method. For example, it is assumed that the respective processing times (T1 to T4) for an 8-inch wafer are the same as those described above. When the exposure process is performed in accordance with the single exposure method by using the two wafer stages as in the present invention, if T1, T2, T3 are dealt with as one group (30 second in total), and the concurrent process is performed for T4 (28 seconds), then there is given a throughput THOR=3600/30=120 [sheets/hour]. Thus, it is possible to obtain the high throughput which is approximately two times the conventional throughput (THOR=62 [sheets/hour]) in which the single exposure is carried out by using one wafer stage.

In the first embodiment described above, explanation has been made for the case in which the scanning exposure is performed in accordance with the step-and-scan system. However, the present invention is not limited thereto. It is a matter of course that the present invention can be equivalently applied to a case in which the stationary exposure is performed in accordance with the step-and-repeat system, as well as those based on the use of the EB exposure apparatus and the x-ray exposure apparatus, and a process of the stitching exposure in which a chip is combined with another chip.

<Second Embodiment>

Figure 24:
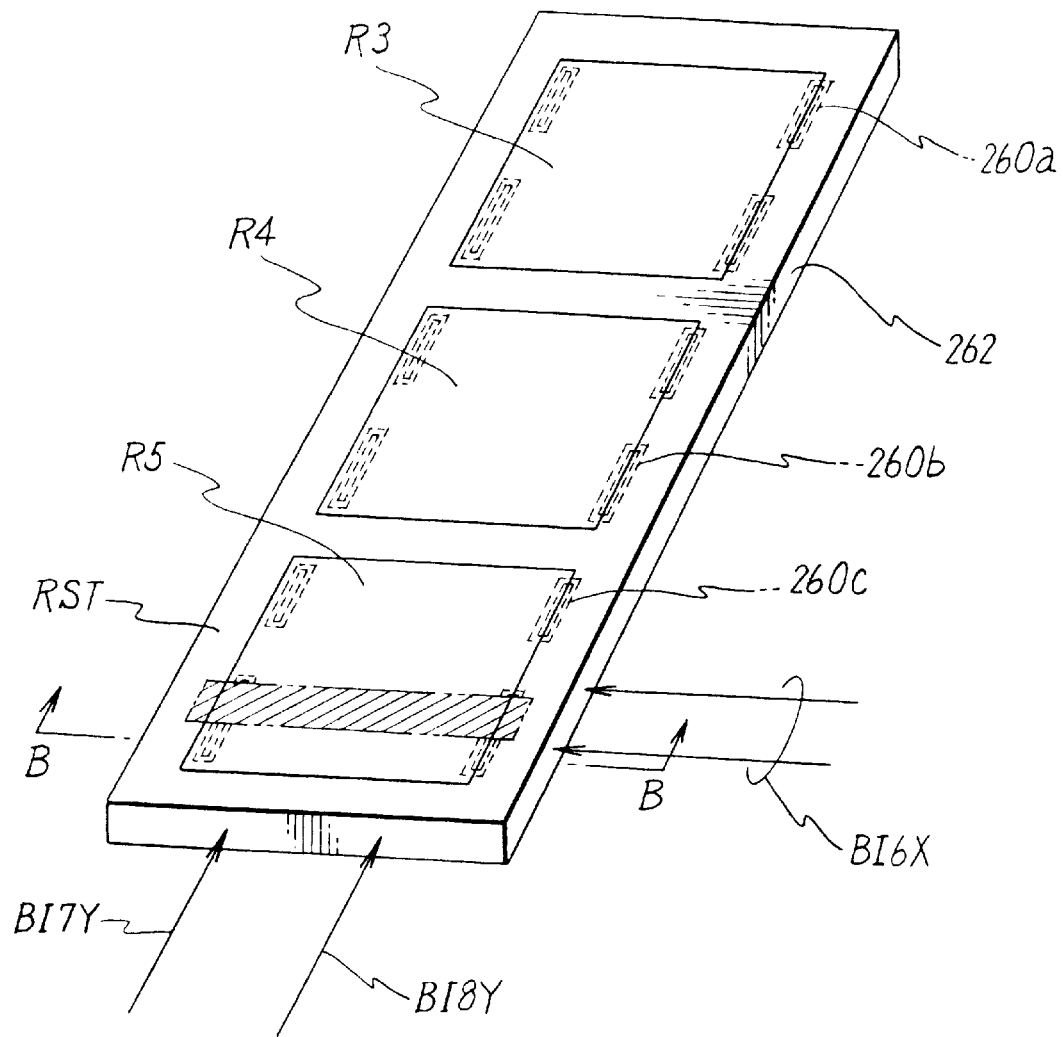
FIG. 24 shows a perspective view illustrating a reticle stage which is capable of carrying three sheets of reticles used in the second embodiment.

The second embodiment of the present invention will be explained below on the basis of FIGS. 24 to 30. Constitutive components which are the same as or equivalent to those described in the first embodiment are explained by using the same reference numerals. The second embodiment is different from the first embodiment only in that a reticle stage RST capable of carrying three sheets of reticles R3, R4, R5 as shown in FIG. 24 is used as the reticle stage. The construction of the other parts is the same as that of the first embodiment.

Figure 25:
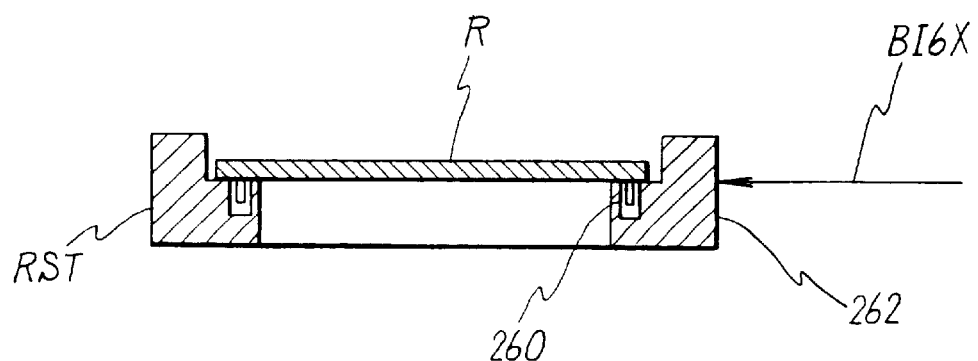
FIG. 25 shows a cross-sectional view taken along a line B—B shown in FIG. 24.

In the second embodiment of the present invention, a side surface of the reticle stage RST is subjected to mirror-finished processing to form a reflective surface 262. The reflective surface 262 is allowed to function in the same manner as the movement mirror 34 in the first embodiment. Otherwise, if three reticles are placed on one reticle stage, deformation or the like possibly occurs due to distortion or the like caused by their weight, along with the passage of time at attachment sections depending on attachment conditions thereof, when the movement mirror is provided separately from the stage. However, in the present invention, it is possible to avoid occurrence of such an inconvenience. Further, as shown in FIG. 25, reticle vacuum sections 260 are provided on an upper surface of the reticle-holding surface of the reticle stage RST so that the lower surface of the reticle R formed with the pattern is at the same height as that of the length-measuring axis BI6X in order to prevent occurrence of any Abbe error.

In this embodiment, in order to independently attract the three reticles R3, R4, R5, the reticle vacuum sections 260a, 260b, 260c are provided on the reticle-holding surface opposing to four corners of the respective reticles as shown in FIG. 24.

It is necessary that the reflective surface 262 is designed to be long so that the length-measuring axis BI6X is not deviated with respect to the three reticles. For this reason, it is difficult to maintain flatness of the reflective surface 262. However, in the second embodiment of the present invention, the following design is used to avoid malfunction of the position control system for the reticle stage RST which would be otherwise caused by the inconvenience as described above.

That is, the reticle stage RST is moved over the entire stroke in the scanning direction beforehand, during which the rotation of the reticle stage RST is monitored by using the reticle interferometer having length-measuring axes BI7Y, BI8Y, while the difference in output between those obtained from two optical axes of the double beam interferometer having the length-measuring axis BI6X is sampled over the entire stroke. Respective sampling results (those obtained by subtracting an amount corresponding to a rotational error of the reticle stage RST therefrom) represent the virtual inclination at the central position of the two optical axes of the reticle interferometer BI6X. Accordingly, the curvature of the reflective surface (movement mirror) 262 can be calculated by integrating the value thereof. Therefore, in the second embodiment of the present invention, the curvature error data (irregularity data) of the reflective surface (movement mirror) 262 calculated as described above is stored beforehand in the memory 91. An offset corresponding to an amount of the curvature error data is added to a target value of the interferometer when the main control unit 90 is operated to move the reticle. Thus, the position of the reticle stage is accurately controlled without depending on any situation of curvature of the reflective surface 262.

The curvature of the reflective surface 262 can be determined by performing the measurement described above at any time when the reticle stage RST undergoes, for example, exposure light beam absorption during the exposure, or when it undergoes deformation along with the passage of time. Therefore, it is desirable that the foregoing measurement is periodically performed to update the curvature error data stored in the memory 91. The curvature error data, which is actually required, is the curvature error data on portions of the reflective surface 262 corresponding to the three reticles R. The curvature error data on portions of the reflective surface 262 corresponding to portions located between the reticles is not necessarily indispensable. In this context, it is sufficient to independently store the curvature error data as those corresponding to the respective reticles. Accordingly, it is possible to accurately control the positions of the respective reticles.

Owing to the various designs as described above, the second embodiment of the present invention makes it possible to quickly move the respective reticles R to the position of the illumination area IA over the projection optical system PL to perform the scanning exposure.

Next, explanation will be made, on the basis of FIGS. 26 to 30, for an example of the triple exposure method which is performed by successively and continuously using the three reticles R3, R4, R5 carried on the reticle stage RST as described above.

In this embodiment, explanation will be made for a case in which contact holes shown in FIG. 30 are intended to be finally obtained.

The first exposure step is performed by using a reticle (hereinafter referred to as "reticle R3" for convenience for explanation) formed with an L/S pattern RP3 as shown in FIG. 26(B). The second exposure step is performed by using a reticle (hereinafter referred to as "reticle R4" for convenience for explanation) formed with an L/S pattern RP4 as shown in FIG. 27(B). The third exposure step is performed by using a reticle (hereinafter referred to as "reticle R5" for convenience for explanation) formed with a pattern RP5 as shown in FIG. 29(B). In FIGS. 26(B), 27(B), and 29(B), hatched portions are transmitting sections composed of glass, and the other portions are shielding sections composed of Cr.

In this embodiment, it is assumed that the reticles R3, R4, R5 as described above are carried on the reticle stage RST (see FIG. 24).

In the first exposure step, the aperture diaphragm 59C is used, in which the amount of light in the plane substantially corresponding to one obtained by Fourier transformation for the pattern formation plane on the reticle R3 or in the plane in the vicinity thereof is distributed as shown in FIG. 26(A). In the second exposure step, the aperture diaphragm 59D is used, in which the amount of light in the plane substantially corresponding to one obtained by Fourier transformation for the pattern formation plane on the reticle R4 or in the plane in the vicinity thereof is distributed as shown in FIG. 27(A). In the third exposure step, the zonal diaphragm 59F is used, in which the amount of light in the plane substantially corresponding to one obtained by Fourier transformation for the pattern formation plane on the reticle R3 or in the plane in the vicinity thereof is distributed as shown in FIG. 29(A).

At first, in the first exposure step, the main control unit 90 is operated to control the rotation of the revolver-driving mechanism 63 so that the aperture diaphragm 59C is set on the optical path of the illumination light beam. When the scanning exposure is performed by using the reticle R3 under this illumination condition as described above, then only the two light beams pass through the projection optical system PL, giving complete two-beam interference, because of the same reason as that for the first exposure step in the first embodiment. Thus, no wave front aberration occurs on the wafer W. As a result, for example, when a negative resist is used as the resist applied onto the wafer W, in which a resist image remains at an illuminated portion, then a pattern image P3 shown in FIG. 26(C) remains after development (However, in the case of the embodiment of the present invention, no development is actually performed until completion of the triple exposure). In this procedure, as explained above, the exposure for the pattern RP1 can be performed in the periodic direction of the pattern RP1 at a high resolution and with a large depth of focus. Therefore, the pattern image P3 is a good image for the periodic direction.

In the second exposure step, the pattern RP4 on the reticle R4 is arranged perpendicularly to the virtual L/S pattern image assumed to be formed in the first exposure step.

The main control unit 90 controls the rotation of the revolver-driving mechanism 63 so that the aperture diaphragm 59D is set on the optical path of the illumination light beam. Accordingly, the direction of the illumination distribution obtained by using the aperture diaphragm 59D and the direction of the reticle pattern RP4 formed on the reticle R2 are in an orthogonal relationship with respect to the case of the first exposure step. When the scanning exposure is performed by using the reticle R4 under the same two-beam interference condition as that described above, the pattern image P4 as indicated by solid lines in FIG. 27(C) ought to remain after development. However, in this embodiment, the pattern image P4 is subjected to overlay exposure on the both end portions of the pattern image P3 indicated by broken lines as shown in FIG. 27(C). As a result, when development is performed after completion of the second exposure step, a resist image as shown in FIG. 28 ought to remain (However, in the case of the embodiment of the present invention, no development is actually performed until completion of the triple exposure).

The pattern image obtained as a result of the first and second exposure steps includes four good contact holes obtained at a central portion. However, due to a combination of the L/S reticle patterns, contact holes are also formed at unnecessary portions, as clarified from comparison between FIGS. 28 and 30.

In the third exposure step, the pattern RP5 on the reticle R5 is arranged such that the transmitting section composed of glass corresponds to only portions of three contact holes which are intended to be finally obtained, of the virtual pattern image shown in FIG. 28 assumed to be formed in accordance with the first and second exposure steps.

The main control unit 90 controls the rotation of the revolver-driving mechanism 63 so that the zonal diaphragm 59F is set on the optical path of the illumination light beam. When the scanning exposure is performed by using the reticle R5 under this zonal illumination condition followed by development, then all unnecessary portions are removed, and a good contact hole image is finally formed as shown in FIG. 30. The illumination, which is used during the final removal of the unnecessary portions, is the zonal illumination, because it is intended to remove the unnecessary portions without interfering the contact holes located at the shielded positions by using the reticle pattern RP5.

FIG. 29(C) shows the resist image P5 which is assumed to be obtained when the exposure is performed under the zonal illumination condition by using the reticle R5 formed with the reticle pattern RP5.

As explained above, according to the second embodiment of the present invention, the surface curvature data on the reflective surface of one reticle stage on which a plurality of reticles (three sheets in this embodiment) are carried is stored in the memory corresponding to the respective reticles. Accordingly, the positional control is performed while correcting the position of the reticle stage on the basis of the surface curvature data. That is, the inconvenience, which would be otherwise caused due to the elongation of the reticle stage brought about by the placement of the three reticles, or due to the deformation of the reflective surface of the reticle stage brought about, for example, by the temperature distribution condition, can be dissolved by correcting the control position on the basis of the surface curvature data on the reflective surface. Further, the three reticles are carried in an integrated manner on one reticle stage. Therefore, it is possible to obtain a high throughput when the overlay exposure is alternately performed by using a plurality of reticles.

Further, according to the second embodiment of the present invention, the triple exposure is performed by using the three reticles. During this process, patterns except for a specified pattern are removed in accordance with the third exposure step, from the pattern image having the high resolution and having the large depth of focus, formed as a result of the overlay exposure effected in accordance with the first and second exposure steps. Thus, it is possible to obtain the pattern image having the high resolution, comprising only the specified pattern image.

<Third Embodiment>

In the first and second embodiments described above, the double exposure or the triple exposure is performed by using a plurality of reticles. In such a process, for example, as shown in FIG. 2 or FIG. 24, a plurality of reticles R are carried on one reticle stage RST, and the movement of the reticle stage RST is controlled so that the reticle R is scanned in the predetermined direction, and the reticle R is changed. On the contrary, the third embodiment of the present invention is characterized in that there are provided a plurality of reticle stages for individually holding a plurality of reticles respectively, and the reticle stages are independently movable in a plane which is parallel to the reticle surface.

Figure 31:
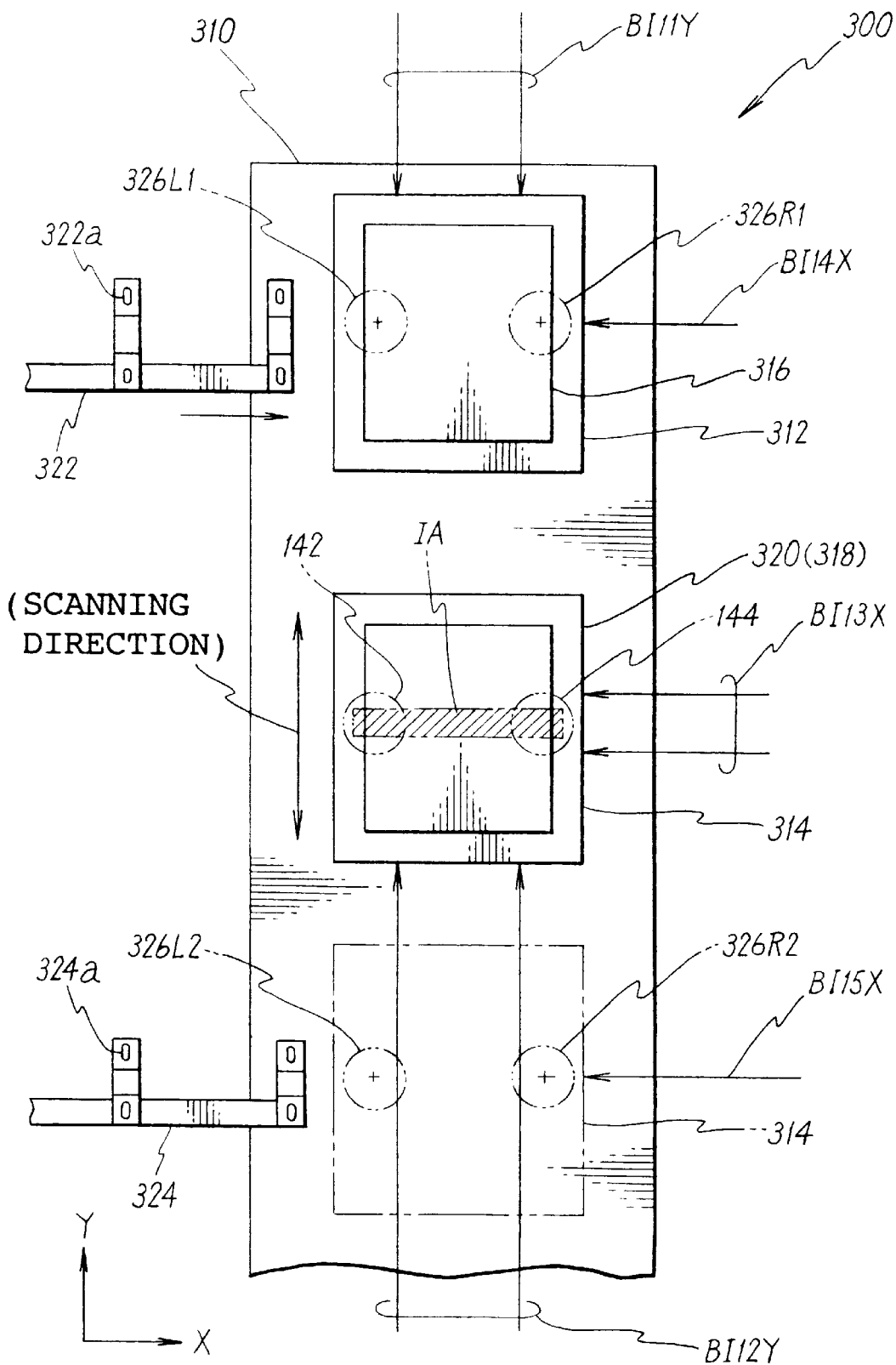
FIG. 31 shows a plan view for explaining a schematic arrangement of a reticle stage apparatus and its operation for independently moving and controlling two reticle stages concerning the third embodiment.
Figure 32:
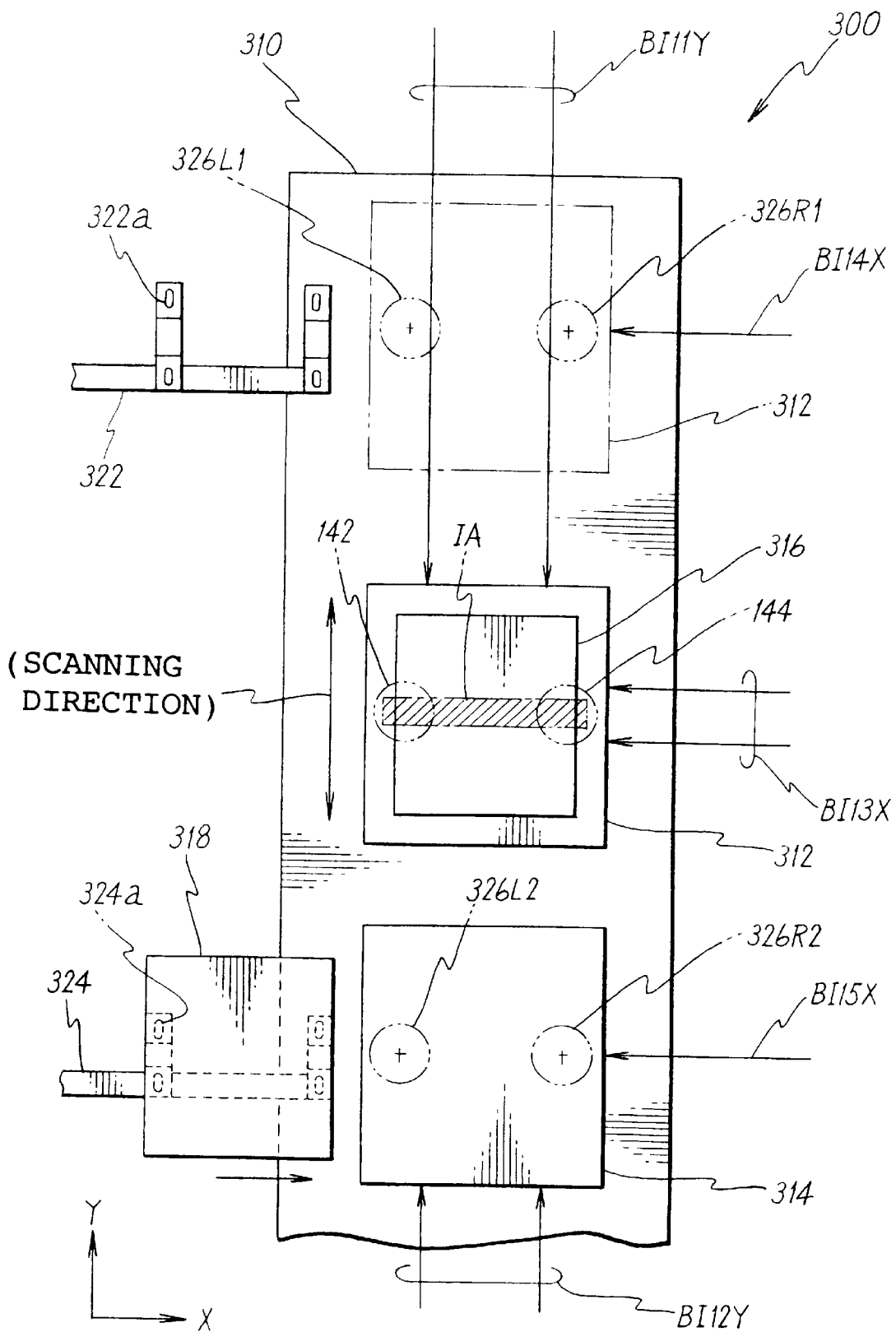
FIG. 32 shows a plan view for explaining the schematic arrangement of the reticle stage apparatus and its operation for independently moving and controlling the two reticle stages concerning the third embodiment.

FIGS. 31 and 32 show plan views for illustrating a schematic arrangement and operation of a reticle stage apparatus 300 which controls movement of two reticle stages in an independent manner according to the third embodiment of the present invention.

As shown in FIG. 31, the reticle stage apparatus 300 comprises two reticle stages 312, 314 which are supported in a floating manner via unillustrated air bearings over a reticle stage flat guide 310 and which are movable two-dimensionally in an independent manner in the X axis direction (lateral direction along the plane of the paper shown in FIG. 31) and in the Y axis direction (vertical direction along the plane of the paper shown in FIG. 31), and an interferometer system for measuring the positions of the reticle stages 312, 314.

Unillustrated air pads (for example, vacuum-pre-loadable air bearings) are provided at a plurality of positions on bottom surfaces of the reticle stages 312, 314. The reticle stages 312, 314 are supported over the reticle stage flat guide 310 in a floating manner in a state in which a spacing distance of, for example, several microns is maintained in accordance with the balance between the vacuum-pre-loaded force and the air-ejecting force effected by the air pads. The reticle stages 312, 314 are finely driven in the X axis direction and the rotational direction about the Z axis in the XY plane by the aid of an unillustrated reticle-driving system, for example, a two-dimensional linear motor. The reticle stages 312, 314 are driven in a range of a predetermined stroke in the Y axis direction which is the scanning direction. The reticle-driving system is controlled by the stage control unit 38 shown in FIG. 1.

The reticles 316, 320 are fixed on the reticle stages 312, 314 by means of, for example, vacuum attraction. A plurality of reticle marks for positional adjustment (for example, marks as described in Japanese Laid-Open Patent Publication No. 7-17648) are formed at both end portions of the reticles 316, 320 in the lateral direction along the plane of the paper.

On side surface in the X axis direction (right side surface as viewed in FIG. 31) and one side surface in the Y axis direction (upper side surface as viewed in FIG. 31) of the reticle stage 312 are mirror-finished reflective surfaces. Similarly, one side surface in the X axis direction (right side surface as viewed in FIG. 31) and the other side surface in the Y axis direction (lower side surface as viewed in FIG. 31) of the reticle stage 314 are mirror-finished reflective surfaces. Interferometer beams having respective length-measuring axes, which are emitted from interferometers for constructing the interferometer system as described later on, are radiated onto the reflective surfaces. Reflected light beams therefrom are received by the respective interferometers to measure displacements of the respective reflective surfaces from a reference position. Thus, two-dimensional positions of the reticle stages 312, 314 are measured respectively.

In the third embodiment of the present invention, a pair of reticle mark-measuring sensors 326L1, 326R1, which function as a first mask alignment system, are provided corresponding to a reticle loading/unloading position (position indicated by solid lines in FIG. 31: hereinafter referred to as "reticle exchange position") for one of the reticle stages 312. Similarly, a pair of reticle markmeasuring sensors 326L2, 326R2, which function as a second mask alignment system, are provided corresponding to a reticle loading/unloading position (position indicated by phantom lines in FIG. 31: hereinafter referred to as "reticle exchange position") for the other reticle stage 314. For example, CCD may be used as the reticle mark-measuring sensors 326L1, 326R1. The reticle mark-measuring sensors 326L1, 326R1 are used to measure reticle marks of the reticle on the reticle stage 312 so that the reticle drawing error is measured, and the search alignment or the like is performed as described later on. Similarly, the reticle mark-measuring sensors 326L2, 326R2 are used to measure reticle marks of the reticle on the reticle stage 314 so that the reticle drawing error is measured, and the search alignment or the like is performed.

Next, explanation will be made for the interferometer system for managing the positions of the reticle stages 312, 314.

The interferometer system includes a length-measuring axis BI11Y as a first length-measuring axis for always measuring the position in the Y axis direction of the reticle stage 312 from one side in the Y axis direction, a length-measuring axis BI12Y as a second length-measuring axis for always measuring the position in the Y axis direction of the reticle stage 314 from the other side in the Y axis direction, a length-measuring axis BI13X as a third length-measuring axis which perpendicularly intersects the Y axis at the exposure position of the projection optical system PL (position of the illumination area IA), a length-measuring axis BI14X as a fourth length-measuring axis which perpendicularly intersects the Y axis at the detection positions for the reticle mark-measuring sensors 326L1, 326R1, and a length-measuring axis BI15X as a fifth length-measuring axis which perpendicularly intersects the Y axis at the detection positions for the reticle mark-measuring sensors 326L2, 326R2. The length-measuring axes are used to measure the two-dimensional positions of the reticle stage 312 and the reticle stage 314 respectively.

In the third embodiment of the present invention, when the scanning exposure is performed, the exposure operation is executed by moving the reticle to a position near to the illumination area IA to make scanning. During the exposure, the positions in the X direction of the reticle stages 312, 314 are measured by using measured values obtained by the length-measuring axis BI13X which perpendicularly intersects the Y axis at the position of the illumination area IA. Therefore, when any of the reticle stages (312 or 314) is moved to the illumination area IA, it is necessary to reset the interferometer so that the change of the length-measuring axis BI14X←→BI13X and the change of the length-measuring axis BI15X←→BI13X are made. In this manner, the length-measuring axis of the interferometer in the X axis direction is deviated from the reflective surfaces of the reticle stages 312, 314 depending on the condition of use. However, at least one length-measuring axis, i.e., the length-measuring axes BI11Y, BI12Y are not deviated from the reflective surfaces of the respective reticle stages 312, 314. Therefore, it is possible to reset the interferometer on the X side at an appropriate position at which the optical axis of the interferometer to be used comes into the reflective surface. The method for resetting the interferometer will be described in detail below.

In the third embodiment of the present invention, there are provided, as transport systems, a first reticle transport system 322 for delivering the reticle between itself and the reticle stage 312, and a second reticle transport system 324 for delivering the reticle between itself and the reticle stage 314. As shown in FIG. 31, the first reticle transport system 322 exchanges the reticle between itself and the reticle stage 312 located at the reticle exchange position. As shown in FIG. 31, the second reticle transport system 324 exchanges the reticle between itself and the reticle stage 314 located at the reticle exchange position as indicated by phantom lines. In the drawing, only F-shaped transport arms are depicted for both of the first reticle transport system 322 and the second reticle transport system 324. Accordingly, the reticle transport systems will be hereinafter referred to as "transport arms 322, 324", unless otherwise specified. The transport arms 322, 324 are provided at several positions with attracting sections 322a, 324a for attracting and holding the reticle respectively.

Those described above are characteristic features of the scanning type exposure apparatus according to the third embodiment of the present invention. Other components or parts are constructed in the same manner as the scanning type exposure apparatus according to the first embodiment of the present invention.

Next, explanation will be made for an example of the triple exposure with reference to FIGS. 31 and 32, effected by the scanning type exposure apparatus according to the third embodiment of the present invention constructed as described above.

At first, the reticle 320 is transported by the transport arm 324, and it is transmitted to the reticle stage 314 waiting at the reticle exchange position shown by the phantom lines in FIG. 31. The reticle 320 is set onto the reticle stage 314. After the setting of the reticle 320, as disclosed in U.S. Pat. No. 5,646,413, the main control unit 90 is operated to measure a plurality of the reticle marks (unillustrated) formed at both end portions of the reticle 320 by using the reticle mark-measuring sensors 326L2, 326R2 while moving the reticle stage 314. By using a positional information of the measured reticle marks, the positional coordinate of the reticle pattern wherein the drawing error of the pattern has been corrected is determined. Prior to the measurement of the reticle marks, the main control unit 90 is operated to execute reset for the interferometer having the length-measuring axis BI15X.

The reticle 316 is transported by the transport arm 322 after performing the setting for the reticle 320 and the measurement of the reticle marks (or concurrently therewith). The reticle 316 is transmitted to the reticle stage 312 waiting at the reticle exchange position indicated by the solid lines in FIG. 31. The reticle 316 is set on the reticle stage 312. After the setting for the reticle 316, the main control unit 90 is operated to measure the unillustrated reticle marks formed at both end portions of the reticle 316 by using the reticle mark-measuring sensors 326L1, 326R1 while moving the reticle stage 312. Thus, the reticle coordinate, for which the drawing error on the reticle has been corrected, is determined. Prior to the measurement of the reticle marks, the main control unit 90 is operated to execute reset for the interferometer having the length-measuring axis BI14X.

Next, the main control unit 90 is operated to move the reticle stage 314 to the illumination area IA over the projection optical system PL on the basis of the measured value obtained by using the interferometer having the length-measuring axis BI12Y, in the same manner as performed for the wafer stage explained in the first embodiment, so as to perform reticle alignment (fine alignment) by using the reticle mark on the reticle 320 and the fiducial mark plate FM on the wafer stage. Prior to the reticle alignment, the main control unit 90 is operated to execute reset for the interferometer having the length-measuring axis BI13X. It is possible to obtain correspondence between the reticle coordinate and the wafer coordinate. The main control unit 90 is operated to perform exposure in accordance with the step-and-scan system for the entire surface of the wafer placed on one of the wafer stages by using the reticle 320 (first exposure step).

After completion of the exposure based on the use of the reticle 320 as described above, the reticle stage 314 is returned to the reticle exchange position (position indicated by the phantom lines in FIG. 31), concurrently with which the reticle stage 312 is moved to the illumination area IA over the projection optical system PL on the basis of the measured value obtained by using the interferometer having the length-measuring axis BI11Y in the same manner as described above to perform reticle alignment (fine alignment) by using the reticle mark on the reticle 316 and the fiducial mark plate FM on the wafer stage (see FIG. 32). Also in this process, prior to the reticle alignment, the main control unit 90 is operated to execute reset for the interferometer having the length-measuring axis BI13X. The main control unit 90 is operated to perform exposure in accordance with the step-and-scan system by using the reticle 316 so that overlay exposure is performed under a predetermined condition for the exposure pattern of the reticle 320 having been subjected to the exposure in the first exposure step, for the entire surface of the wafer placed on the one wafer stage (second exposure step).

Concurrently with the exposure performed in the second exposure step by using the reticle 316, the main control unit 90 is operated to exchange the reticle 320 having been used in the previous exposure with the reticle 318 on the reticle stage 314 waiting at the exchange position indicated by the solid lines in FIG. 32, by using the transport arm 324, followed by the measurement of the reticle marks on the reticle 318 based on the use of the reticle mark-measuring sensors 326L2, 326R2, and the execution of reset for the interferometer having the length-measuring axis BI15X prior thereto. The reticle stage 314 is allowed to wait as it is.

At the point of time of completion of the exposure in the second exposure step based on the use of the reticle 316, the main control unit 90 is operated to return the reticle stage 312 to the reticle exchange position, concurrently with which the reticle stage 314 is moved to the illumination area IA over the projection optical system PL on the basis of the measured value obtained by using the interferometer having the length-measuring axis BI12Y in the same manner as described above to perform reticle alignment (fine alignment) by using the reticle mark on the reticle 318 and the fiducial mark plate FM on the wafer stage. Also in this process, prior to the reticle alignment, the main control unit 90 is operated to execute reset for the interferometer having the length-measuring axis BI13X. The main control unit 90 is operated to perform exposure in accordance with the step-and-scan system by using the reticle 318 so that overlay exposure is performed under a predetermined condition for the pattern on the wafer having been previously formed by using the reticles 320, 316, for the entire surface of the wafer placed on the one wafer stage (third exposure step). The third exposure step is executed just in the same state as that shown in FIG. 31 except that the reticle 320 is exchanged with the reticle 318.

When the exposure for one sheet of wafer is completed as described above, the wafer stage is changed on the side of the wafer stage in the same manner as explained in the first embodiment. Thus, the triple exposure is performed for the wafer on the other wafer stage in the same manner as described above. However, as clarified from the state of completion of the third exposure step (state in which the reticle 320 is exchanged with the reticle 318 in FIG. 31), the order of reticles to be used for exposure is exchanged in the exposure step for the next wafer on the other wafer stage, because the reticles 316, 318 have been already placed on the reticle stages 312, 314. That is, in the exposure step for the next wafer, the order of exposure is changed to the reticle 318→the reticle 316→(exchange the reticle 316 with the reticle 320)→the reticle 320. This procedure is adopted because the exposure process time can be rather shortened (the throughput can be rather improved) when the next exposure process is performed without changing the reticle upon completion of the exposure step for the first sheet of wafer (However, an extremely short period of time is required to exchange the wafer stage until the next wafer exposure step is started).

As explained above, according to the third embodiment of the present invention, the two reticle stages are provided, which independently move in the two-dimensional plane while holding the reticle respectively. The different length-measuring axes of the interferometers are used to manage the positions of the respective reticle stages at the reticle exchange position and the exposure position respectively. The interferometers having the length-measuring axes are optionally changed (the interferometers are reset, if necessary). Accordingly, even when the exposure is performed by using a plurality of reticles, it is possible to miniaturize the respective reticle stages and reduce their weights. Further, it is possible to improve the positional control performance for the respective reticle stages, and it is possible to improve the synchronization accuracy during the synchronized scanning together with the wafer stage.

The exposure is performed by using the reticle 316 placed on the reticle stage 312, concurrently with which the reticle 320 is exchanged with the reticle 318 on the reticle stage 314, and the reticle marks on the reticle 318 are measured by using the reticle mark-measuring sensors 326L2, 326R2 for the reticle 318 thereon. That is, the exposure is performed by using the reticle on one of the reticle stages, during which the reticle is changed on the other stage, and the positions of the plurality of reticle marks of the exchanged reticle are detected thereon. Accordingly, regardless of the fact that the three reticles are used, a high throughput can be realized. Further, as compared with a case in which three reticles are aligned in one row and driven, such advantages are also obtained that the driving range of the reticle is decreased, and the foot print can be decreased.

Further, the reticle mark-measuring sensors 326L1, 326R1, 326L2, 326R2 are used at the reticle exchange position to previously execute the reticle alignment. Therefore, a state is given, in which the measurement of the drawing error of the reticle and the search alignment or the like have been previously completed. In this state, it is possible to shorten the time required to perform the fine alignment for the reticle based on the use of the reticle and the fiducial mark plate FM on the wafer stage, performed on the illumination area IA before the exposure.

The exposure condition, in which the three reticles are used as described above, is employed in the limited exposure step such as those used when the contact hole or the like is formed. However, the third embodiment of the present invention, which is optimized for driving the reticles of the two-sheet exchange type, is considered to have high cost performance in view of the fact that they can be commonly used.

The third embodiment has been explained as exemplified by the case in which the reticle exchange is performed only on the side of the reticle stage 314. However, the reticle exchange can be also performed on the side of the reticle stage 312. Therefore, it is also possible to perform the reticle exchange at a high speed for four reticles at the maximum.

Although not specifically explained in the third embodiment described above, the setting adapted to each of exposure conditions is made by manipulating, for example, depending on the reticle to be used, the condition of the modified illumination, the best focus position for the wafer, the distortion-correcting mechanism, and the image plane/astigmatism-correcting system. It is a matter of course that the contents of such control are changed depending on the change of the order of exposure for the reticle to be used.

In the third embodiment described above, for example, the reticle 320 is exchanged with the reticle 318. In such a process, even when any dust is interposed between the reticle and the attracting section on the reticle stage during the reticle exchange, or even when the distortion value is varied due to any change in posture (error depending on the thickness of the reticle, caused by any change in deflection of the reticle), then it is possible to make correction by previously performing measurement.

As explained above, according to the present invention, it is possible to provide the excellent projection exposure method which has not been hitherto achieved, and which makes it possible to expose a photosensitive substrate with a desired image of a pattern at a high resolution and with a large depth of focus.

According to the present invention, there is provided the scanning type projection exposure apparatus which makes it possible to accurately control the position of a mask stage which carries a mask thereon.

According to the present invention, there is provided the projection exposure apparatus which makes it possible to decrease the foot print of the main apparatus body while improving the throughput in mask exchange and the control performance of a mask stage.

According to the present invention, there is provided the projection exposure apparatus which makes it possible to easily perform the management for a plurality of masks when the plurality of masks are used as a set.

What is claimed is:

1. A scanning type exposure apparatus for exposing a substrate with a pattern formed on a mask by scanning the mask across an illumination light beam while synchronously moving the mask and the substrate with respect to the illumination light beam, the scanning type exposure apparatus comprising:
   a projection system which is arranged in a path of the illumination light beam and projects an image on one side of the projection system;
   a mask stage, at least one part of which is disposed on the other side of the projection system, and which is movable in a plane while carrying a plurality of masks and which has a first reflective surface formed on a side of the mask stage extending in a scanning direction;
   a position-detecting system which detects a position of the mask stage by irradiating the first reflective surface with a light beam;
   a memory which stores previously measured surface curvature data on the first reflective surface in relation to positions of the plurality of masks to be carried; and
   a control unit which is associated with the position-detecting system and the memory and controls the position of the mask stage on the basis of the surface curvature data on the first reflective surface stored in the memory and the position detected by the position-detecting system.

2. The scanning type exposure apparatus according to claim 1, wherein a second reflective surface is also formed on a side of the mask stage, and the detecting system detects the position of the mask stage in the scanning direction by irradiating the reflective surface with a light beam.

3. The scanning type exposure apparatus according to claim 2, wherein the position-detecting system includes a two-beam interferometer for irradiating the first reflective surface extending in the scanning direction with the light beam, and a difference in output of the two-beam interferometer is determined while moving the mask stage over an entire stroke in the scanning direction to determine the curvature of the first reflective surface by using the difference in output.

4. The scanning type exposure apparatus according to claim 3, wherein rotation of the mask stage is detected by using the position-detecting system and the difference in output of the two-beam interferometer is determined while moving the mask stage over the entire stroke in the scanning direction, and the difference in output is sampled over the entire stroke to determine the curvature of the first reflective surface by integrating a value obtained by subtracting a rotational error from a result of sampling.

5. The scanning type exposure apparatus according to claim 1, wherein three masks are carried on the mask stage, and triple exposure is executed by repeatedly performing scanning exposure for an identical area on the substrate by using patterns formed on the respective masks.

6. The projection exposure apparatus according to claim 1, further comprising a first substrate stage which is movable in a two-dimensional plane while carrying a first substrate and a second substrate stage which is movable in the two-dimensional plane or a parallel plane thereto independently from the first substrate stage while carrying a second substrate.

7. The projection exposure apparatus according to claim 6, further comprising a first interferometer which measures positional information of the first substrate and has a measuring axis which is not deviated from a reflective surface formed on the first substrate stage, and a second interferometer which measures positional information of the second substrate and has a measuring axis which is not deviated from a reflective surface formed on the second substrate stage.

8. The projection exposure apparatus according to claim 6, further comprising a linear motor member which is provided linearly in a certain direction and is used commonly for the first substrate stage and the second substrate stage to move the first substrate stage and the second substrate stage in the certain direction using a linear motor.

9. The projection exposure apparatus according to claim 6, further comprising an alignment system which detects a mark on the substrate held on one stage of the first substrate stage and the second substrate stage while the substrate held on the other stage of the first substrate stage and the second substrate stage is exposed.

10. The projection exposure apparatus according to claim 6, wherein the substrate held on the first substrate stage and the substrate held on the second substrate stage are multiple-exposed using the plurality of masks, respectively.

11. The projection exposure apparatus according to claim 10, wherein when exposure operations are performed using the plurality of masks sequentially, an exposure condition is changed depending on masks used in the exposure operations.

12. The projection exposure apparatus according to claim 6, wherein after exposure of the substrate held on one substrate stage of the first and the second substrate stages using a first mask among the plurality of masks, an exposure position of a second mask among the plurality of masks is determined prior to exposure of the substrate held on the other substrate stage of the first and the second substrate stages using the second mask.

13. The projection exposure apparatus according to claim 12, wherein the exposure position of the second mask is determined by detecting a positional relationship between a mark on the second mask and a reference mark on the other substrate stage through the projection system.

14. The projection exposure apparatus according to claim 12, wherein positional information on a plurality of shot areas on the substrate held on the other substrate stage is detected while the substrate held on the one substrate stage is exposed using the first mask.

15. The projection exposure apparatus according to claim 6, further comprising a first linear motor member provided linearly in a first direction to move the first substrate stage in the first direction, a second linear motor member provided at an end of the first linear motor member to move the first substrate stage and the first linear motor member in a second direction perpendicular to the first direction, a third linear motor member provided linearly in the first direction to move the second substrate stage in the first direction, and a fourth linear motor member provided at an end of the third linear motor member to move the second substrate stage and the third linear motor member in the second direction.

16. The projection exposure apparatus according to claim 15, wherein the second linear motor member has a pair of linear motors provided at both ends of the first linear motor member, and the fourth linear motor member has a pair of linear motors provided at both ends of the third linear motor member.

17. The projection exposure apparatus according to claim 15, further comprising a fifth linear motor member provided linearly in the second direction to cooperate with the second linear motor member to move the first linear motor member in the second direction.

18. The projection exposure apparatus according to claim 17, wherein the fifth linear motor member is also used to cooperate with the fourth linear motor member to move the third linear motor member in the second direction.

19. The projection exposure apparatus according to claim 1, wherein the plurality of masks are held on the mask stage so that the masks are apart from each other in the scanning direction.

20. A projection exposure apparatus for exposing a substrate by sequentially projecting images of patterns formed on a plurality of masks through a projection optical system onto the substrate, the projection exposure apparatus comprising:

a first mask stage, at least one part of which is disposed on one side of the projection optical system, and which is movable in a two-dimensional plane while carrying a first mask;

a second mask stage, at least one part of which is disposed on the one side of the projection optical system, and which is movable independently from the first mask stage on the same plane as that for the first mask stage while carrying a second mask;

a mark-detecting system which is provided separately from the projection optical system, and detects marks formed on the first mask and the second mask, respectively; and a control unit which is associated with the first mask stage, the second mask stage, and the mark-detecting system and controls the first mask stage, the second mask stage, and the mark-detecting system respectively so that an exposure operation is performed on any one of the mask stages of the first mask stage and the second mask stage, during which a mark detection operation effected by the mark-detecting system is performed on the other mask stage.

21. The projection exposure apparatus according to claim 20, wherein the mark-detecting system further comprises a first mask alignment system which detects the mark on the first mask placed on the first mask stage, and a second mask alignment system which detects the mark on the second mask placed on the second mask stage.

22. The projection exposure apparatus according to claim 21, further comprising an interferometer system having a first measuring axis for measuring a position of the first mask stage in a direction of a first axis, a second measuring axis for measuring a position of the second mask stage in the direction of the first axis, a third measuring axis which intersects the first axis at an exposure position of the projection optical system, a fourth measuring axis which intersects the first axis at a detection position of the first mask alignment system, and a fifth measuring axis which intersects the first axis at a detection position of the second mask alignment system, the interferometer system measuring two-dimensional positions of the first mask stage and the second mask stage respectively by using the measuring axes.

23. The projection exposure apparatus according to claim 22, wherein:

the control unit is operated such that an interferometer having the third measuring axis is reset in a state in which positional measurement is executable for the first mask stage based on the use of a measured value obtained by using the third measuring axis when the first mask stage is moved to the exposure position from a position at which management of the first mask stage is performed based on the use of a measured value obtained by using the fourth measuring axis of the interferometer system, and an interferometer having the fourth measuring axis is reset in a state in which positional measurement is executable for the first mask stage based on the use of a measured value obtained by using the fourth measuring axis when the first mask stage is moved to an alignment position from a position at which management of the first mask stage is performed based on the use of a measured value obtained by using the third measuring axis; and the interferometer having the third measuring axis is reset in a state in which positional measurement is executable for the second mask stage based on the use of a measured value obtained by using the third measuring axis when the second mask stage is moved to the exposure position from a position at which management of the second mask stage is performed based on the use of a measured value obtained by using the fifth measuring axis of the interferometer system, and an interferometer having the fifth measuring axis is reset in a state in which positional measurement is executable for the mask stage based on the use of a measured value obtained by using the fifth measuring axis when the second mask stage is moved to an alignment position from a position at which management of the second mask stage is performed based on the use of a measured value obtained by using the third measuring axis.

24. The projection exposure apparatus according to claim 20, further comprising:
  a first substrate stage which is movable in a two-dimensional plane while carrying a first substrate, and which has a reference mark formed on a surface thereof;
  a second substrate stage which is movable independently from the first substrate stage on the same plane as that for the first substrate stage while carrying a second substrate, and which has a reference mark formed on a surface thereof;
  a mark-detecting system which is provided separately from the projection optical system, and detects the reference mark formed on the substrate stage or a mark formed on the substrate held on the substrate stage; and
  a control unit which controls operations of the both substrate stages so that a mark-detecting operation is performed by using the mark-detecting system for any one of the stages of the first substrate stage and the second substrate stage, during which an exposure operation is performed for the other stage.

25. A projection exposure apparatus for exposing a substrate by projecting images of patterns formed on a plurality of masks onto the substrate through a projection system sequentially, the projection exposure apparatus comprising:
  a first mask-driving system, at least one part of which is disposed on one side of the projection system, and which moves a first mask in a predetermined plane;
  a second mask-driving system, at least one part of which is disposed on the one side of the projection system, and which moves a second mask independently from the first mask, in a plane which is the same as that for the first mask or which is parallel thereto; and
  a control system which is associated with the first mask-driving system and the second mask-driving system and controls the first mask-driving system and the second mask-driving system respectively in order to project an image of a pattern formed on the first mask and an image of a pattern formed on the second mask onto the substrate sequentially.

26. The projection exposure apparatus according to claim 25, wherein the first mask-driving system comprises a mask stage for making the movement while carrying the first mask.

27. The projection exposure apparatus according to claim 25, wherein the second mask-driving system comprises a mask stage for making the movement while carrying the second mask.

28. The projection exposure apparatus according to claim 25, further comprising a mark-detecting system which detects marks formed on the first mask and the second mask respectively.

29. The projection exposure apparatus according to claim 28, further comprising an interferometer system having a measuring axis for measuring a position of the mask to be used during exposure for the substrate, of the first and second masks, and a measuring axis for measuring a position of the mask to be subjected to the mark detection effected by the mark-detecting system, of the first and second masks.

30. The projection exposure apparatus according to claim 28, wherein the first mask driving system has a first mask stage which holds the first mask, the second mask driving system has a second mask stage which holds the second mask, and the mark-detecting system has a first detector which detects a mark on the first mask held on the first mask stage and a mark an the second mask held on the second mask stage.

31. The projection exposure apparatus according to claim 28, wherein the mark-detecting system has a first detector which detects the mark on the first mask or the second mask in an illumination area on which an exposure light is illuminated, and a second detector which detects a mark on the first mask or the second mask in an area apart from the illumination area.

32. The projection exposure apparatus according to claim 31, wherein after detection of the mark on one mask of the first mask and the second mask using the second detector, the mark on the one mask is detected using the first detector prior to exposure using the one mask.

33. The projection exposure apparatus according to claim 25, further comprising a transport system which delivers the mask with respect to the first mask-driving system and the second mask-driving system.

34. The projection exposure apparatus according to claim 33, wherein the first mask driving system has a first mask stage which holds the first mask, the second mask driving system has a second mask stage which holds the second mask, and the transport system has a first transport member which exchanges a mask with respect to the first mask stage and a second transport member which exchanges a mask with respect to the second mask stage.

35. The projection exposure apparatus according to claim 25, further comprising a first substrate stage which is movable in a two-dimensional plane while carrying a first substrate and a second substrate stage which is movable in the two-dimensional plane or a parallel plane thereto independently from the first substrate stage while carrying a second substrate.

36. The projection exposure apparatus according to claim 35, further comprising a first interferometer having a measuring axis which measures positional information of the first substrate and has a measuring axis which is not deviated from a reflective surface formed on the first substrate stage, and a second interferometer which measures positional information of the second substrate and has a measuring axis which is not deviated from a reflective surface formed on the second substrate stage.

37. The projection exposure apparatus according to claim 35, further comprising a linear motor member which is provided linearly in a certain direction and is used commonly for the first substrate stage and the second substrate stage to move the first substrate stage and the second substrate stage in the certain direction.

38. The projection exposure apparatus according to claim 35, further comprising an alignment system which detects a mark on the substrate held on one stage of the first substrate stage and the second substrate stage while the substrate held on the other stage of the first substrate stage and the second substrate stage is exposed.

39. The projection exposure apparatus according to claim 35, wherein the substrate held on the first substrate stage and the substrate held on the second substrate stage are sequentially multiple-exposed with a plurality of masks.

40. The projection exposure apparatus according to claim 35, wherein an exposure operation using the first mask is different in exposure condition from an exposure operation using the second mask.

41. The projection exposure apparatus according to claim 35, wherein after exposure of the substrate held on one substrate stage of the first and the second substrate stages using the first mask, an exposure position of the second mask is determined prior to exposure of the substrate held on the other substrate stage of the first and the second substrate stages using the second mask.

42. The projection exposure apparatus according to claim 41, wherein the exposure position of the second mask is determined by detecting a positional relationship between a mark on the second mask and a reference mark on the other substrate stage through the projection system.

43. The projection exposure apparatus according to claim 41, wherein positional information on a plurality of shot areas on the substrate held on the other substrate stage is detected while the substrate held on the one substrate stage is exposed using the first mask.

44. The projection exposure apparatus according to claim 35, further comprising:
   a first linear motor member provided linearly in a first direction to move the first substrate stage in a first direction;
   a second linear motor member provided at an end of the first linear motor member to move the first substrate stage and the first linear motor member in a second direction perpendicular to the first direction;
   a third linear motor member provided linearly in the first direction to move the second substrate stage in the first direction; and
   a fourth linear motor member provided at an end of the third linear motor member to move the second substrate stage and the third linear motor member in the second direction.

45. The projection exposure apparatus according to claim 44, wherein the second linear motor member has a pair of linear motors provided at both ends of the first linear motor member, and the fourth linear motor member has a pair of linear motors provided at both ends of the third linear motor member.

46. The projection exposure apparatus according to claim 44, further comprising a fifth linear motor member provided linearly in the second direction to cooperate with the second linear motor member to move the first linear motor member in the second direction.

47. The projection exposure apparatus according to claim 46, wherein the fifth linear motor member is also used to cooperate with the fourth linear motor member to move the third linear motor member in the second direction.

48. The projection exposure apparatus according to claim 6, further comprising:
   a first interferometer system which has five measuring axes and monitors the find substrate stage during an exposure operation of the first substrate stage; and
   a second interferometer system which has five measuring axes and monitors the second substrate stage during at least one of a substrate exchange operation and a detecting operation of the second substrate stage.

49. The projection exposure apparatus according to claim 48, wherein the exposure operation for the first substrate held on the first substrate stage in performed by moving the first substrate stage, while executing at least one of the substrate exchange operation and the detecting operation by moving the second substrate stage based on the output of the first and second interferometer systems.

50. The projection exposure apparatus according to claim 49, wherein, after the exposure operation for the first substrate, the first interferometer system starts to monitor the second substrate stage in order to perform an exposure operation for the second substrate held on the second substrate stage.

51. The projection exposure apparatus according to claim 48, wherein each of said first and second interferometer systems has measuring axes parallel to a first direction and measuring axes parallel to a second direction perpendicular to the first direction.

52. The projection exposure apparatus according to claim 51, wherein each of said first and second interferometer systems can monitor positions, rotation and tilts of the stage.

53. The projection exposure apparatus according to claim 51, wherein, during the exposure operation, each of areas on the first substrate is exposed while exposing while moving the first substrate stage in the first direction.

54. The projection exposure apparatus according to claim 35, further comprising:
   a first interferometer system which has five measuring axes and monitors the first substrate stage during an exposure operation of the first substrate stage; and
   a second interferometer system which has five measuring axes and monitors the second substrate stage during at least one of a substrate exchange operation and a detecting operation of the second substrate stage.

55. The projection exposure apparatus according to claim 54, wherein the exposure operation for the first substrate held on the first substrate stage is performed by moving the first substrate stage, while executing at least one of the substrate exchange operation and the detecting operation by moving the second substrate stage based on the output of the first and second interferometer systems.

56. The projection exposure apparatus according to claim 55, wherein after the exposure operation for the first substrate, the first interferometer system starts to monitor the second substrate stage in order to perform an exposure operation for the second substrate held on the second substrate stage.

57. The projection exposure apparatus according to claim 54, wherein each of said first and second interferometer systems has measuring axes parallel to a first direction and measuring axes parallel to a second direction perpendicular to the first direction.

58. The projection exposure apparatus according to claim 57, wherein each of said first and second interferometer systems can monitor positions, rotation and tilts of the stage.

59. The projection exposure apparatus according to claim 57, wherein, during the exposure operation, each of areas on the first substrate is exposed while moving the first substrate stage in the first direction.

60. The projection exposure apparatus according to claim 54, wherein the first mask-driving system has a first mask stage for holding the first mask on which a reflective surface is formed for an interferometer device, and the second mask-driving system has a second mask stage for holding the second mask on which a reflective surface is formed for the interferometer device, and wherein said interferometer device includes a third interferometer system which monitors the first mask stage during an exposure operation of the first mask stage, and a fourth interferometer system which monitors the second mask stage during at least one of a mask exchange operation and a detecting operation of the second mask stage.

61. The projection exposure apparatus according to claim 60, wherein, after the exposure operation of the first mask stage, the third interferometer system starts to monitor the second mask stage in order to perform an exposure operation of the second mask stage.

* * * * *